United States Patent
Smith et al.

(10) Patent No.: US 7,124,386 B2
(45) Date of Patent: Oct. 17, 2006

(54) DUMMY FILL FOR INTEGRATED CIRCUITS

(75) Inventors: Taber H. Smith, Fremont, CA (US);
Vikas Mehrotra, Fremont, CA (US);
David White, Cambridge, MA (US)

(73) Assignee: Praesagus, Inc., Cambridge, MA (US)

( * ) Notice: Subject to any disclaimer, the term of this patent is extended or adjusted under 35 U.S.C. 154(b) by 283 days.

(21) Appl. No.: 10/164,844

(22) Filed: Jun. 7, 2002

(65) Prior Publication Data

US 2003/0226757 A1    Dec. 11, 2003

(51) Int. Cl.
*G06F 17/50* (2006.01)
(52) U.S. Cl. .................... 716/10; 716/9; 716/8
(58) Field of Classification Search ................ 716/10, 716/9, 8
See application file for complete search history.

(56) References Cited

U.S. PATENT DOCUMENTS

| | | | |
|---|---|---|---|
| 5,124,927 A | 6/1992 | Hopewell et al. | 700/121 |
| 5,597,668 A | 1/1997 | Nowak et al. | 430/311 |
| 5,663,076 A | 9/1997 | Rostoker et al. | 716/21 |
| 5,705,301 A | 1/1998 | Garza et al. | 435/5 |
| 5,763,955 A | 6/1998 | Findley et al. | 257/773 |
| 5,798,298 A | 8/1998 | Yang et al. | 438/622 |
| 5,821,621 A | 10/1998 | Jeng | 257/759 |
| 5,854,125 A * | 12/1998 | Harvey | 438/626 |
| 5,861,342 A | 1/1999 | Gabriel et al. | 438/631 |
| 5,903,469 A | 5/1999 | Ho | |
| 5,920,487 A | 7/1999 | Reich et al. | 716/21 |
| 5,923,563 A | 7/1999 | Lavin et al. | 716/19 |
| 5,923,947 A | 7/1999 | Sur | 438/17 |
| 5,948,573 A | 9/1999 | Takahashi | 430/5 |
| 5,972,541 A | 10/1999 | Sugasawara et al. | 430/5 |
| 6,049,789 A | 4/2000 | Frison et al. | 705/59 |
| 6,081,272 A | 6/2000 | Morimoto | |
| 6,093,631 A | 7/2000 | Jaso | |
| 6,118,137 A | 9/2000 | Fulford et al. | 257/48 |
| 6,124,197 A | 9/2000 | Fulford | 438/618 |
| 6,176,992 B1 | 1/2001 | Talieh | 205/87 |
| 6,230,299 B1 | 5/2001 | McSherry et al. | 716/1 |
| 6,249,904 B1 | 6/2001 | Cobb | |
| 6,255,125 B1 | 7/2001 | Schmidt et al. | 438/14 |
| 6,259,115 B1 | 7/2001 | You et al. | 257/48 |
| 6,263,476 B1 | 7/2001 | Browen et al. | 716/4 |
| 6,309,956 B1 | 10/2001 | Chiang et al. | 438/622 |
| 6,323,113 B1 | 10/2001 | Gabriel et al. | 438/584 |
| 6,328,872 B1 | 12/2001 | Talieh et al. | 205/206 |
| 6,343,370 B1 | 1/2002 | Taoka et al. | |
| 6,344,408 B1 | 2/2002 | Chen et al. | 438/633 |

(Continued)

FOREIGN PATENT DOCUMENTS

EP    0 453 753    10/1991

(Continued)

OTHER PUBLICATIONS

Lee et al.,"Using Smart Dummy Fill and Selective Reverse Etchback for Pattern Density Equalization", Mar. 2000, IEEE CMP-MIC Proceding, pp. 255-258.*

(Continued)

*Primary Examiner*—Sun James Lin
(74) *Attorney, Agent, or Firm*—Bingham McCutchen LLP

(57) ABSTRACT

A method and system are described to reduce process variation as a result of the electrochemical deposition (ECD), also referred to as electrochemical plating (ECP), and chemical mechanical polishing (CMP) processing of films in integrated circuit manufacturing processes. The described methods use process variation and electrical impact to direct the insertion of dummy fill into an integrated circuit.

84 Claims, 41 Drawing Sheets

U.S. PATENT DOCUMENTS

| | | | |
|---|---|---|---|
| 6,352,623 B1 | 3/2002 | Volodarsky et al. ...... 204/275.1 |
| 6,380,087 B1 | 4/2002 | Gupta et al. ................. 438/692 |
| 6,396,158 B1* | 5/2002 | Travis et al. ................. 257/784 |
| 6,486,066 B1* | 11/2002 | Cleeves et al. .............. 438/692 |
| 6,550,041 B1 | 4/2003 | McBride |
| 6,556,884 B1 | 4/2003 | Miller et al. ................. 700/121 |
| 6,556,947 B1 | 4/2003 | Scheiner et al. ............. 702/172 |
| 6,562,639 B1 | 5/2003 | Minvielle et al. ............. 438/14 |
| 6,567,964 B1 | 5/2003 | Shin et al. |
| 6,578,188 B1 | 6/2003 | Pang et al. .................... 716/19 |
| 6,611,045 B1 | 8/2003 | Travis et al. |
| 6,625,801 B1 | 9/2003 | Pierrat et al. ................. 716/19 |
| 6,665,856 B1 | 12/2003 | Pierrat et al. ................. 716/19 |
| 6,704,920 B1 | 3/2004 | Brill et al. ..................... 716/19 |
| 6,708,129 B1 | 3/2004 | Pasadyn et al. .............. 702/81 |
| 6,708,318 B1 | 3/2004 | Satoh et al. |
| 6,751,785 B1 | 6/2004 | Oh ............................... 716/10 |
| 6,904,581 B1 | 6/2005 | Oh |
| 2001/0052107 A1 | 12/2001 | Anderson et al. ............... 716/4 |
| 2002/0045110 A1 | 4/2002 | Ohnuma |
| 2002/0083401 A1 | 6/2002 | Breiner et al. .................. 716/4 |
| 2002/0106837 A1 | 8/2002 | Cleeves et al. ............. 438/129 |
| 2002/0157076 A1 | 10/2002 | Asakawa |
| 2002/0162082 A1 | 10/2002 | Cwynar et al. ............... 716/12 |
| 2003/0084416 A1 | 5/2003 | Dai et al. |
| 2003/0107134 A1 | 6/2003 | Lee ............................. 257/758 |
| 2003/0199150 A1 | 10/2003 | Permana et al. ............ 438/435 |
| 2004/0044984 A1 | 3/2004 | Keogan et al. ................ 716/21 |

FOREIGN PATENT DOCUMENTS

| | | |
|---|---|---|
| WO | WO 03/079240 A2 | 9/2003 |
| WO | WO 2003/079240 A3 | 9/2003 |

OTHER PUBLICATIONS

Boning, Duane et al, "Statistical metrology of interlevel dielectric thickness variation," *Proceedings of the SPIE Symposium on Microelectronic Manufacturing*, Oct. 1994, SPIE vol. 2334, pp. 316-327.

Boning, Duane et al., "Models for Pattern Dependencies: Capturing Effects in Oxide, STI, and Copper CMP," Jul. 17, 2001, Semicon West.

Boning, D. et al, "Pattern Dependent Modeling for CMP Optimization and Control," MRS Spring Meeting, Proc. Symposium P: Chemical Mechanical Polishing, San Francisco, CA, Apr. 1999.

Boning, Duane S. et al., "A General Semiconductor Process Modeling Framework," *IEEE Transactions on Semiconductor Manufacturing*, vol. 5, No. 4, Nov. 1992, pp. 266-280.

Chen, Yu et al., "Monte-Carlo Algorithms for Layout Density Control," Asia and South Pacific Design Automation Conference, Jan. 2002, pp. 523-528.

Chen, Yu et al., "Hierarchical Dummy Fill for Process Uniformity," Asia and South Pacific Design Automation Conference, Jan. 2001, pp. 139-144.

Chen, Yu et al., "Practical Iterated Fill Synthesis for CMP Uniformity," ACM/IEEE Design Automation Conference, Jun. 2000, pp. 671-674.

Davis, Joseph C. et al., "Automatic Synthesis of Equipment Recipes from Specified Wafer-State Transitions," *IEEE Transactions on Semiconductor Manufacturing*, vol. 11, No. 4, Nov. 1998, pp. 527-536.

Hosack, Harold H. et al., "Recent Advances in Process Synthesis for Semiconductor Devices," *IEEE Transactions on Electron Devices*, vol. 45, No. 3, Mar. 1998, pp. 626-633.

Kahng, Andrew B. et al., "New and Exact Filling Algorithms for Layout Density Control," UCLA Department of Computer Science, Los Angeles, CA, 1999.

Kahng, Andrew B. et al., "Filling and Slotting: Analysis and Algorithms," International Symposium on Physical Design, Monterey, CA, 1998, pp. 95-102.

Kahng, Andrew B. et al., "New Multilevel and Hierarchical Algorithms for Layout Density Control," UCLA Departement of Computer Science, Los Angeles, CA, 1999.

Kahng, Andrew B. et al., "Filling Algorithms and Analyses for Layout Density Control," *IEEE Transactions on Computer-Aided Design of Integrated Circuits and Systems*, vol. 18, No. 4, Apr. 1999, pp. 445-462.

Kim, Yoo-Hyon et al., "CHAMPS (CHemicAl-Mechanical Planarization Simulator)," International Conference on Simulation of Semiconductor Processes and Devices, Seattle, WA, Sep. 6-8, 2000.

Lee, Brian et al, "Using Smart Dummy Fill and Selective Reverse Etchback for Pattern Density Equalization," *Proc. CMP-MIC*, Santa Clara, CA, Mar. 2000, pp. 255-258.

Lee, Keun-Ho, "Analyzing the Effects of Floating Dummy-Fills: From Feature Scale Analysis to Full-Chip RC Extraction," Samsung Electronics Co., Ltd, Korea, 2001.

Mehrotra, V. and Duane Boning, "Technology Scaling Impact of Variation on Clock Skew and Interconnect Delay," *International Interconnect Technology Conference (IITC)*, San Francisco, CA, Jun. 2001.

Mehrotra, V. et al., "A Methodology for Modeling the Effects of Systematic Within-Die Interconnect and Device Variation on Circuit Performance," Design Automation Conference, Los Angeles, CA, Jun. 2000.

Mehrotra, V. et al., "Modeling the Effects of Manufacturing Variation on High-Speed Microprocessor Interconnect Performance," Annual ACM IEEE Design Automation Conference, Los Angeles, CA, 2000, pp. 168-171.

McGhee, John et al., "The MMST Computer-Integrated Manufacturing System Framework," *IEEE Transactions of Semiconductor Manufacturing*, vol. 7, No. 2, May 1994, pp. 107-116.

Moyne, William Patrick, "Enhancing MEMS Design Using Statistical Process Information," Massachusetts Institute of Technology, Department of Electrical Engineering and Computer Science, Apr. 7, 2000.

Ouma, Dennis et al., "An Integrated Characterization and Modeling Methodology for CMP Dielectric Planarization," International Interconnect Technology Conference, San Francisco, CA, Jun. 1998.

Park, Tae H. et al., "Pattern Dependent Modeling of Electroplated Copper Profiles," International Interconnect Technology Conference (IITC), Jun. 2001.

Park, T. et al., "Electrical Characterization of Copper Chemical Mechanical Polishing," SEMATECH, Austin, TX, Feb. 1999.

Park, T. et al., "Pattern and Process Dependencies in Copper Damascene Chemical Mechanical Polishing Processes," VLSI Multilevel Interconnect Conference (VMIC), Santa Clara, CA, Jun. 1998.

Park, Jin-Ku, "An Exhaustive Method for Characterizing the Interconnect Capacitance Considering the Floating Dummy-Fills by Employing an Efficient Field Solving Algorithm," International Conference on Simulation of Semiconductor Processes and Devices, 2000, pp. 98-101.

Peters, Laura, "Removing Barriers to Low-k Dielectric Adoption," *Semiconductor International*, May 1, 2002.

Sakurai, Takayasu, "Closed-Form Expressions for Interconnection Delay, Coupling, and Crosstalk in VLSI's," *IEEE Transactions on Electron Devices*, vol. 40, No. 1, Jan. 1993.

Saxena, S. et al., "A methodology for the top-down synthesis of semiconductor process flows," Proc. 3rd IEEE/SEMI Int. Symp. Semiconductor Manufacturing, pp. 36-40, 1995.

Singer, Peter, "Progress in Copper: A Look Ahead," Semiconductor International, May 1, 2002.

Smith, Taber H., "Device Independent Process Control of Dielectric Chemical Mechanical Polishing," Thesis, Massachusetts Institute of Technology, Sep. 1997.

Smith, Taber H. et al., "A CMP Model Combining Density and Time Dependencies," Proc. CMP-MIC, Santa Clara, CA, Feb. 1999.

Stine, Brian E., "A General Methodology for Assessing and Characterizing Variation in Semiconductor Manufacturing," Thesis, Massachusetts Institute of Technology, Sep. 1997.

Stine, Brian E. et al., "A Simulation Methodology for Assessing the Impact of Spatial/Pattern Dependent Interconnect Parameter Variation on Circuit Performance," 1997 International Electron Devices Meeting, Washington, D.C., Dec. 1997, pp. 133-136.

Stine, Brian E. et al., "The Physical and Electrical Effects of Metal-Fill Patterning Practices for Oxide Chemical-Mechanical Polishing Processes," *IEEE Transactions of Electron Devices*, vol. 45, No. 3, Mar. 1998, pp. 665-679.

Stine, Brian E. and Rakes Vallishayee, "On the Impact of Dishing in Metal CMP Processes on Circuit Performance," International Workshop on Statistical Metrology Technical Papers, 1998, pp. 64-67.

Stine, B. et al., "A Closed-From Analytic Model for ILD Thickness Variation in CMP Processes," Proc. CMP-MIC, Santa Clara, CA, Feb. 1997.

Tuinhout, Hans P. and Maarten Vertregt, "Characterization of Systematic MOSFET Current Factor Mismatch Caused by Metal CMP Dummy Structures," *IEEE Transactions on Semiconductor Manufacturing*, vol. 14, No. 4, Nov. 2001, pp. 302-312.

Tugbawa, Tamba et al., "A Mathematical Model of Pattern Dependencies in Cu CMP Processes," CMP Symposium, Electrochemical Society Meeting, Honolulu, HA, Oct. 1999.

Tugbawa, Tamba E. et al., "Integrated Chip-Scale Simulation of Pattern Dependencies in Copper Electroplating and Cooper Chemical Mechanical Polishing Processes," International Interconnect Technology Conference, San Francisco, CA, Jun. 2002.

Tugbawa, Tamba et al., "Framework for Modeling of Pattern Dependencies in Multi-Step Cu CMP Processes," SEMICON West 2000, Jul. 11, 2000.

Tugbawa, Tamba et al., "Modeling of Pattern Dependencies for Multi-Level Copper Chemical-Mechanical Polishing Processes," Material Research Society Spring Meeting, San Francisco, CA, Apr. 2001.

Zaman, Mohammed H. et al., "Automatic Generation of Thin Film Process Flows—Part I: Basic Algorithms," *IEEE Transactions on Semiconductor Manufacturing*, vol. 12, No. 1, Feb. 1999, pp. 116-128.

Zaman, Mohammed H. et al., "Automatic Generation of Thin Film Process Flows—Part II: Recipe Generation, Flow Evaluation, and System Framework," *IEEE Transactions on Semiconductor Manufacturing*, vol. 12, No. 1, Feb. 1999, pp. 129-138.

"MIT Statistical Metrology," Publications List, http://www-mtl.mit.edu/Metrology/PAPERS/, 1994-2003.

Conrad et al., "Model Considerations, Calibration Issues, and Metrology Methods for Resist-Bias Models", in Metrology, Inspection, and Process Control for Microlithography XIII, ed. by B. Singh, Proc. SPIE 3677, pp. 940-955 (1999).

Baker, "Using Calibre In A Design for Manufacturing Environment", Deep Submicron Technical Publication, Mentor Graphics, Sep. 2001.

Ouma et al., "An Integrated Characterization and Modeling Methodology for CMP dielectric Planarization," Proc. Of Interconnect Technology Conference, pp. 67-69, Feb. 1998.

Lee et al., "Analyzing The Effects of Floating Dummy-Fills: From Feature Scale Analysis to Full-Chip RC Extraction," Proc. Of IEDM 2001 et al., Dec. 2001.

Slide Presentation, Exhibit A.

Slide Presentation, Exhibit B1 and B2.

Praesagus Business Plan, Exhibit C.

Tian et al. "Model-Based Dummy Feature Placement for Oxide Chemical-Mechanical Polishing Manufacturability", Proceedings of the 37$^{th}$ Design Automation Conference, pp. 667-670, 2000.

\* cited by examiner

Step 1. Create trench in field oxide using lithography & etch

Step 2a. Electroplating (ECD) deposits copper
in the trenches from time T0 to T2.
(T2>T1>T0)

Step 2b. Electroplating (ECD) is completed at time Tf.

Step 3. CMP polish removes all the oxide above the field region

| LW/LS | 0.75 | 1.00 | 1.25 | 1.50 | 1.75 | 2.00 | 2.25 | 2.50 | 2.75 | 3.00 | 3.25 | 3.50 | 3.75 | 4.00 | 4.25 | 4.50 | 4.75 | 5.00 |
|---|---|---|---|---|---|---|---|---|---|---|---|---|---|---|---|---|---|---|
| 0.25 | 0.00 | 0.00 | 0.00 | 0.00 | 0.00 | 0.00 | 0.00 | 0.00 | 0.00 | 0.00 | 0.25 | 0.25 | 0.25 | 0.25 | 0.25 | 0.25 | 0.25 | 0.50 |
| 0.50 | 0.00 | 0.00 | 0.00 | 0.00 | 0.00 | 0.00 | 0.00 | 0.25 | 0.25 | 0.25 | 0.25 | 0.25 | 0.25 | 0.50 | 0.50 | 0.50 | 0.50 | 0.50 |
| 0.75 | 0.00 | 0.00 | 0.00 | 0.00 | 0.00 | 0.00 | 0.25 | 0.25 | 0.25 | 0.25 | 0.25 | 0.50 | 0.50 | 0.50 | 0.50 | 0.75 | 0.75 | 0.75 |
| 1.00 | 0.00 | 0.00 | 0.00 | 0.00 | 0.00 | 0.25 | 0.25 | 0.25 | 0.50 | 0.50 | 0.50 | 0.50 | 0.50 | 0.75 | 0.75 | 0.75 | 1.00 | 1.00 |
| 1.25 | 0.00 | 0.00 | 0.00 | 0.00 | 0.25 | 0.25 | 0.25 | 0.50 | 0.50 | 0.50 | 0.50 | 0.75 | 0.75 | 1.00 | 1.00 | 1.00 | 1.00 | 1.25 |
| 1.50 | 0.00 | 0.00 | 0.00 | 0.25 | 0.25 | 0.25 | 0.25 | 0.50 | 0.50 | 0.50 | 0.75 | 0.75 | 1.00 | 1.00 | 1.25 | 1.25 | 1.25 | 1.25 |
| 1.75 | 0.00 | 0.00 | 0.00 | 0.25 | 0.25 | 0.25 | 0.50 | 0.50 | 0.50 | 0.75 | 0.75 | 1.00 | 1.00 | 1.00 | 1.25 | 1.25 | 1.50 | 1.50 |
| 2.00 | 0.00 | 0.00 | 0.25 | 0.25 | 0.25 | 0.25 | 0.50 | 0.50 | 0.75 | 0.75 | 1.00 | 1.00 | 1.00 | 1.25 | 1.25 | 1.50 | 1.50 | 1.75 |
| 2.25 | 0.00 | 0.00 | 0.25 | 0.25 | 0.25 | 0.50 | 0.50 | 0.50 | 0.75 | 0.75 | 1.00 | 1.00 | 1.25 | 1.25 | 1.50 | 1.50 | 1.75 | 1.75 |
| 2.50 | 0.00 | 0.00 | 0.25 | 0.25 | 0.25 | 0.50 | 0.50 | 0.75 | 0.75 | 1.00 | 1.00 | 1.25 | 1.25 | 1.50 | 1.50 | 1.75 | 1.75 | 2.00 |
| 2.75 | 0.00 | 0.00 | 0.25 | 0.25 | 0.50 | 0.50 | 0.50 | 0.75 | 0.75 | 1.00 | 1.00 | 1.25 | 1.25 | 1.50 | 1.75 | 1.75 | 1.75 | 2.00 |
| 3.00 | 0.00 | 0.00 | 0.25 | 0.25 | 0.50 | 0.50 | 0.75 | 0.75 | 1.00 | 1.00 | 1.00 | 1.25 | 1.50 | 1.50 | 1.75 | 2.00 | 2.00 | 2.00 |
| 3.25 | 0.00 | 0.00 | 0.25 | 0.25 | 0.50 | 0.50 | 0.75 | 1.00 | 1.00 | 1.00 | 1.25 | 1.25 | 1.50 | 1.75 | 1.75 | 2.00 | 2.00 | 2.25 |
| 3.50 | 0.00 | 0.00 | 0.25 | 0.25 | 0.50 | 0.50 | 0.75 | 1.00 | 1.00 | 1.25 | 1.25 | 1.50 | 1.50 | 1.75 | 2.00 | 2.00 | 2.00 | 2.25 |
| 3.75 | 0.00 | 0.00 | 0.25 | 0.50 | 0.50 | 0.50 | 0.75 | 1.00 | 1.00 | 1.25 | 1.25 | 1.50 | 1.50 | 1.75 | 2.00 | 2.00 | 2.25 | 2.25 |
| 4.00 | 0.00 | 0.00 | 0.25 | 0.50 | 0.50 | 0.50 | 1.00 | 1.00 | 1.25 | 1.25 | 1.50 | 1.50 | 1.75 | 1.75 | 2.00 | 2.00 | 2.25 | 2.50 |
| 4.25 | 0.00 | 0.00 | 0.25 | 0.50 | 0.50 | 0.75 | 1.00 | 1.00 | 1.25 | 1.50 | 1.50 | 1.50 | 1.75 | 2.00 | 2.00 | 2.25 | 2.25 | 2.50 |
| 4.50 | 0.00 | 0.00 | 0.25 | 0.50 | 0.50 | 0.75 | 1.00 | 1.25 | 1.25 | 1.50 | 1.50 | 1.75 | 1.75 | 2.00 | 2.25 | 2.25 | 2.50 | 2.50 |
| 4.75 | 0.00 | 0.00 | 0.25 | 0.50 | 0.50 | 0.75 | 1.00 | 1.25 | 1.50 | 1.50 | 1.50 | 1.75 | 2.00 | 2.00 | 2.25 | 2.50 | 2.50 | 2.75 |
| 5.00 | 0.00 | 0.00 | 0.25 | 0.50 | 0.50 | 0.75 | 1.00 | 1.25 | 1.50 | 1.75 | 1.75 | 1.75 | 2.00 | 2.25 | 2.50 | 2.50 | 2.75 | — |

Note: Cannot add dummy fill for linespace less than (min_LW + 2*min_LS).

- LW range: 0.25 to 5.00 um
- LS range: 0.75 to 5.00 um
- LW/LS increment: 0.25 um

Fig. 17

| Fill Size Rule | Use | Reason |
| --- | --- | --- |
| Large LW/Small LS | Metal dummy fill | • Large increase in pattern density<br>• Trade off: increased coupling capacitance |
| Small LW/Small LS | Oxide dummy fill | • ECD<br>• Trade-off: increased resistance |
| Small LW/Large LS | Metal or oxide fill (CMP) | • Smaller variation in R & C<br>• Trade-off: less uniform film thickness |
| Large LW/Large LS | Metal fill | • Lower coupling capacitance than small LS but less crosstalk noise<br>• Trade-off: less uniform film thickness |

Fig. 20A

| Fill Pattern Rule | Use | Reason |
| --- | --- | --- |
| Symmetric | Oxide dummy fill | Maintain current flow (lowest resistance) |
| Asymmetric | Metal dummy fill | • Reduce coupling capacitance to neighboring signal lines<br>• Trade-off (vs. symmetric): harder to implement |
| Asymmetric (both directions) | Metal dummy fill | • Larger reduction in coupling capacitance<br>• Trade-off: hard to implement hierarchically |

Fig. 20B

Each 4 x 4 cell contains:
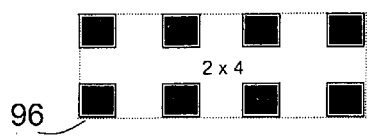
96
= Two (2 x 4) cells
Each 2 x 4 cell contains:
97
= Two (1 x 4) cells
Each 1 x 4 cell contains:
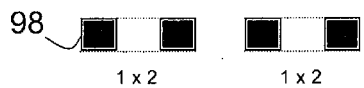
98
= Two (1 x 2) cells
Each 1 x 2 cell contains:
99
= Two dummy fill areas
+
_____
Total: = 8 cells or objects required for 4x4 cell
Fig. 23

DUMMY FILL FOR INTEGRATED CIRCUITS

This description relates to dummy fill for integrated circuits.

In fabricating integrated circuits, interconnect film thickness uniformity, dishing and erosion are dependent on variation in layout patterns (e.g. material density, linewidth and linespace). Surface non-uniformity often leads to subsequent manufacturability and process integration issues. These pattern dependencies may also affect device performance by introducing variation in capacitance and resistance depending on the location of a given structure on the device.

Film thickness variation in chemical mechanical polishing (CMP) processes can be separated into various components: lot-to-lot, wafer-to-wafer, wafer-level, and die-level. Oxide thickness variation due to CMP is mainly due to differences in layout patterns on the chip. Often, the most significant component is the pattern dependent or die-level component. The oxide is generally polished until all areas on the chip have been planarized. However, differences in the underlying metal pattern result in variation in the post CMP oxide thickness, even though a locally planar layer of oxide is achieved with CMP.

For oxide polishing, the major source of variation is caused by within die pattern density. Pattern density is defined as the ratio of raised oxide area divided by the total area of the region. The region may be taken as a square with the length of the sides equal to some length, the planarization length. The planarization length is usually determined by process factors such as the type of polishing pad, CMP tool, slurry chemistry, etc. The effective pattern density may be computed for each location on the die by filtering the designed layout densities, often by using various two-dimensional filters of densities around the given location.

For metal polishing in a damascene CMP process, other physical layout effects such as the linewidth and linespace may also be required. Two effects known as dishing and erosion result from metal damascene CMP. Dishing is measured as the difference in metal thickness at the edge of a line and its center. Erosion is defined as the difference in oxide thickness above a metal line, typically within an array of lines, to an adjacent unpatterned region. FIG. 1A shows the desired result of CMP in a damascene process where the copper features, 1 and 2, in the oxide field, 4, meet the desired wafer surface, 3. FIG. 1B shows the effects of the layout pattern on metal thickness variation in a damascene CMP process where the desired wafer surface, 5, does not match the actual wafer surface, 6. FIG. 1B shows the effects of Cu CMP dishing, 7, in a wide line as well as the effects of erosion, 8, in an array of fine pitch lines. These figures illustrate that other physical layout parameters, in addition to pattern density, are required to predict the variation in a damascene CMP process.

Dummy fill structures can be added to improve process uniformity. Adding metal dummy fill increases the pattern density since density is defined as the amount of metal divided by the total area within a given region. Conversely, adding oxide dummy removes sections of the copper line and decreases the pattern density. The addition of fill can also alter other parameters such as linewidth and linespace. If dummy metal is inserted between two parallel lines, the linespace changes for both of those lines. Similarly, if oxide dummy is inserted within a wire, its effective linewidth is changed. By modifying the existing layout through the addition of dummy fill, physical parameters such as pattern density, linewidth, and linespace are changed. Since metal or oxide film thickness non-uniformity resulting from CMP is dependent on these physical parameters, the addition or removal of metal alters the physical characteristics of the designed layout. Therefore, the addition of metal or oxide fill based on process models can reduce the film thickness non-uniformity.

Dummy fill is a method of improving film thickness uniformity in integrated circuits through the addition or removal of existing structures. The following two figures illustrate two types of dummy fill, metal and oxide. FIG. 2 illustrates the use of metal dummy fill. FIG. 2A shows a series of metal lines, 10 in an oxide layer, 9, with a large oxide field region in the middle, 11, that is available for dummy fill. One goal of dummy fill is to achieve uniform pattern density everywhere so that deposition and polishing process result in a planar film thickness. As such, this area would be selected as available for dummy fill. This region is particularly attractive in that it is of sufficient distance from electrically conducting lines and may minimize the impact of dummy fill on capacitance. In FIG. 2B, metal dummy fill, 14, has been placed in the oxide field area, 13, to raise the density of this region, while the metal dummy fill remains electrically isolated from the conducting regions, 12, around it.

FIG. 3 illustrates the addition of oxide dummy fill in a metal field. In FIG. 3A, metal field region, 15, has a large area, 16, available for oxide dummy fill. In FIG. 3B, oxide dummy fill (also referred to as metal slotting), 18, is added to the metal area, 17, raising the density of raised area of the region and subsequently improving the polishing uniformity (reducing the film thickness variation) of this region. The term "dummy fill area" is used to refer to the area where dummy fill is added and the term "dummy fill structures" is used to refer to the new objects that are embedded within that area.

Dummy fill may be placed using a particular placement pattern to reduce the impact of its presence within either a conducting or insulating structure. FIG. 4 shows three different dummy fill patterns. The first panel, FIG. 4A shows symmetric fill structures that are commonly used when oxide fill is placed in metal. The symmetric pattern promotes the flow of current through the metal region. The second and third panels, FIG. 4B and FIG. 4C, show asymmetric patterns that are commonly used when metal fill (i.e. a conducting material) is placed in an insulating material (e.g. oxide). The asymmetric nature retards the capacitive coupling between adjacent signal lines more than a symmetric pattern, resulting in reduced cross-talk noise. Designers desire that the addition of dummy fill not alter the desired electrical performance. However, the addition of dummy structures may unintentionally affect the electrical properties and degrade chip performance. Important factors must be considered for effective dummy fill. These factors include process effects, electrical effects, and placement impact.

The electrical performance of a circuit can be determined by the electrical characteristics of its interconnect, and the interconnect is often the limiting factor in high performance designs. These electrical parameters include the interconnect resistance and capacitance. Circuit performance metrics such as signal delay, clock skew, and crosstalk noise are functions of the interconnect resistance and capacitance. The interconnect resistance is a function of the wire resistivity, metal thickness, interconnect length, and linewidth. The interconnect capacitance is a function of the metal thickness, interconnect length, linewidth, linespace, and dielectric constant of the insulator (oxide) between the wires. Note that the geometry of the interconnect structures impact their electrical properties. Therefore, any variation in the geometry, such as the insertion of dummy fill or slots, may also affect the electrical performance metrics.

The addition of dummy fill can result in unwanted electrical effects. Adding dummy features alters the effective pattern density and linespace. Removing features (oxide fill) alters the effective pattern density and linewidth. The impact of fill depends on the designed interconnect structure neighboring the fill (for metal dummy) or the designed interconnect structure itself (for oxide dummy). Adding metal fill modifies the coupling capacitance (C) between neighboring interconnects. Adding oxide dummy modifies the coupling capacitance (C) and interconnect resistance (R). The relative impact depends on the dimensions of the interconnect structures. The level of variations in R and C determine how the circuit is affected.

Design rules can be constructed such that an acceptable level of variation tolerance is set for the interconnect RC variation. Alternatively, design rules can be set to allow a certain tolerance level for the circuit performance metrics such as signal delay, clock skew, or crosstalk noise. These performance metrics are normally functions of the interconnect RC. The total interconnect capacitance is heavily dependent on neighboring structures. These structures can be described as a canonical set where an object or class of objects is uniquely identified or standardized within a set of features (such as linewidth, linespace or density) related to process variation. Therefore, a dummy fill strategy should account for these electrical effects in addition to the process uniformity specifications relative to these features.

A short flow damascene process using ECD and CMP is shown in FIGS. 5 & 6. FIG. 5A illustrates step 1, where trenches, 19, are created in oxide for the interconnect structures using lithography and etching. FIG. 5B shows the early stage of step 2 where electroplating is used to fill the trench, 23, in field oxide, 20, from time T0, 21, to T2, 22. FIG. 6A shows the end at time Tf, 26, of step 2 where electroplating fills the trench, 27, in the field oxide, 24. FIG. 6B illustrates how CMP is used to remove the copper such that the trench, 28, is planar with the field oxide, 29.

Once the copper is deposited, it must be polished until all of the copper above the field regions is cleared. CMP is the leading method of copper removal and planarization in semiconductor manufacturing processes. Differences in the structures and their surroundings result in variable polish rates across the chip. To guarantee that there are no shorts between interconnects, over-polishing is done until all the copper is cleared above the field oxide. This results in metal thickness variation (see FIG. 4). Another application of dummy fill is to modify the interconnect structures and surrounding areas to reduce the variation. This can be done by adding metal dummy fill between the interconnect regions or removing metal from the existing interconnect. As such, the layout can be altered from its original design by adding additional features (metal dummy fill) or removing sections of existing features (slotting with oxide dummy fill). This improves process uniformity but can adversely affect the electrical performance of the chip. Therefore, the goal is to fill the layout in a way that reduces the process variation while preserving the original intended functions of the circuit.

SUMMARY

In general, in one aspect, the invention features generating a strategy for placing dummy fill to compensate for pattern dependencies in an electrochemical deposition or electrochemical mechanical deposition fabrication process.

In general, in another aspect, the invention features, based on electrical impact analysis and a pattern dependent model of an electrochemical deposition or electrochemical mechanical deposition fabrication process, generating a strategy for placement of dummy fill in the process, and using the pattern dependent model and the electrical impact analysis to evaluate the expected results of the dummy fill to be placed, the use of the model and the electrical impact analysis being embedded as part of the generation of the dummy fill placement strategy.

In general, in another aspect, the invention features, based on an electrical impact analysis and a pattern dependent model of an electrochemical deposition or electrochemical mechanical deposition fabrication process, generating a strategy for placement of dummy fill in the process, and using the pattern dependent model and the electrical impact analysis to evaluate the expected results of the dummy fill to be placed, the fabrication process for which the strategy is being generated comprising other than an oxide chemical mechanical polishing process.

In general, in another aspect, the invention features, based on a pattern dependent model of an electrochemical deposition or electrochemical mechanical deposition fabrication process, generating a strategy for placement of dummy fill in the process, and using the pattern dependent model to evaluate the expected results of the dummy fill to be placed, the fabrication process for which the strategy is being generated comprising two or more stages of fabrication.

Implementations of the invention may include one or more of the following features.

A server is operated to provide dummy fill generation functions for a semiconductor design, and a user at a client is enabled to operate through a web browser to develop the dummy fill placement strategy. The server is local to the user. The server is remote from the user.

A design to which the dummy fill strategy has been applied is analyzed, the design is adjusted based on the analysis, the analyzing and adjusting steps are iterated, and an integrated circuit manufactured according to the adjusted design is certified to be within predefined physical and electrical parameters.

The two stages comprise two or more processes. The two stages comprise two or more steps of a single process. The two stages comprise electrochemical deposition or electrochemical mechanical deposition and chemical mechanical polishing.

The generating of a strategy includes generating dummy fill rules. A set of hierarchical cell placements are defined for dummy fill, and a size of an electronic layout file to which dummy fill is added is reduced by using the hierarchical cell placements.

The dummy fill generation is performed by a user through a web browser and a web server. The web server is local to the user. The web server is remote from the user.

The fabrication process comprises an electrochemical mechanical deposition process. The strategy for placement of dummy fill includes determining the size and placement of dummy fill.

The fabrication process comprises a formation of a low-K interlayer dielectric. The fabrication process comprises chemical vapor deposition or spin-on of the low-K dielectric.

Generating the dummy fill strategy includes dividing a semiconductor design into grids. Generating the dummy fill strategy also includes extracting local pattern densities for a semiconductor design for each of the grids. Generating the dummy fill strategy also includes extracting local line width for a semiconductor design for each of the grids. Generating the dummy fill strategy also includes extracting local line spacing for a semiconductor design for each of the grids. Generating the dummy fill strategy also includes computing an effective pattern density for each grid. Models are used for computing film thickness non-uniformity with respect to a semiconductor design for which the dummy fill strategy is being generated. A variation in film thickness is computed. Coordinates of all objects within each of the grids are computed. At least one of line width, line space, length, and bounding box is generated with respect to each of the objects. The dummy fill strategy includes adding dummy fill in empty areas of each of the grids. The dummy fill includes slots in objects. A local density is recomputed in each of the grids after adding dummy fill. An effective pattern density is recomputed for each of the grids after adding dummy fill.

The dummy fill strategy is based on criteria for electrical parameter variation tolerances for at least one of the following: capacitance and resistance, sheet resistance, outputs delay, skew, voltage drop, drive current loss, dielectric constant or crosstalk noise. The effective pattern density is computed based on a polishing process planarization length. The effective pattern density is computed using an elliptically weighted window or other filter. Dummy fill rules based on electrical design guidelines are generated dynamically with a change in technology or design parameters. An effective pattern density is generated dynamically with a change in a process planarization length.

The fabrication process comprises lithography. The fabrication process comprises electrochemical or electrochemical mechanical deposition. The fabrication process comprises copper chemical mechanical polishing. Pattern dependencies are extracted from a layout of the semiconductor. The layout dependencies include dependencies with respect to line spacing, line-width or line density.

Patterned test wafers or test semiconductor devices are used to calibrate a pattern dependent model with respect to a preselected tool or process recipe, and based on a pattern dependent model of a semiconductor fabrication process, the strategy is generated for placement of dummy fill in the process.

A calibrated pattern dependent model is used to map pattern dependent features to wafer-state parameters such as resulting film thickness, film thickness variation, dishing, erosion and electrical parameters such as sheet resistance, resistance, capacitance, crosstalk noise, drive current loss, voltage drop and effective dielectric constant, and based on the pattern dependent model, the strategy is generated for placement of dummy fill in a fabrication process.

A cost function is used to measure an impact of dummy fill modification on process induced wafer state and electrical parameter variation. Based on a combination of more than one pattern dependent model, a strategy is generated for placement of dummy fill in a process, and an impact is predicted of the dummy fill generated by the strategy on process variation. Based on a combination of more than one pattern dependent model and cost function, a strategy is generated for placement of dummy fill in a process that optimizes full-chip wafer-state and electrical parameters.

Based on predicted or simulated wafer state and electrical parameters, dummy fill rules are generated for use in dummy fill placement in a semiconductor fabrication process. The dummy fill rules include dummy fill sizing. The dummy fill rules include dummy fill placement. The dummy fill rules include dummy fill hierarchical cell creation and management. Dummy fill functions are provided to generate the dummy fill strategy, and the functions are used to automatically modify GDS-format electronic layout files for a semiconductor device.

At an internet server, a layout file for a semiconductor device is received from a client, dummy fill modifications to the layout file are generated at the server, and the dummy fill modified layout file is returned from the server to the client. At a server, a service is provided that enables a user to interactively configure a dummy fill application running on the server, and enables the user to generate dummy fill information using the dummy fill application. The server is a web server. The user is at a remote location with regard to the web server. A service is made available to a user on a network that enables the user to verify dummy fill information with respect to a semiconductor design and a fabrication process.

The dummy fill information that is verified includes at least one of a dummy fill pattern, a dummy fill strategy, or a dummy fill representation. The dummy fill information is verified with respect to a single interconnect level of the semiconductor design. The dummy fill information is verified with respect to multiple interconnect levels of the semiconductor design. Dummy fill objects are sized and dummy fill patterns of the objects are created for one or more interconnect levels of the semiconductor design. The dummy fill information comprises dummy fill rules. The pattern includes oxide or metal dummy fill objects. The objects of the dummy fill pattern are placed to minimize full-chip film thickness variation. The objects of the dummy fill pattern are placed to minimize full-chip variation in electrical parameters. The electrical parameters comprise at least one of sheet resistance, resistance, capacitance, crosstalk noise, voltage drop, drive current loss, and effective dielectric constant. The GDS files are modified to improve uniformity and electrical performance of the semiconductor device. The process comprises a damascene process flow. A web-based application is made available to a user on a network comprised of web services that enable the user to verify dummy fill information with respect to a semiconductor design and a fabrication process. The network is an intranet, extranet or the internet.

The dummy fill placement strategy includes using dummy fill objects to improve a structural integrity of low-K dielectric features. The dummy fill placement strategy includes using dummy fill objects to maintain or improve an effective dielectric constant of low-K dielectric features. The effective dielectric constant is maintained through all steps of a damascene process flow. The dummy fill placement strategy includes using dummy fill objects to facilitate integration of low-k dielectric materials into -damascene process flow.

A library of semiconductor dummy fill information is maintained, and the library is made available for use in connection with generating dummy fill placement specifications, and the library is updated with changed dummy fill information. Calibration information is stored with respect to at least one of the following: process tools, recipes, and flows, and updating the calibration information to reflect changes in the process tools, recipes or flows. The calibration information is used in generating a dummy fill strategy. A selection is made among process tools, recipes and flows from calibration database based upon desired dummy fill characteristics. A user is enabled to obtain a dummy fill strategy for a semiconductor design using a single click of a user interface device through a user interface. The process comprises a damascene process.

Other advantages and features of the invention will become apparent from the following description and from the claims.

BRIEF DESCRIPTION OF THE DRAWINGS

FIG. 20A provides an example of dummy fill sizing rules.

FIG. 20B provides an example of dummy fill pattern generation rules.

FIG. 23 illustrates how a 4×4 cell can be represented by 8 objects.

DETAILED DESCRIPTION

We describe a method of adding dummy fill to reduce process variations caused by dependencies in the electrochemical deposition and subsequent chemical mechanical polishing of interconnect features used in semiconductor devices. The variation in wafer quality (e.g. film thickness variation and surface topography variation such as dishing and erosion) and electrical parameters (resistance, capacitance, and noise) are modeled and simulated using semiphysical process models that may be calibrated to a particular process and tool for each step in a sequence of one or more steps within a process flow. Dummy fill structures are placed in the layout to improve thickness and surface topography uniformity of the manufactured wafer while maintaining the electrical parameters at the intended or designed values. The added structures are placed in such a way as to: modify the design layout parameters such as effective pattern density, maximum and minimum widths and spaces between structures; improve the structural properties of the underlying dielectric insulator (e.g. low-k); and minimize or limit the impact on electrical performance.

To provide a more computationally efficient method of data storage, this technique may also use a library of cells for placement of the dummy fill structures. Since the fill patterns may be repeated throughout the chip, the use of cells reduces the need to store redundant information about the dummy structures each time a region needs to be filled. Different size cells can be chosen from the library to fill a given area. A method that uses hierarchy of cells may also be used.

Implementation examples are described below. In the interest of clarity, not all features of an actual implementation are described in this specification. In the development of any such actual embodiment, numerous implementation-specific decisions must be made to achieve the developers' specific goals, such as compliance with system-related or business-related constraints, which will vary from one implementation to another. Moreover, such a development effort might be complex and time-consuming, but would nevertheless be a routine undertaking for those of ordinary skill in the art of having the benefit of this disclosure.

A dummy fill system is described that minimizes the impact of process variation and subsequent electrical impact by embedding both a manufacturing process model or simulation and an electrical performance model or simulation inside the dummy fill method. The preferred method forms a feedback system that determines the proper sizing and placement of dummy fill to minimize the impact of process variation on electrical performance.

Figure 7:
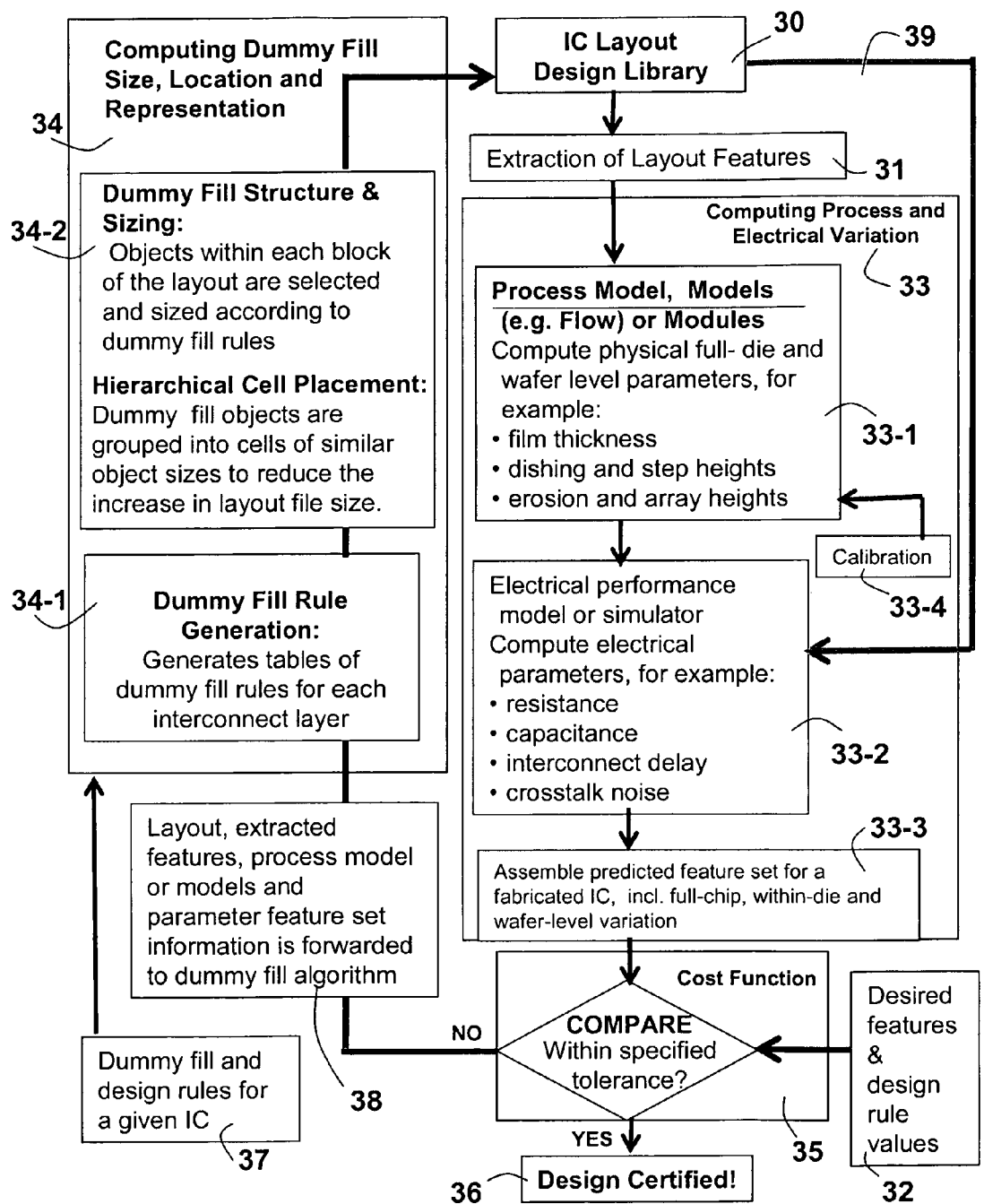
FIG. 7 illustrates the computational flow of the complete dummy fill method

The following paragraphs describe an embodiment of the method, which is depicted in FIG. 7. Sub-blocks (31, 33, 34 & 35) within FIG. 7 will be described in greater detail in sections b. through f. An IC design is commonly represented electronically (e.g. in a GDS format) in a library of files that define structures and their locations at each level of an integrated circuit, 30. These files are typically very large in size, although the features that are relevant to process variation can be described more efficiently. Layout extraction, 31, involves summarizing discrete grids of IC designs in a compact set of such parameters such as linewidth, linespace and density for each grid. The layout features are mapped, 33, to wafer quality, such as film thickness, or electrical parameters, such as sheet resistance or capacitance. This information may be used with a process model (e.g. CMP) or set of process models (e.g. ECD and a multi-step CMP process or a more complex process flow) to predict or simulate the manufacturing results and corresponding variation, 33-1. This variation can be measured physically, such as optical measurement of the film thickness, or surface profiling of wafer surface to measure topography (e.g. dishing or step height and erosion or array height). The variation can also be measured electrically, such as sheet resistance or capacitance, 33-2 and may require the use of the original IC design, 39. The computed parameters from 33-1 and 33-2 are assembled for the full-chip, both within die and for multiple dies across the wafer, 33-3.

Using a combination of both process models and electrical simulations, the performance of a given IC design can be predicted and compared against the desired wafer quality and electrical parameters as well as design rule criteria, 32. In a mathematical sense, one could consider this comparison to be a cost function, 35, based on reduction of process variation while maintaining electrical performance, which drives the overall dummy fill strategy.

If the design does not meet the specified tolerances, then dummy fill (either copper or oxide) may be added to adjust the layout parameters (e.g. density) and reduce the variation. The layout, extracted features, post-process parameters, 38, and design rules, 37, are fed into the sizing and placement algorithm, 34, which determines the size of the dummy fill objects, the pattern of the objects and the location or placement of the structures within the design. There are two primary components of dummy fill sizing and placement: rule generation, 34-1, and the sizing and hierarchical placement, 34-2. Rule generation converts the design rules and constraints to dummy fill guidelines. Each dummy fill object can be placed within the chip design as an independent object but that approach increases the layout file size dramatically. A library of hierarchical cells or meta-objects is created based on structural features, such as linespace and linewidth. These cells can be represented more efficiently in terms of file size and memory requirements, when placed hierarchically within the design file. The system outputs a design file in a graphical computer aided design format (e.g. GDS). The complete system may be ran as each IC component is added to the design, in real-time, or after all the components have been added to the IC design layout. Our method iterates until a dummy fill strategy is determined that meets the desired process specifications and electrical performance. The design is then certified for manufacturing, 36.

Illustrative embodiments of a method for manufacturing are described in the following sections. Section a. describes a use of an embodiment to reduce variation due to electroplated copper deposition (ECD) processing. Section b. describes the extraction of layout parameters related to process variation as a method to transform the large design files into a manageable set of features. Layout extraction is not required but is preferred. Section c. describes the preferred use of process and electrical models to characterize the impact of process variation on electrical performance. Section d. describes the use of cost functions to measure the impact of dummy fill modification (or lack thereof) and how these functions may be used to achieve desired wafer quality and electrical performance criteria. Section e. provides detailed descriptions of the dummy fill rule generation and management, dummy fill sizing and dummy fill placement. Section f. describes, in detail, the hierarchical cell placement algorithm and the memory benefits over non-hierarchical approaches. Section g. describes several applications of the described dummy fill system to damascene process flows, electrochemical deposition (ECD) and electrochemical mechanical deposition (ECMD) and integration of low-k dielectrics into damascene process flows. Section h. describes the construction and computational framework used to implement the dummy fill methods as well as the operation of the dummy fill system and methods by users. Section i. concludes with results of the current implementation of the dummy fill methods as well as screenshots of the user interface.

a. Use of Dummy Fill to Reduce Variation Related to ECD

Electroplated copper deposition (ECD) is used to create the interconnect structures in a copper damascene process. The goal is to completely fill the trench region in a void-free manner while minimizing the variation in the deposited copper thickness and minimizing the surface topography (often referred to as step height).

The time to closure (time it takes to completely fill the trench, described as time $T_f$) depends heavily on the width of the line and the depth of the trench. For large trenches, the deposition of copper on the sidewalls is small relative to the width of the trench. Therefore, these trenches tend to fill from the bottom up, often at the same rate as the deposition in the field region. The trench is thus filled with the same copper thickness as that on the field, leaving a large step, or step height, on the surface of the copper film over the wide damascene trench. In contrast, the deposition of copper on the sidewall of small trenches rapidly reduces the width of the damascene trench. This increases the concentration of the accelerator agent dissolved in solution, which results in a rapid acceleration of the deposition rate on the bottom of the trench. The copper in the trench fills much more rapidly than in the field area until it fills the trench. Resident accelerators in the copper over the small trench causes the accelerated copper deposition to continue the over the trench, resulting in the formation of a copper bump, or negative step height. The combination of these effects with the large variation in trench width across the chip lead to a large variation in copper thickness and step height across the chip.

Dummy fill or dummy slots may be used to minimize the variation in the deposited copper thickness and surface topography. The addition of dummy fill to the surface topography could significantly reduce the variation. This reduction in variation could lead to significantly more uniform polishing, thus reducing the need for dummy fill and dummy slotting to reduce CMP variation.

Figure 8A:
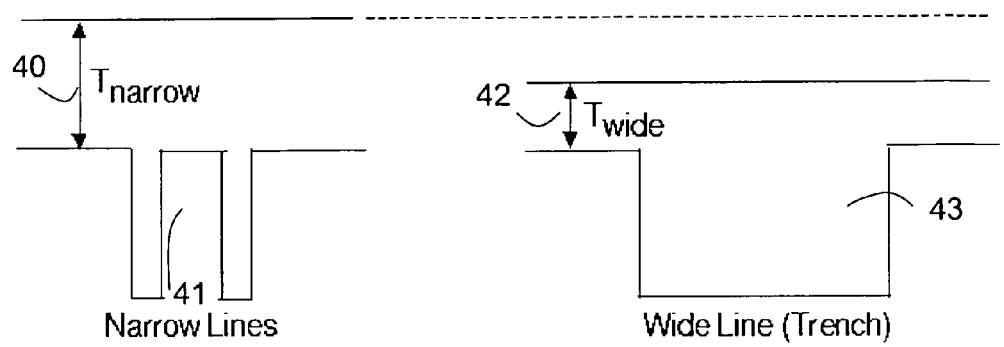
FIG. 8A illustrates the variation in ECD deposition thickness as a result of pattern dependencies, such wide and narrow lines.
Figure 8B:
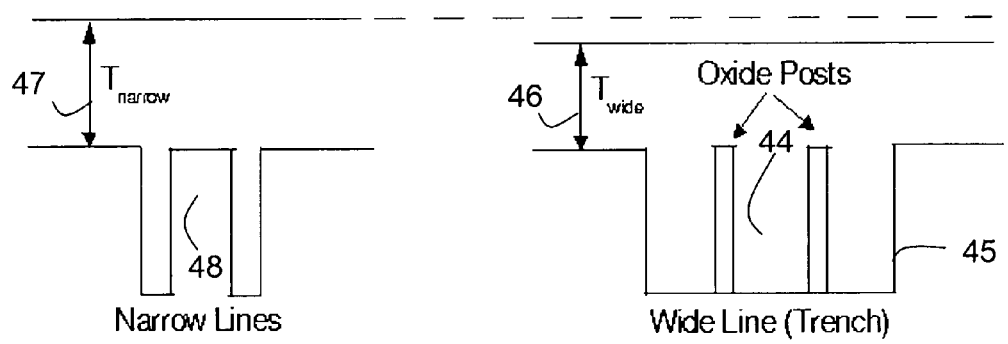
FIG. 8B illustrates the use of oxide dummy posts to achieve uniform ECD film thickness.

For example, filling trenches with dummy oxide structures, or slots, can reduce the thickness and step height variation resulting from electroplated copper deposition. FIG. 8 illustrates a use of oxide dummy fill for ECD. FIG. 8A shows the difference between the deposited copper thickness, 40, over narrow linewidths, 41, and the deposited copper thickness, 42, over a wide linewidth or trench, 43. FIG. 8B illustrates how the addition of oxide dummy posts, 44, in the trench, 45, results in a deposited thickness, 46, equal to the thickness, 47, over the narrow linewidths, 48. The oxide dummy posts act to reduce the effective linewidth of the trench. The addition of oxide dummy fill is equivalent to the removal of metal, which is also referred to as slotting. This figure illustrates a use of dummy oxide slots within wide trenches so that the deposition of the wide trenches behave more like small trenches, thus reducing the difference in deposited copper thickness and step height. If the oxide slots are small compared with the trench width, there is a small change in the electrical properties of the wide interconnects. By embedding electrical simulations into the method, the affect of these slots is calculated. These calculations are used to determine the width and density of the slots placed in the lines. In addition, the electrical calculations are used to limit the amount of slotting based on limits on electrical performance loss specified by the designer. The proper addition of oxide dummy structures reduces the step height variation before CMP, which should result in a more uniform CMP process.

b. Layout Parameter Extraction

A layout is a set of electronic files that store the spatial locations of structures and geometries that comprise each layer of an integrated circuit. It is known that process variation, that negatively impacts the planarity of processed films, is related to the variation in spatial densities and linewidths of a given design. To characterize this relationship, our preferred method uses layout extraction, where linewidth and density features are extracted spatially across a chip from the geometric descriptions in layout files. The extracted information may then be used to determine areas of the chip that exceed design rule criteria regarding designed linewidth and density.

The layout parameters used to compute dummy fill includes the effective pattern density and linewidth. Although the dummy fill method works with extracted densities and linewidths, some embodiments utilize the extracted linespace, as well as linewidth and density.

Figure 9A:
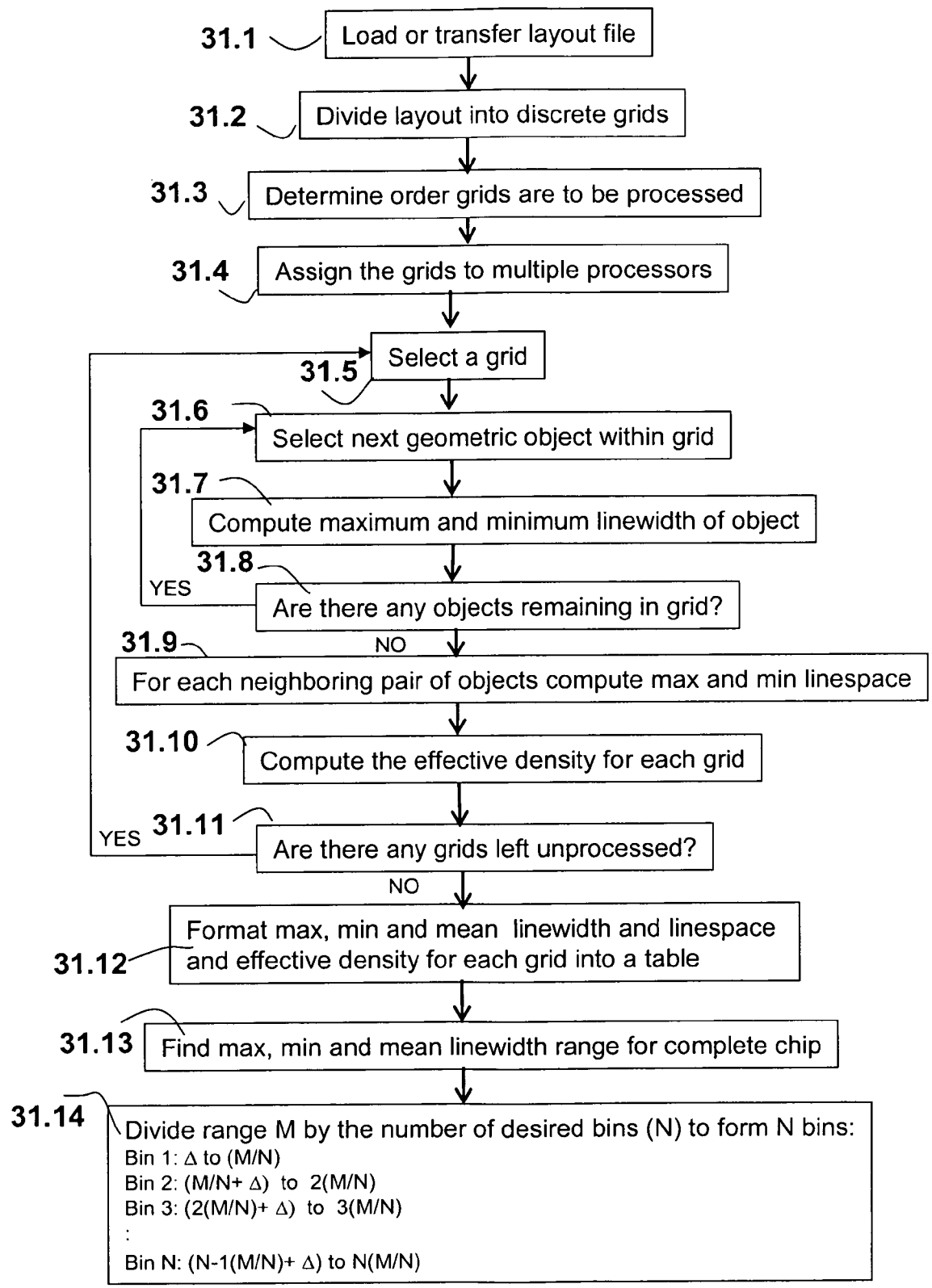
FIG. 9A illustrates the steps involved in layout extraction.
Figure 9B:
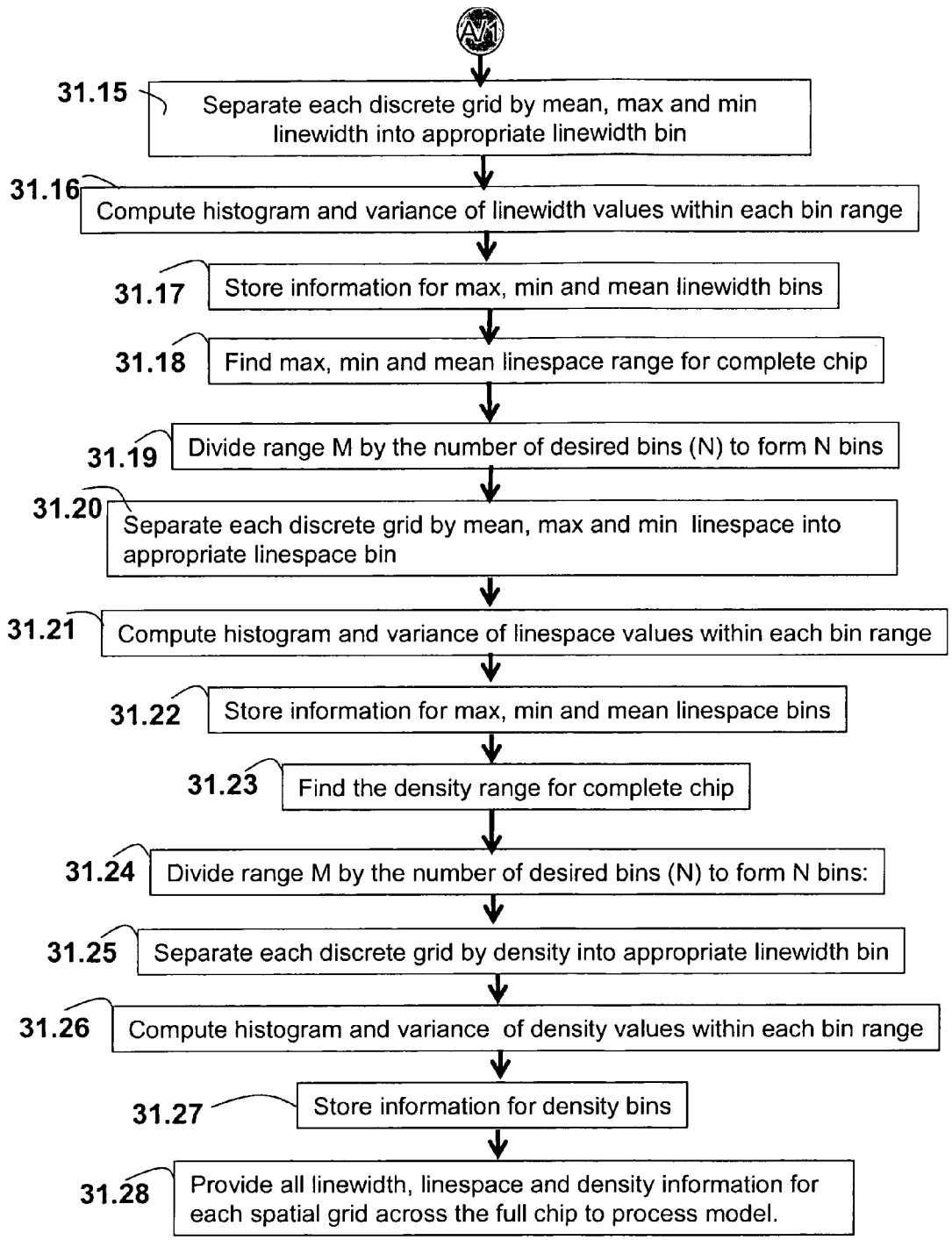
FIG. 9B illustrates a continuation of the steps involved in layout extraction.

The flowchart in FIG. 9 provides a detailed flow of the layout extraction component shown in 30 of FIG. 7. In FIG. 9, the layout file is transferred or uploaded to the dummy fill system, 31-1. The layout is divided into discrete grids, small enough so that aggregate computations of mean, maximum and minimum features are used to represent the structures in the grid and still allow accurate dummy placement, 31-2. Typical grid size in current implementations is 40 μm×40 μm. The grids are ordered or queued for processing, 31-3. One good embodiment is to use multiple processors to compute the grids in parallel, 31-4. A grid is selected, 31-5 and within that grid each object, 31-6 has the linewidth of the object computed, 31-7. This process is repeated for every object within that grid, 31-8. For each set of neighboring objects the maximum, minimum and mean linespace is computed, 31-9. The effective density for the entire grid is then computed, 31-10. This process is repeated for all the remaining grids, 31-11. Once all the grids are processed, the extracted features are re-assembled from the different processors, 31-12. A table is then created and the maximum, minimum and mean linewidth, linespace and density are placed in it as well as the maximum, minimum and mean linewidth for the whole chip, 31-13. The minimum and maximum linewidth is used to compute a range.

The linewidth range (M) is divided by the number of desired bins (N), 31-14, to determine the relative size of each of the N bins. For example the first bin would be the minimum linewidth or small nonzero value $\Delta$ to the linewidth (M/N) and continue until the $N^{th}$ bin which will span the linewidth from $minLW_{BinN}=(N-1)\cdot(M/N)$ to $maxLW_{BinN}=(N)\cdot(M/N)$, which is also the maximum linewidth. There are three sets of bins, a set of bins for each of maximum, minimum and mean linewidth. Each grid is separated into the appropriate bins according to its max, min and mean linewidth, 31-15. A histogram is also created for each bin showing the distribution of values within that bin, 31-16. This information is stored in the database and fed into process models, in particular ECD models, as well as the dummy fill rules generation, 31-17.

The maximum, minimum and mean linespace ranges are computed for the full chip, 31-18. The linespace range (M) is divided by the number of desired bins (N), 31-19, to determine the relative size of each of the N bins. For example the first bin would be the minimum linespace or small nonzero value Δ to the linespace (M/N) and continue until the $N^{th}$ bin which will span the linespace from $minLW_{BinN}=(N-1)\cdot(M/N)$ to $maxLW_{BinN}=(N)\cdot(M/N)$, which is also the maximum linespace. There are three sets of bins, a set of bins for each of maximum, minimum and mean linespace. Each grid is separated into the appropriate bins according to its max, min and mean linespace, 31-20. A histogram is also created for each bin showing the distribution of values within that bin, 31-21. This information is stored in the database and fed into process models, in particular ECD models, as well as the dummy fill rules generation, 31-22.

The density range is computed for the full chip, 31-23. The density range (M) is divided by the number of desired bins (N), 31-24, to determine the relative size of each of the N bins. For example the first bin would be the minimum density or small nonzero value Δ to the density value (MIN) and continue until the Nth bin which will span the density from $minLW_{BinN}=(N-1)\cdot(M/N)+\Delta$ to $maxLW_{BinN}=(N)\cdot(M/N)$, which is also the maximum density. There is one set of bins for density. Each grid is separated into the appropriate bins according to its density, 31-25. A histogram is also created for each bin showing the distribution of values within that bin, 31-26. This information is stored in the database and fed into process models, in particular ECD models, as well as the dummy fill rules generation, 31-27. Finally all the linewidth, linespace and density information are stored either in the database or on the file system for later use in process model prediction or dummy rule generation and placement, 31-28.

Figure 10A:
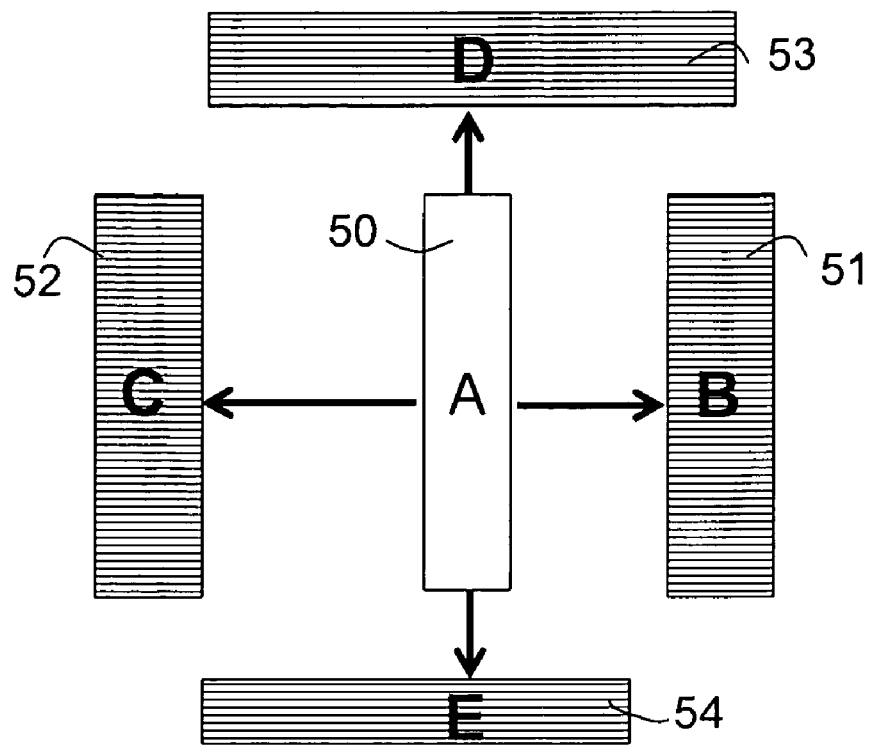
FIG. 10A illustrates the structures neighboring a given object, A.
Figure 10B:
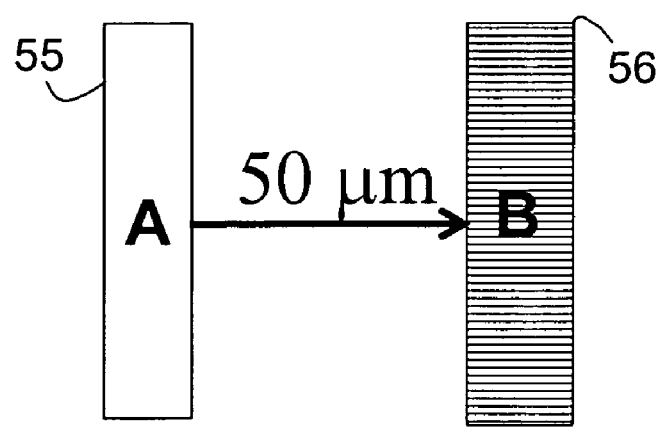
FIG. 10B illustrates the distance between objects A and B.
Figure 10C:
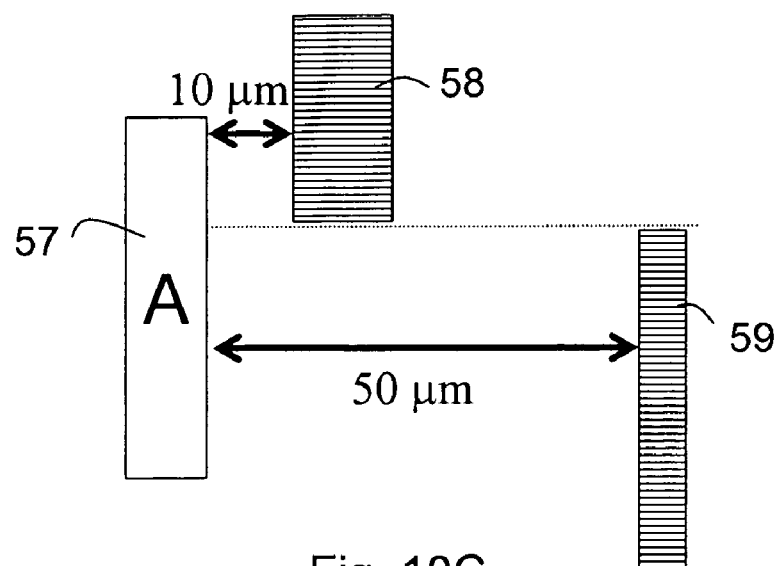
FIG. 10C illustrates the distance between closer and farther neighboring objects.
Figure 10D:
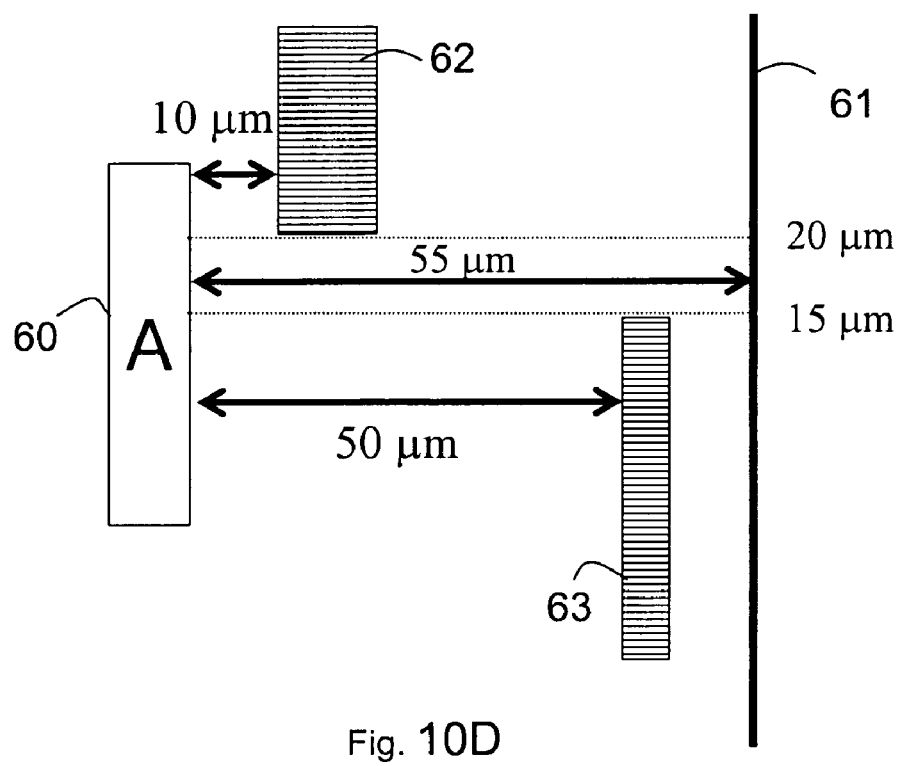
FIG. 10D illustrates how the grid boundary may be considered a neighboring object.

Dummy fill placement algorithm also requires direct knowledge about the exact coordinates of an existing layout object and its surrounding neighbors. The object dimensions (length and width) must be known as well as the space to nearby objects in each direction. To determine the coordinates of the dummy fill region, four steps are required. In the first step, the coordinates of a selected object are obtained to determine its length and width. In the second step, shown in FIG. 10A, the space from the selected object (object A), 50, to its nearest neighbors is computed in all directions, object B, 51, object C, 52, object D, 53, and object E, 54. If there is more than one object in a given direction, the space and range information must be computed. For example, FIG. 10B shows that there is only one object to the east of the selected object and the space to the object B, 56, from object A, 55, is equal to 50 μm. In FIG. 10C, there are two objects, 58 & 59, to the east of the selected object, 57. In this case, there are two ranges for linespace; the range from object A, 57 to the farther object, 59, has a linespace of 50 μm. The range from object A, 57 to the closer object, 58, has a linespace of 10 um. In FIG. 10D, there are also two objects, 62 & 63. However, in this case there are three ranges, with no objects to the east of object A, 60, between y=15 μm and x=20 μm, and object A has a range to the grid boundary, 61, as well. Depending on the surroundings, one or more space ranges are generated for each object. If there are no objects until the edge of the selected block or grid, 61, the space can be set to the distance between the object edge to the grid boundary or neighboring grids, 61, can be searched until an object is found (or the chip boundary is reached).

The third step uses the linewidth and linespace information to find the dummy fill rule, often from a rule table. Finally, the fourth step computes the coordinates of the dummy fill region based on the dummy fill rule and the coordinates of the selected object and its neighbors.

Figure 11:
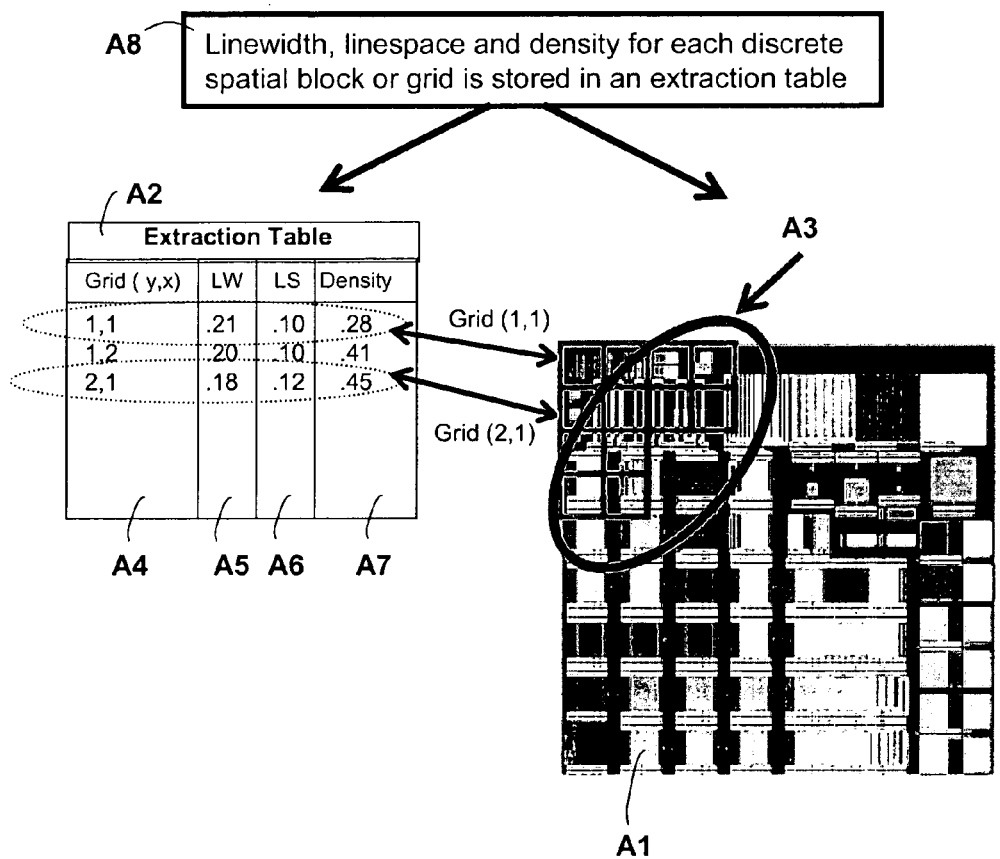
FIG. 11 illustrates the relationship between spatial regions across the chip and the creation of a layout extraction table.

An example of how an extraction table is used to represent the full-chip or die is shown in FIG. 11. The chip or die, A1, is segmented into discrete grids, A3, and the extraction procedure, described in FIG. 9, is used to compute the linewidth, A4, linespace, A5, and density, A6, for each grid element. FIG. 11 illustrates how the linewidth (LW), linespace (LS) and density values placed in an extraction table relate to the grid at (y,x) coordinate (1,1) and the grid at (y,x) coordinate (2,1). In many cases, the max, min and mean of the features within each grid are stored in the table as well.

c. Process and Electrical Models

Figure 12A:
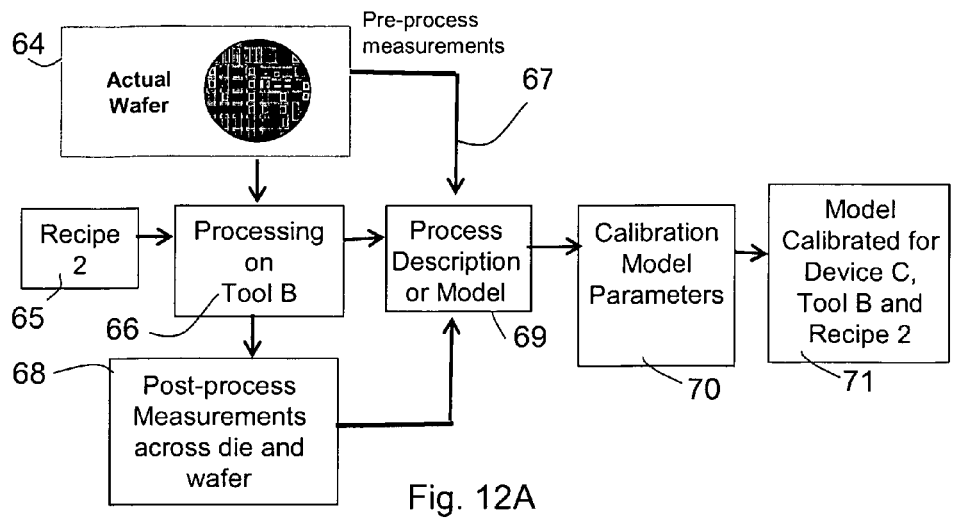
FIG. 12A illustrates the use of product wafers in calibrating a tool for a particular recipe.

The dummy fill method presented herein uses a process model or a series of models (i.e. a flow) to predict the manufactured variation in physical and electrical parameters from an IC design. By characterizing the process variation relative to IC structures, dummy fill can be added to minimize the variation of physical and electrical parameters from the desired values. This method is not dependent upon any particular type of model or simulation. However it is generally accepted that each process tool has unique characteristics and thus a model needs to be calibrated to a particular recipe and tool. Thus, it is often common practice to process a given IC design to determine the impact of processing on physical and electrical parameters and to develop or calibrate process models specific to a particular tool or recipe, as shown in FIG. 12A. In FIG. 12A, the actual product wafer, 64, is processed using a recipe, 65, on a particular tool, 66. The pre-process wafer measurements, 67, and post-process wafer measurements, 68, are used to fit model parameters, 69. One good embodiment is a semi-empirical model that characterizes pattern dependencies in the given process. The calibration model parameters or fitting parameters, 70, may be extracted using any number of computational methods such as regression, nonlinear optimization or learning algorithms (e.g. neural networks). The result is a model that is calibrated to this particular tool for a given recipe, 71.

Figure 12B:
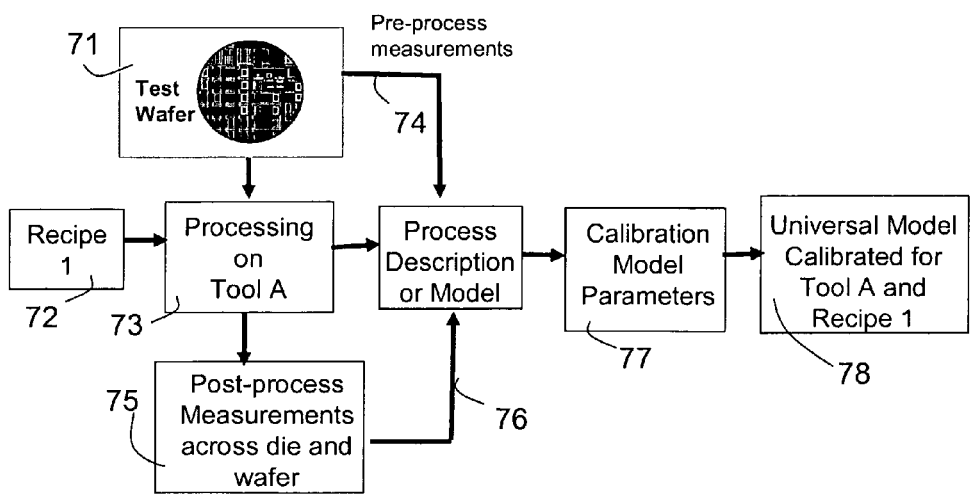
FIG. 12B illustrates the use of test wafers in calibrating a tool for a particular recipe.

It has been shown that certain IC characteristics such as feature density, linewidth and linespace are directly related to variation in topography for plating, deposition and CMP processes. It has also been shown that test wafers that vary these features throughout some range across the die can be used to build a mapping from design parameters (e.g. linewidth, linespace, density) to manufacturing variation (e.g. film thickness, dishing and erosion) for a given tool and recipe. Test wafers are an attractive alternative for assessing process impact in that they are generally less expensive to manufacture and one test wafer design can be used to characterize any number of processes or recipes for a wide range of IC designs. As shown in FIG. 12B, a test wafer can be also be used to generate a calibrated process model or multiple process models or a process flow. The calibration model parameters may be computed using the same method in FIG. 12A, as such the details will not be repeated here. One difference is that the pre-process measurement, 74, may be conducted by the test wafer manufacturer and retrieved in an electronic form, such as via the internet, email, disc or CD or paper form. The other difference is that the resulting calibration, 78, normally spans a much larger range of linespace, linewidth and density features and thus is more applicable to a broad range of devices.

Figure 13A:
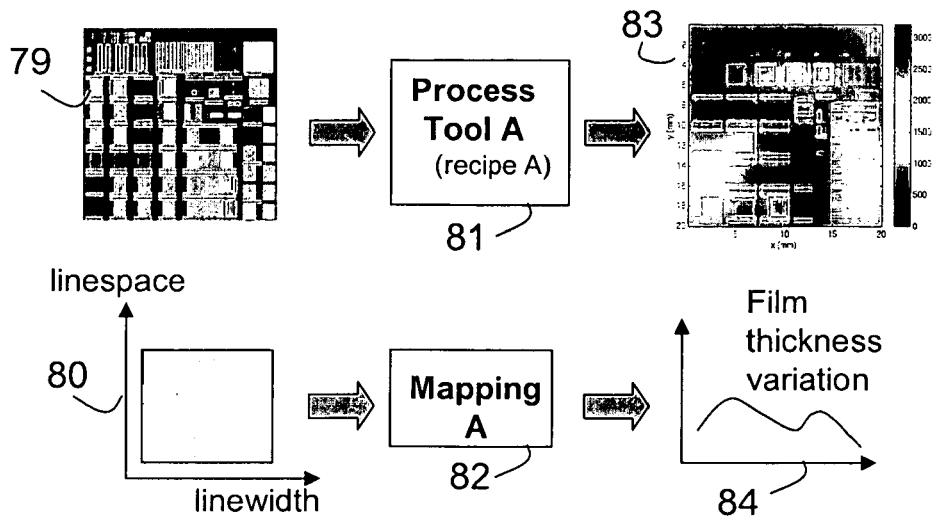
FIG. 13A illustrates how a calibration is used to map layout features to film thickness variation.
Figure 13B:
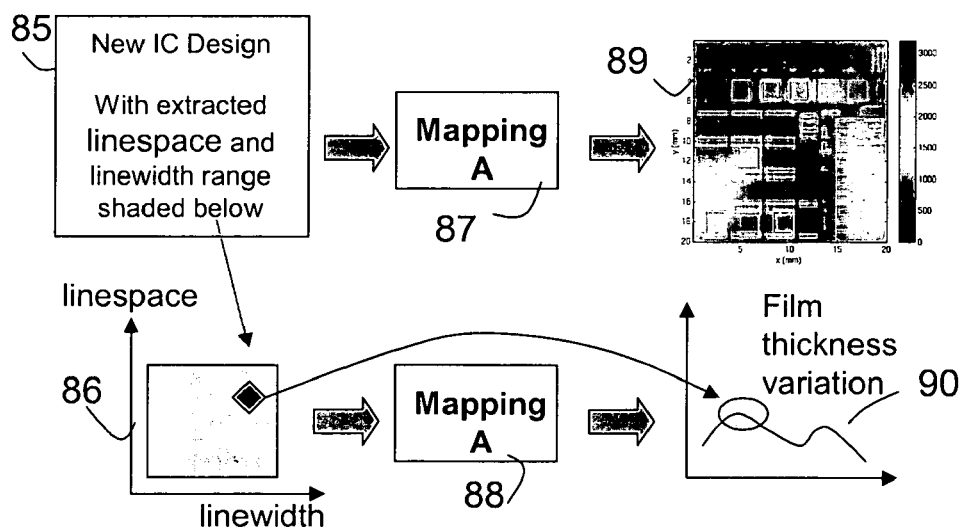
FIG. 13B illustrates the use of the calibration mapping to predict film thickness variation for a new IC design.

More details regarding the use of test wafers in calibrating a process are provided in FIG. 13A. A test wafer die is shown, 79, is patterned with a range of linewidth and linespace values, 80. The test wafer is processed (e.g. CMP, ECD or deposition) on a tool using a given recipe, 81, and the resulting variation is measured across the chip, 83, using a metrology tool (e.g. film thickness, 84). This mapping may be considered a model that maps a wide range of linewidth and linespace values to a particular film thickness variation for this tool and recipe. These mapping are useful for predicting process variation for new IC designs without having to actually tape-out masks and process the design, as shown in FIG. 13B. Linewidth and linespace features (whose range fall within the range, 86, spanned by the test die & wafer) are extracted, 85, from a new IC layout. The extracted linewidth and linespace features for spatial locations across the chip, 86, are input into the mapping, 87 & 88, and an accurate prediction of film thickness variation across the chip, 89 & 90, can be acquired for a given tool and a given recipe without actually developing expensive lithography masks and processing the new IC design.

Figure 13C:
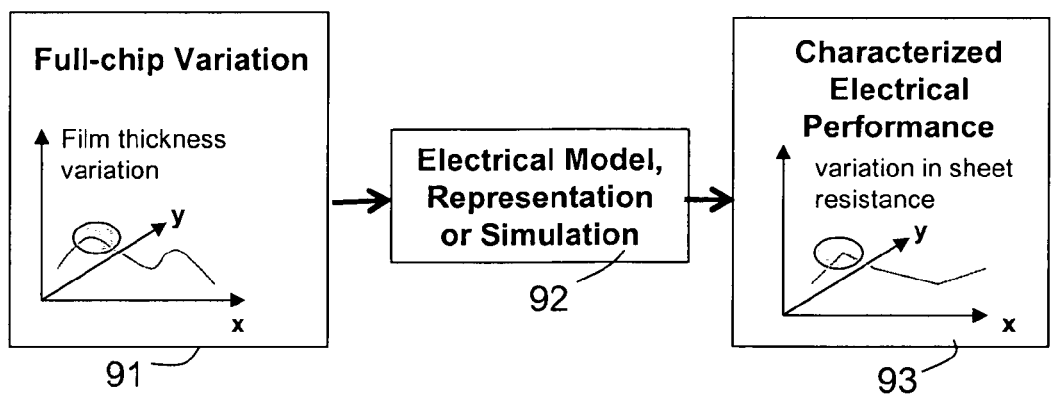
FIG. 13C illustrates how wafer-state parameters, such as film thickness variation, can be used to predict electrical parameters.

As shown in FIG. 13C, the predicted process variation, 91, can be fed into electrical models or simulations, 92, to assess the impact of processing on the electrical performance of the chip, 93. The layout for this design may be modified (e.g. through the addition of dummy fill or modification of the design), new layout parameters extracted and evaluation of process variation repeated. This may be repeated until a particular layout yields a desired level of process variation.

The following paragraphs and figure descriptions provide a detailed flow of an example of the use of process and electrical models to characterize variation, as implemented for dummy fill.

Figure 1A:
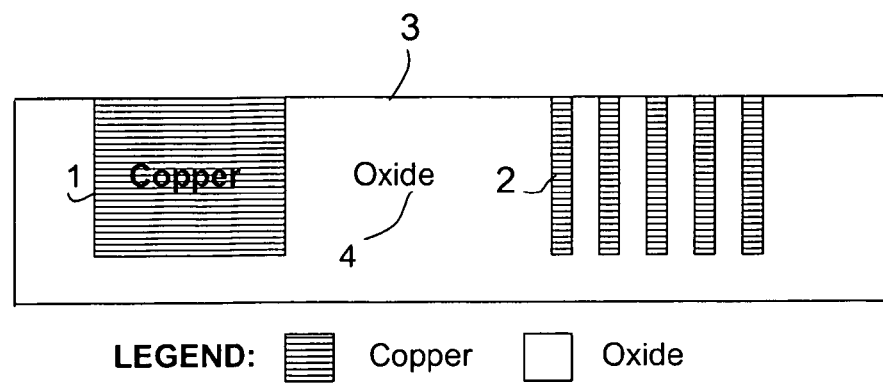
FIG. 1A illustrates the ideal wafer surface profile resulting from CMP used in a copper damascene process.
Figure 1B:
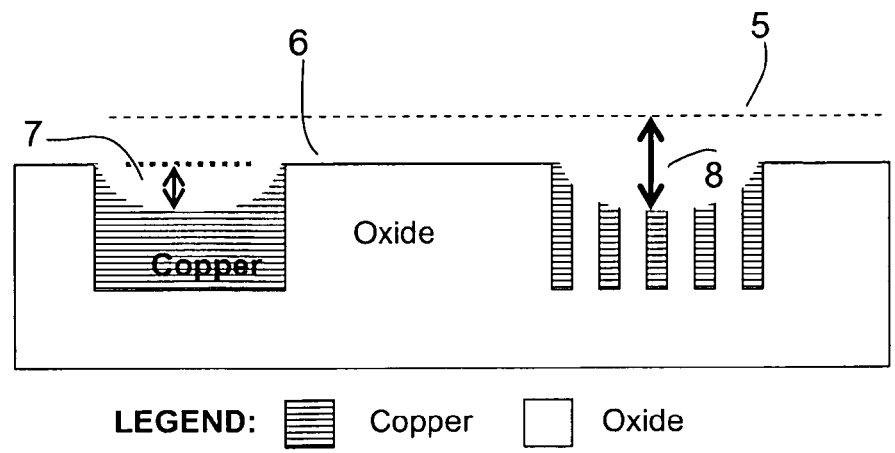
FIG. 1B illustrates a more realistic case where dishing occurs in metal lines and erosion occurs in surrounding oxide regions.
Figure 2A:
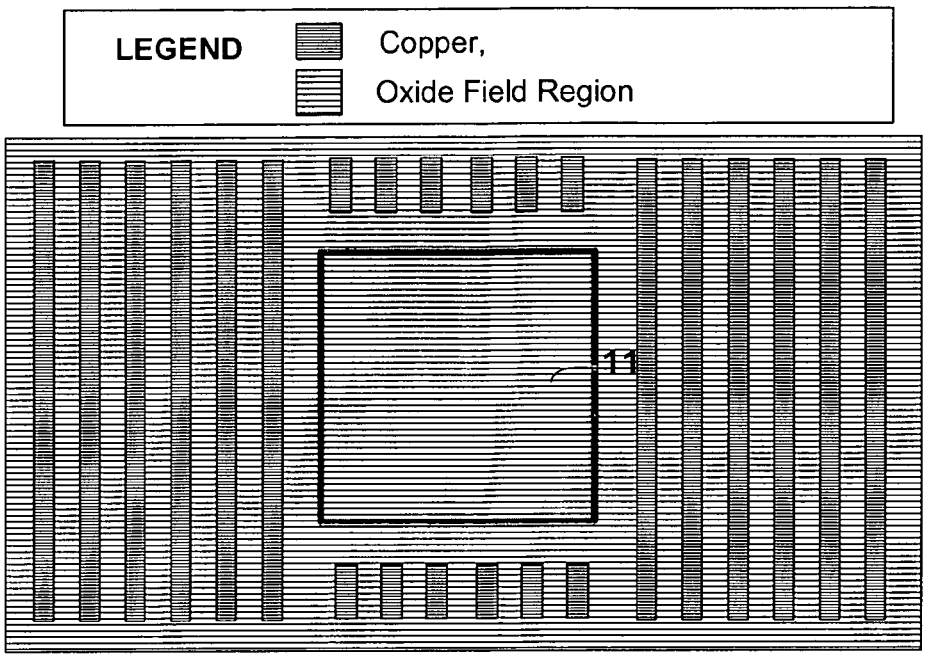
FIG. 2A illustrates an oxide field region containing copper lines and a large open oxide field area in the middle.
Figure 2B:
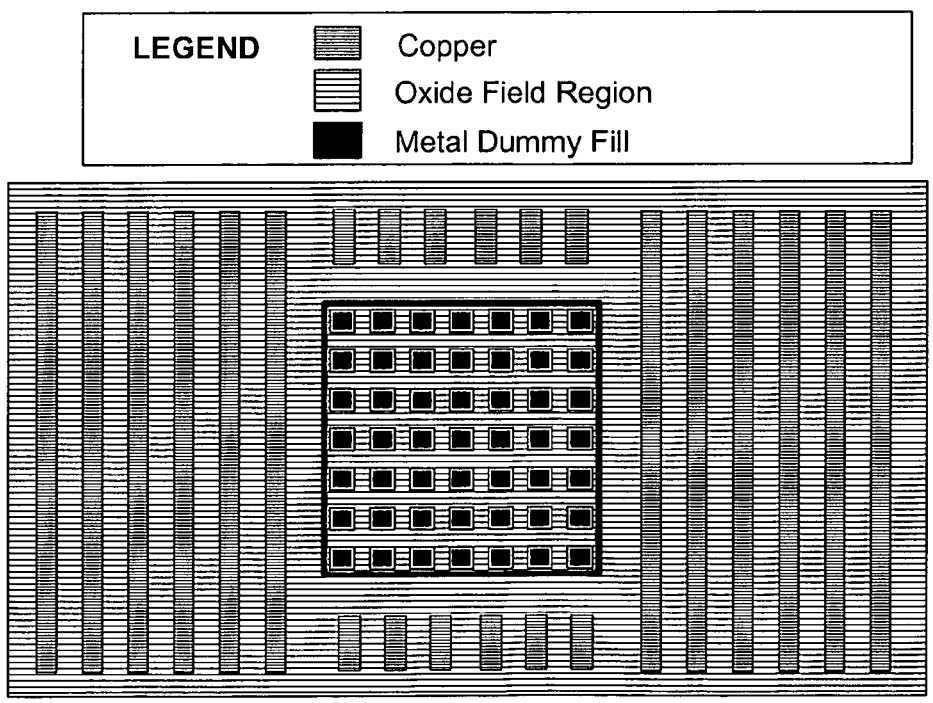
FIG. 2B illustrates the addition of metal dummy fill to raise the effective density of metal and promote better film thickness uniformity after CMP.
Figure 3A:
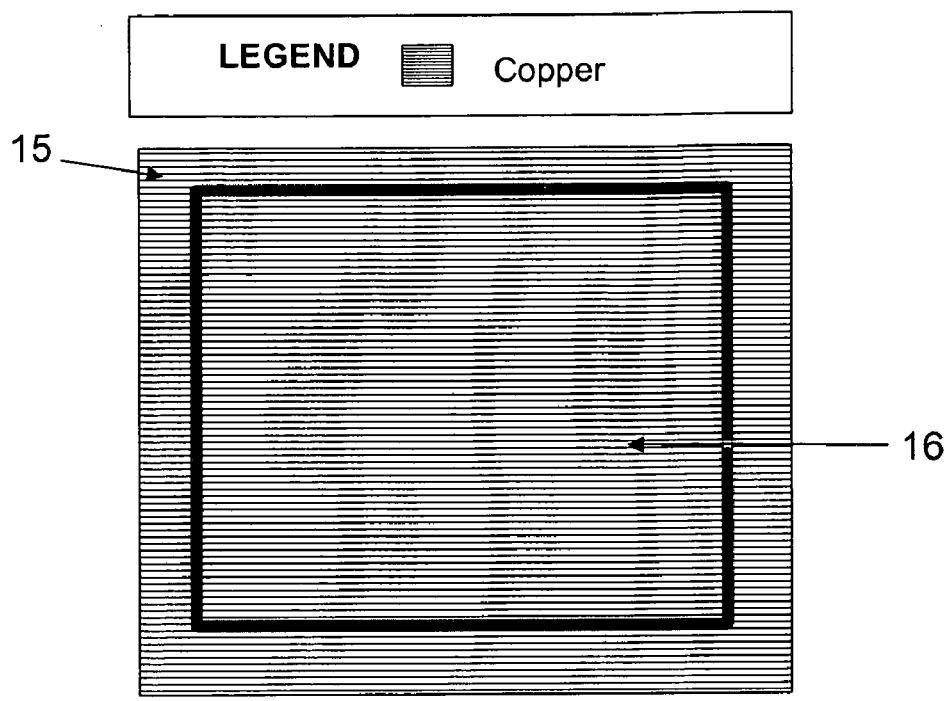
FIG. 3A illustrates a large metal field region.
Figure 3B:
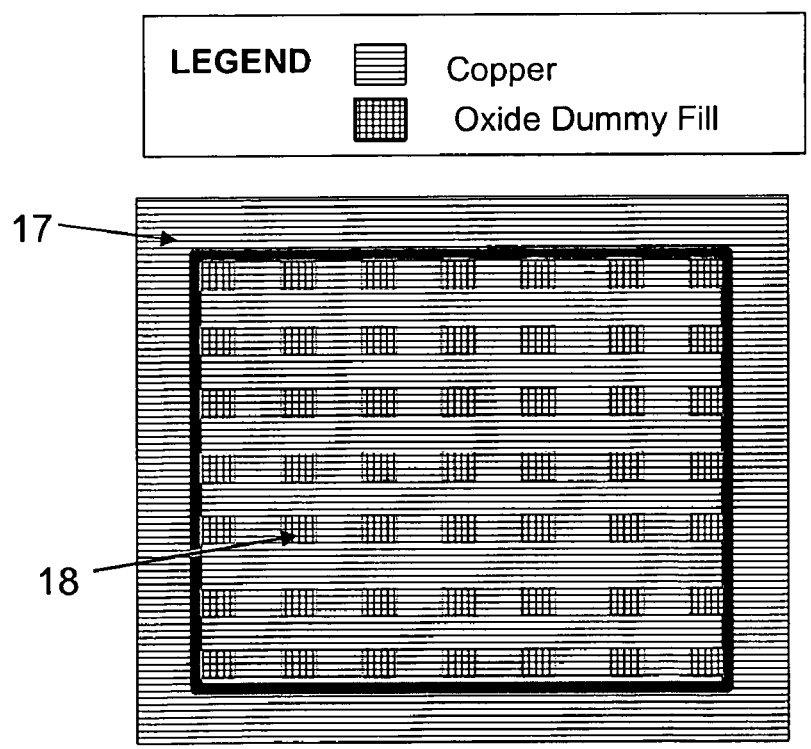
FIG. 3B illustrates the addition of oxide dummy fill to the metal region.
Figure 4A:
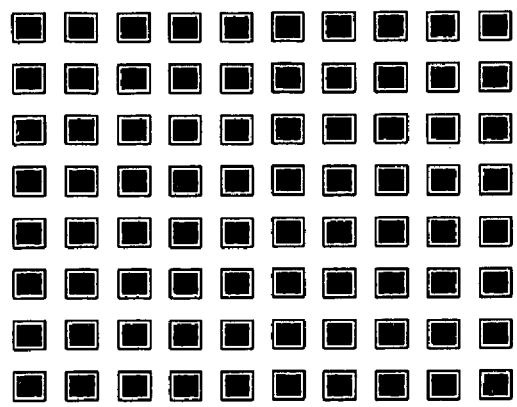
FIG. 4A illustrates a symmetric dummy fill pattern.
Figure 4B:
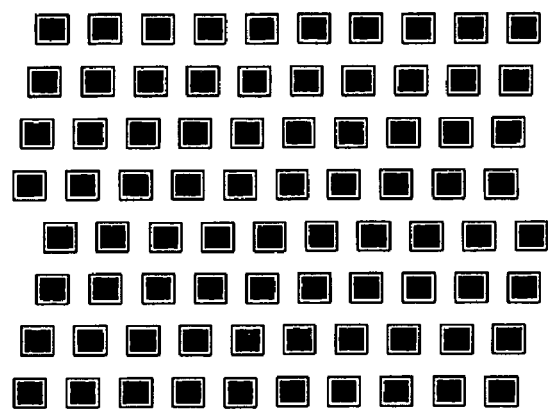
FIG. 4B illustrates an asymmetric dummy fill pattern in one direction.
Figure 4C:
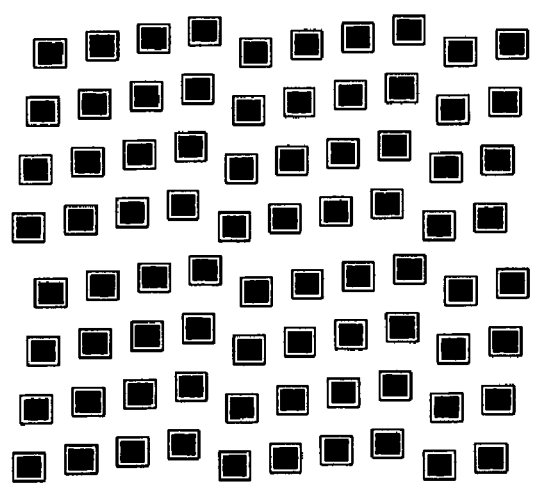
FIG. 4C illustrates an asymmetric dummy fill pattern in two directions.
Figure 5A:
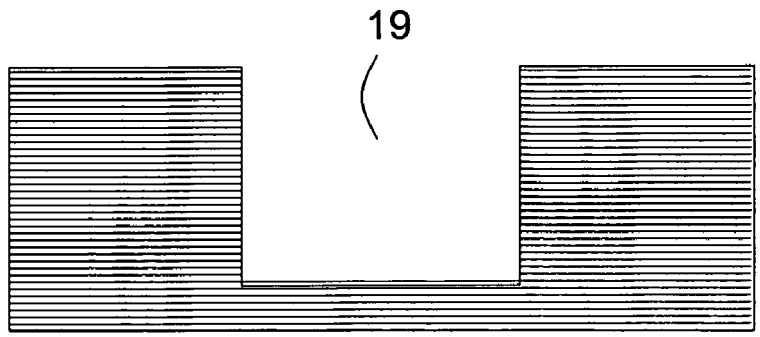
FIG. 5A illustrates the creation of a trench in oxide for electroplating (ECD) fill
Figure 5B:
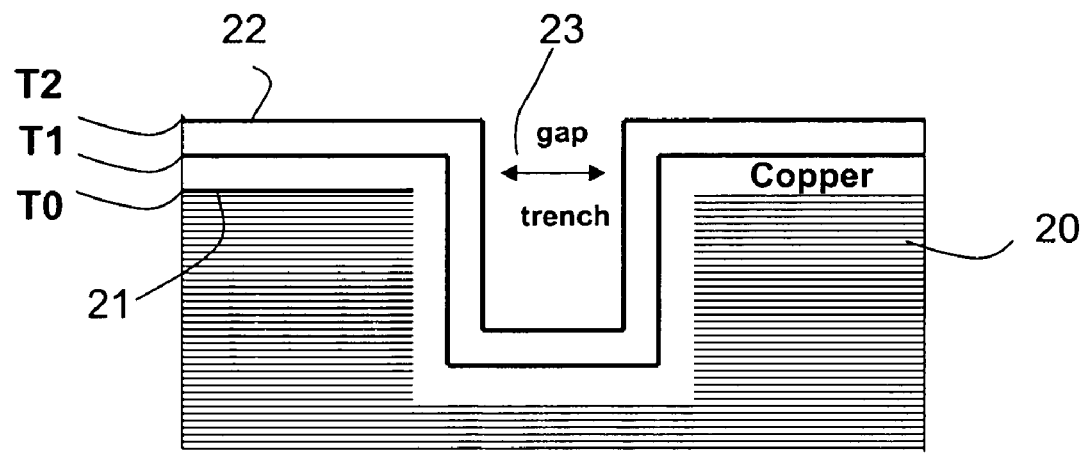
FIG. 5B illustrates the initial stages of copper deposition into the trench using ECD
Figure 6A:
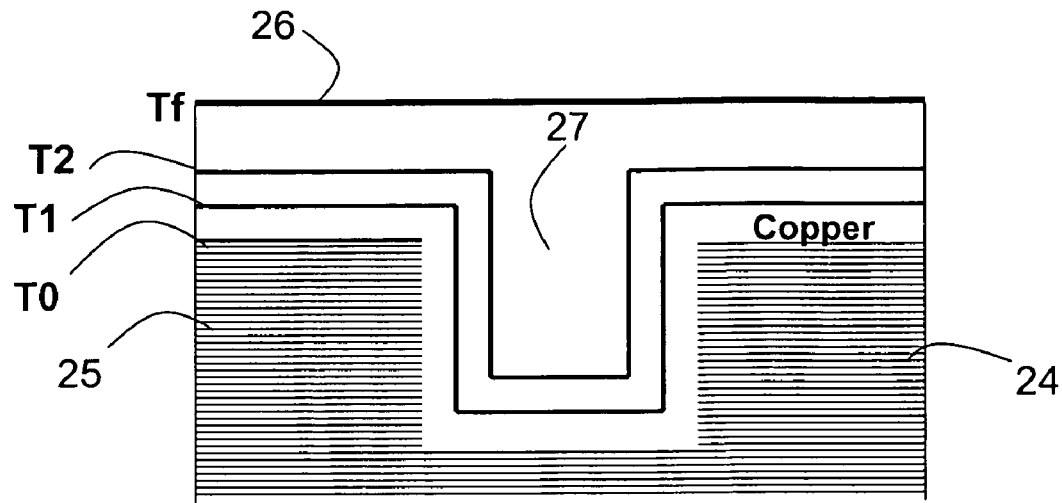
FIG. 6A illustrates the final stages of copper deposition into the trench
Figure 6B:
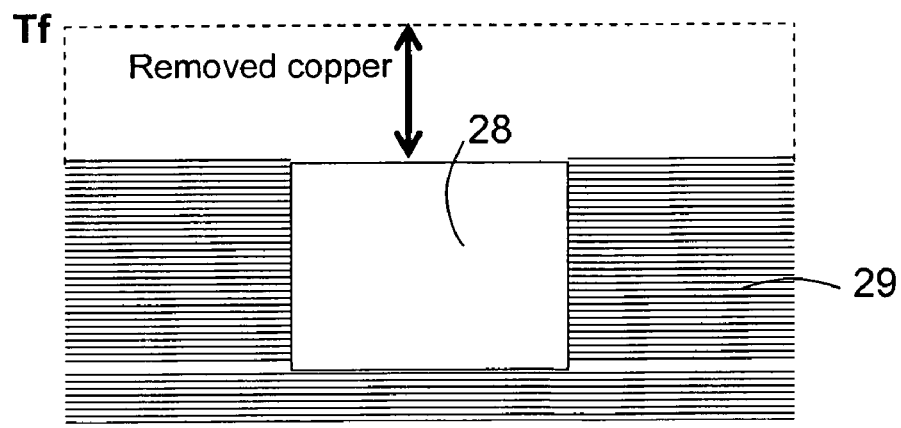
FIG. 6B illustrates the use of CMP to polish the copper overburden
Figure 14:
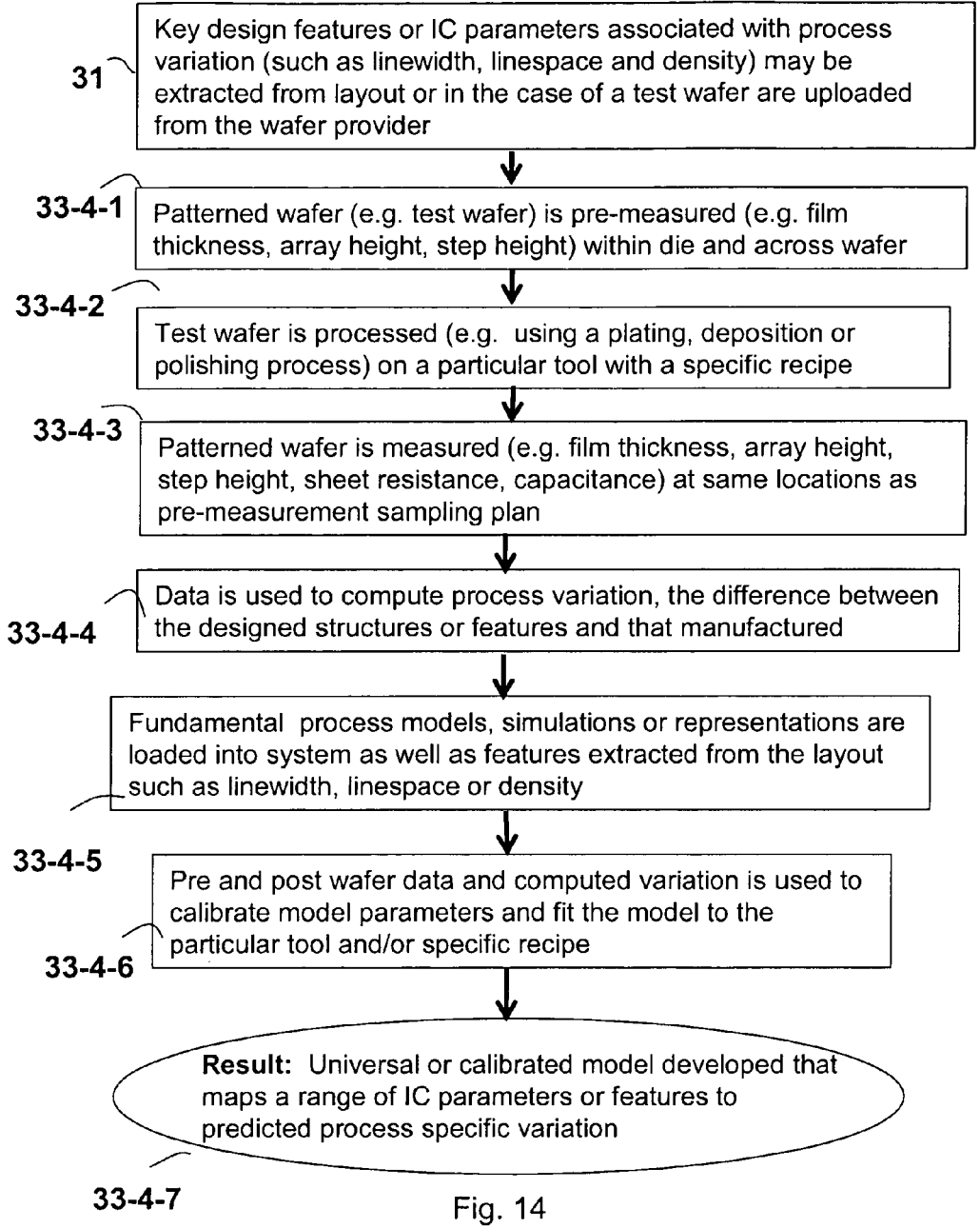
FIG. 14 describes the flow of steps used to calibrate a process step and generate a model.

FIG. 14 describes the steps involved in calibrating a process model to a particular tool or recipe. As described in FIGS. 7, 1, layout extraction parameters are computed or in the case of test wafers uploaded from the wafer provider. The second step, 33-4-1 pre-measures the wafer using metrology equipment. These measurements may include film thickness and profilometry scans to acquire array and step heights. The third step 33-4-2 processes the test wafer for the particular process or process flow that is to be characterized. Such processes or flows may include plating, deposition and/or polishing steps. The preferred method is to calibrate on individual processes and also calibrate on sections of the flow as a way to best capture any coupling of variation between subsequent process steps in a flow. It is also recommended to calibrate the model for different recipe parameters such as time. The processed wafers are measured, 34-3-3 at the same locations as the pre-measurements; such measurements may include film thickness, profilometry or electrical, and the variation for the given process may be characterized, 33-4-4. Process models or representations are uploaded in 33-4-5 and the pre and post measurements as well as computed variation may be used to calibrate or fit the model or representation to a particular tool and/or recipe or recipes. These models may be formulated and uploaded by the user or selected from a library of models on the dummy fill computer system. The pre and post measurements and computed process variation is used to fit the model or simulation parameters for the given tool and recipe, 33-4-6. The result, 33-4-7, is a process model calibrated to a particular tool and recipe or recipes. The result may also include a series of calibrated process models that can be used to simulate a process flow.

Figure 15:
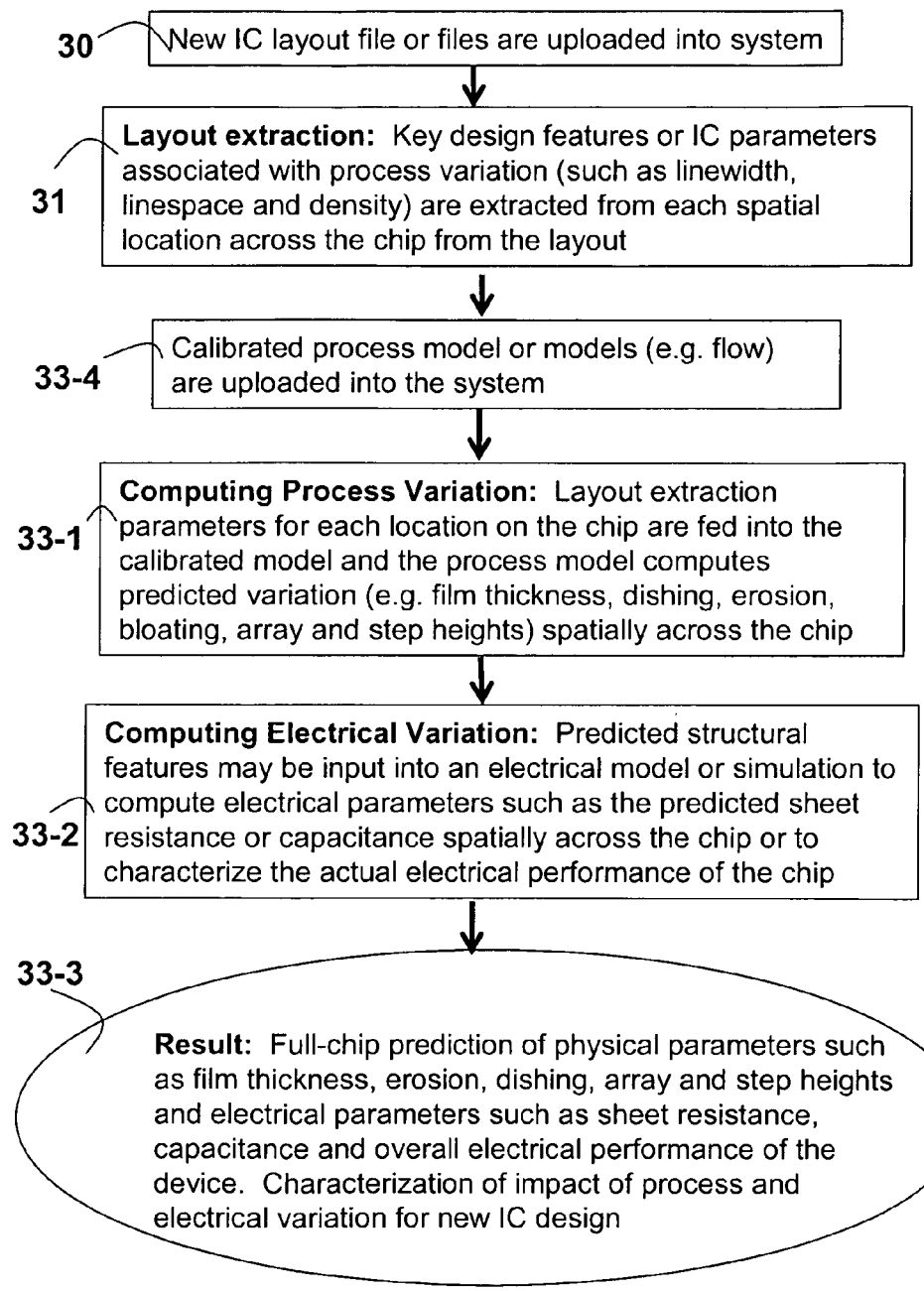
FIG. 15 describes the flow of steps used to generate a prediction using a calibrated model.

FIG. 15 describes the steps involved in using calibration models to predict the impact of process variation and subsequent variation in electrical parameters and performance. A new layout or set of layout files as well as desired IC features, geometries and design rule information are loaded into the system, 30. The second step performs layout extraction, 31, to extract a description or set of features relevant to process variation for a number of locations across the chip. One common approach is to discretize the layout into a number of grids and a structure density is computed for each grid element. However, our approach computes the effective linewidth and linespace for each grid element as well. The calibrated process models are uploaded or assembled to simulate processing, 33-4. The extracted layout parameters for each spatial location are fed into the model and the resulting process parameters are computed, such as film thickness, dishing, erosion, array and step heights, 33-1. The difference between the target and predicted IC parameters are used to compute the process variation. The predicted process parameters may also be fed into electrical models or simulations to characterize the electrical performance of the IC which when compared with the desired performance allows for the electrical variation to be computed, 33-2. Some of the electrical parameters that may be computed include variation in sheet resistance, resistance, capacitance, interconnect RC delay, voltage drop, drive current loss, dielectric constant or crosstalk noise.

Since this dummy fill algorithm is particularly suited for dummy fill adjustments to interconnect layers, interconnect metrics (R,C,L variation) are used as general metrics for all areas of the chip, as shown in the following table. Other critical areas may require simulating the circuit performance effects of adding dummy fill. For example, a metric for the signal delay variation may be imposed in addition to a percentage RC variation to ensure that timing constraints of the critical paths meet the circuit specifications. Similarly, clock skew and crosstalk noise simulations may be used to determine whether or not the circuit will function properly. This way, RC (or RLC) criteria can be used as a first pass estimate of where to add the dummy fill. Then the dummy fill placement can be fine tuned in the next iteration by selectively performing circuit simulations for specific signals or certain areas of the chip.

TABLE 1

Electrical performance metrics for dummy fill adjustment

| Performance Metric | Metric Type | Application |
| --- | --- | --- |
| Resistance (R) | Interconnect | ECD, oxide dummy fill |
| Capacitance (C) | Interconnect | ECD, oxide dummy fill, metal dummy fill |
| Inductance (L) | Interconnect | High frequencies (ECD, oxide & metal fill) |
| Signal Delay | Circuit | Routing, Buses, Critical Paths |
| Skew | Circuit | Clocks |
| Crosstalk Noise | Circuit | Low swing/noise sensitive circuits |

The result of models and simulations described in this section is a full-chip prediction of process and electrical parameters and performance for a new IC design, as well as prediction of how these parameters may improve as dummy fill is added, 33-3.

d. Dummy Fill Algorithm Cost Function

A cost function, 35, is used to measure how well an initial IC design or a given dummy fill scheme achieves the desired film thickness and electrical parameters.

While film thickness variation is a universal concern, electrical performance metrics may vary between technology generations and design groups. As described in section c., interconnect metrics (R,C,L variation) can be used as general metrics for performance in all areas of the chip. Other critical areas may require simulating the circuit performance effects of adding dummy fill. For example, a metric for the signal delay variation may be imposed in addition to a percentage RC variation to ensure that timing constraints of the critical paths meet the circuit specifications. Similarly, clock skew and crosstalk noise simulations may be used to determine whether or not the circuit will function properly. Similarly, voltage drop and drive current loss may also be used to determine the whether or not the circuit will function properly. Similarly, dielectric constant or effective dielectric constant may be used in conjunction with low-k materials to determine effects on capacitance. This way, RC (or RLC) criteria can be used as a first pass estimate of where to add the dummy fill. Then the dummy fill placement can be fine tuned in the next iteration by selectively performing circuit simulations for specific signals or certain areas of the chip.

The predicted or simulated electrical and film thickness parameters are verified against desired target parameters. This characterization of how well a particular dummy fill placement meets the desired film thickness and electrical performance specifications is normally performed using some form of cost function. A cost function can be as simple as a check to see if a particular film thickness non-uniformity threshold is exceeded or it could be as complex as a quadratic function of non-uniformity and undesirable electrical effects that are to be minimized in a feedback type system. In that a good dummy fill method uses process and electrical impact, a useful embodiment is a cost function and it minimizes the following parameters:

Thickness Non-uniformity=function of (LW, LS, density)
Electrical Performance=RC∥ Delay∥ Skew∥ Noise
Delay=function of (R, C, L, $R_{tr}$, $C_L$)
Skew function of (R, C, L, $R_{tr}$, $C_L$)
Noise=function of (R, $C_{coupling}/C_{total}$, L, $R_{tr}$, $T_r$, l)
Where:
R=interconnect resistance
C=interconnect capacitance
L=inductance
$R_{tr}$=driver resistance
$T_r$=signal rise time
$C_L$=load capacitance
$C_{coupling}$=intra-layer coupling capacitance
$C_{total}$=total capacitance (coupling+overlap+fringe)
l=interconnect length The cost is a quadratic error function U based on a weighted sum of process (film thickness) non-uniformity and electrical performance variation, where the electrical performance is taken as one or more of the following metrics: RC, delay, skew, noise.

$$Error_T = (T_{target} - T_{actual})$$

$$Error_{EP} = (EP_{target} - EP_{actual})$$

$$U = (Error_T^T \cdot K_1 \cdot Error_T) + (Error_{EP}^T \cdot K_2 \cdot Error_{EP})$$

where:
$T_{target}$=vector of desired film thickness measurements
$T_{actual}$=vector of actual or predicted film thickness measurements
$EP_{target}$=vector of desired electrical performance metrics
$EP_{actual}$=vector of actual or predicted electrical performance metrics
$Error_T$=column vector of film thickness errors
$Error_{EP}$=column vector of electrical performance metrics
U=quadratic error, a scalar value, to be minimized
$K_1$=Diagonal matrix with weights for 1 through q total film thickness measurements along the diagonal elements.

$$K_1 = \begin{bmatrix} w_{T1} & 0 & 0 \\ 0 & \ddots & 0 \\ 0 & 0 & w_{T_q} \end{bmatrix}$$

$K_2$=Diagonal matrix with weights for 1 through p total electrical performance metrics along the diagonal elements.

$$K_2 = \begin{bmatrix} w_{EP1} & 0 & 0 \\ 0 & \ddots & 0 \\ 0 & 0 & w_{EP_p} \end{bmatrix}$$

The cost may encompass each signal line or a section of the chip this way and the film thickness vectors and weighting matrices can be easily modified to provide the correct quadratic error to be minimized over the entire chip. (One way is to concatenate them into a large vector of film thickness and another as a large vector of electrical parameters; adjusting the weighting parameters appropriately). Another way is to have separate error functions U for different areas of the chip that are weighted using a planarization length kernel function. There is normally some tuning of the weighting parameters based upon those elements where the need to be minimized is greatest. This tuning may be automated or the user may be prompted for a weighting scheme.

e. Dummy Fill Sizing and Placement

Figure 16:
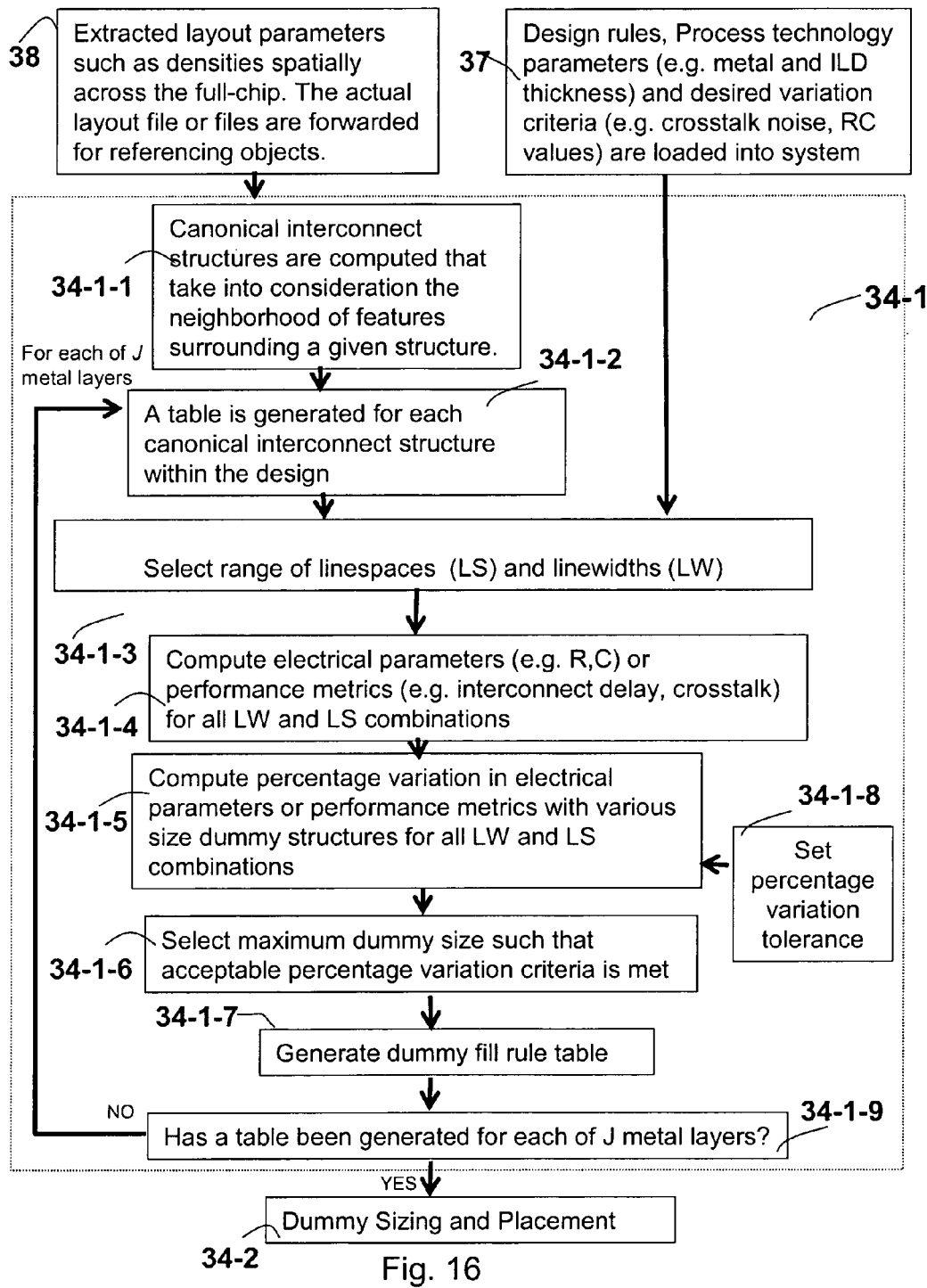
FIG. 16 describes the flow of steps used to generate dummy fill rules and tables FIG. 17 provides a sample dummy rule table, showing maximum dummy fill linewidth as a function of interconnect linewidth and linespace.

Although all the components in FIG. 7, have an impact on where dummy fill is placed, the actual decisions regarding the sizing and placement of dummy fill within the layout are performed in the component labeled as 34. Information about the process technology to be used is provided first, along with acceptable design variation criteria, to generate a set of metal and oxide dummy fill rules. A detailed flow diagram of the steps in formulating the dummy fill rules, 34-1 is provided in FIG. 16. The process technology information may include the nominal values of the metal thickness T, inter-layer dielectric (ILD) thickness H above and below the metal layer of interest, the dielectric constant ϵ, and conductivity ρ of the metal layer. The design criteria may include the acceptable percentage of tolerance in the interconnect RC delay and/or crosstalk noise. These parameters, 38, and the layout and extracted layout parameters, 37, are input into the dummy fill rule generation component, 34-1.

Canonical interconnect structures, 34-1-1, are computed where an object or class of objects is uniquely identified or standardized within a set of features such as capacitance, linewidth, linespace or density. A table is generated for each canonical interconnect structure found in the design, 34-1-2. In the following loop (34-1-2 to 34-1-9), dummy fill rules are then generated for the combinations of linewidth and linespace specified within a given range. This table is repeated for each of J total metal layers within the design. If the technology changes, a new rule table is generated with the modified technology and design parameters.

Dummy fill rule generation begins with selection of the range of linespaces and linewidths that span all the objects in a given layer, 34-1-3. The electrical parameters (e.g. resistance (R) and capacitance (C)) and/or performance metrics (e.g. interconnect delay, voltage drop, drive current loss, dielectric constant or crosstalk noise) for all the linewidth and linespace combinations are computed, 34-1-4. The percent variation in electrical parameters is then computed for a range of dummy fill structures and sizes for all of the linewidth and linespace combinations, 34-1-5. The maximum dummy size is selected, 34-1-6, that meets the percent variation tolerance levels, 34-1-8. Based upon all these computations the dummy rule table is generated for each metal layer in the design, 34-1-7. The flow continues until all metal layers are computed, 34-1-9.

A sample dummy rule table is provided in FIG. 17. Maximum dummy fill linewidth (or available width of fill region) as a function of interconnect linewidth and linespace is shown. Dummy fill rules are based on interconnect linewidth, width of available fill region and electrical criteria (e.g. maximum capacitance variation of 5% with the addition of fill). This sample rule table is for metal dummy fill. A new table must be generated for each metal layer and changes as a function of the technology parameters and performance metric/criteria.

Figure 18:
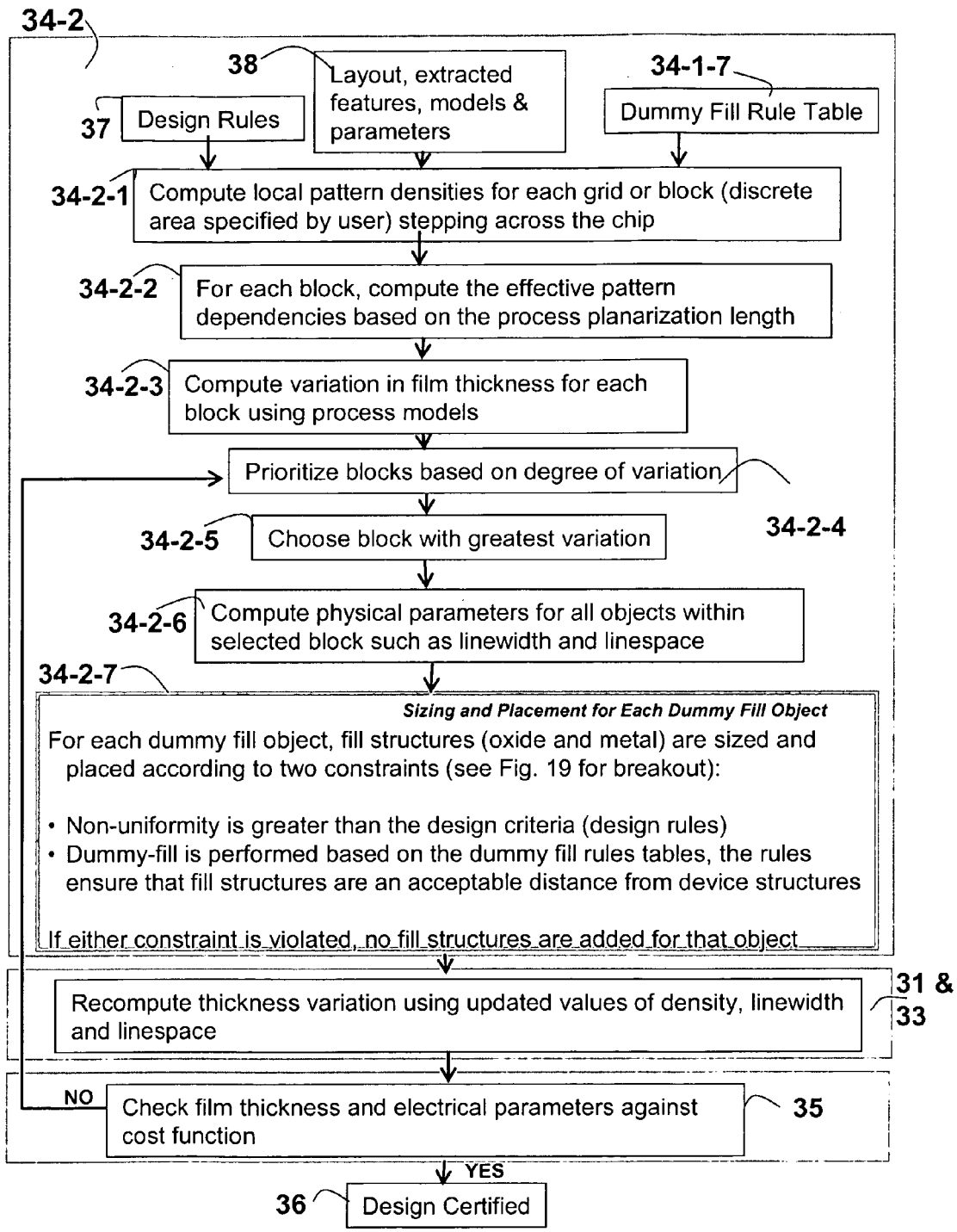
FIG. 18 describes the flow of steps used in sizing and placing dummy fill

The detailed flow diagram for the dummy fill sizing and placement algorithm operations, 34-2, is described in FIG. 18. The metal and oxide dummy fill algorithm then takes the fill rules, 34-1-7, design rules, 37, along with the layout file, extracted pattern densities, and the CMP process variation models, 38. The local pattern densities are extracted, 34-2-1, with the aid of computer-aided design (CAD) tools or function libraries that obtain information about the features within the layout. Object coordinates are obtained and the area of each object within the layout is computed. The pattern density is then computed for a small square window, typically of side length 40 μm to 100 μm. The effective pattern density is computed inside the dummy fill algorithm for each of the grids, also referred to here as a block, using an elliptical window set to the planarization length L, associated with a given process, 34-2-2. For each block, the predicted film thickness variation is computed, 34-2-3. Adaptations of this algorithm may also include the variation in electrical parameters as well. The block fill priority is assigned, 34-2-4, based on the predicted film thickness non-uniformity by the process model, which is a function of the effective pattern density, and in a damascene CMP process, also the linewidths and linespaces of the patterned structures.

In performing the dummy fill, a block is selected one at a time based on its priority, determined by the non-uniformity in film thickness within that block, 34-2-5. Other physical layout parameters such as the linewidths and linespaces are computed for all objects within the selected block, 34-2-6. This algorithm allows for some flexibility regarding the use of a single dummy object size and pattern or selection among various sizes and shapes depending upon dummy fill rules.

Once dummy fill has been placed in a given block, layout extraction is performed to update density, linewidth and linespace parameters, 31, which are used to compute process and electrical parameter variation is recomputed, 33. The cost function, 35, is used to verify that the dummy fill solution meets the desired criteria. If so, the next block is processed, 34-2-4, until all blocks are filled. The dummy fill algorithm operates on each level of interconnect generating dummy fill modifications in two layers, one for metal and the other for oxide, and continues for each level of interconnect. If the constraints are met for all the blocks, the design is certified, 36.

Figure 19:
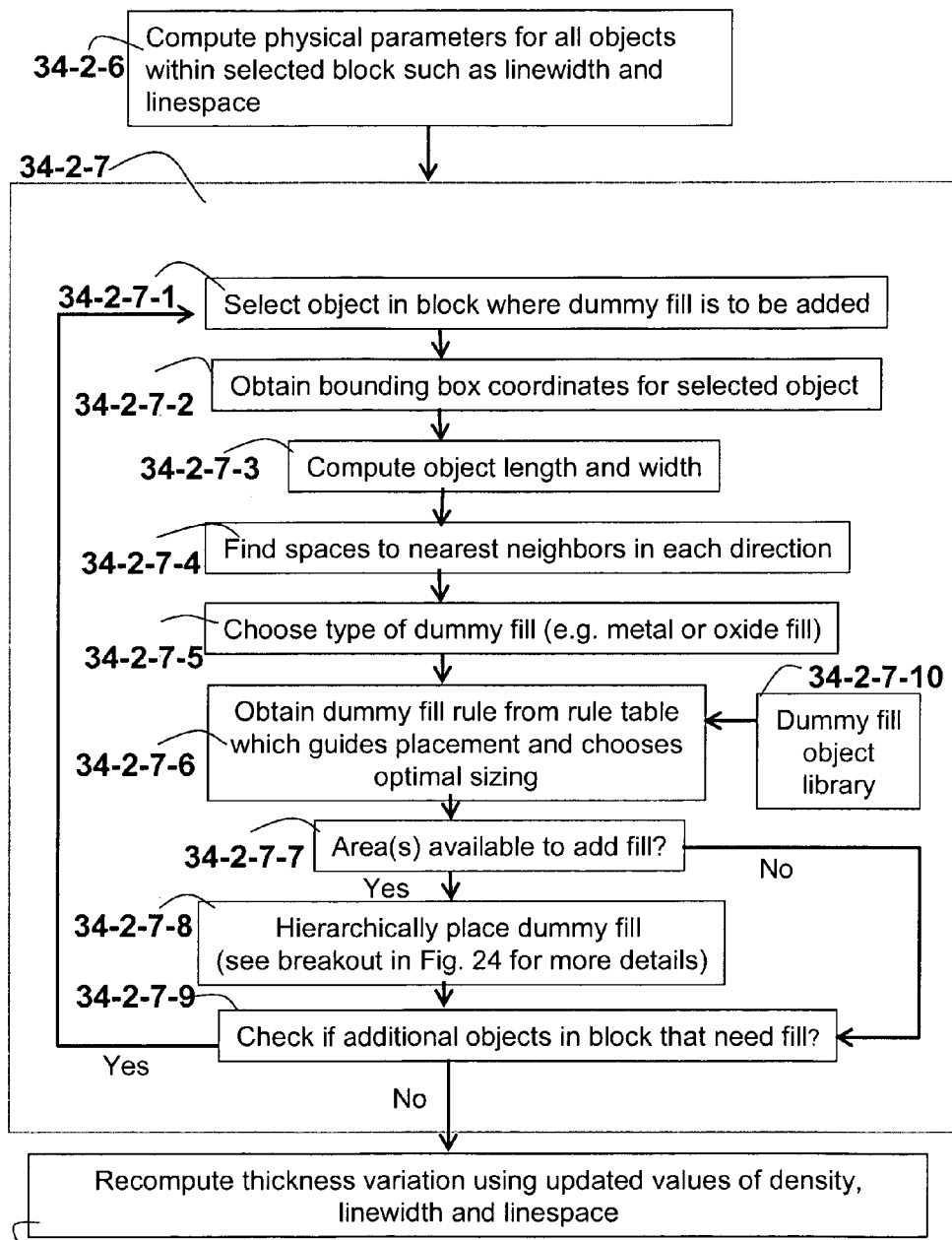
FIG. 19 describes the detailed flow of steps used in placing dummy fill objects within a block.

The dummy fill placement and sizing algorithm shown as 34-2-8 in FIG. 18 is described in detail, in FIG. 19. An object is selected in the block where dummy fill is to be added, 34-2-7-1. A CAD tool is used to obtain the bounding box coordinates for the selected object, 34-2-7-2. The object length and width is calculated, 34-2-7-3 and the distances to nearest neighbors in every direction are computed, 34-2-7-4. The type of dummy fill, for example metal or oxide, is computed for each object, 34-2-7-5.

For each object in the block, dummy structures are added, 34-2-7-6, where possible, in accordance with two constraints:

(1) Non-uniformity is greater than the design criteria
(2) Dummy fill is performed based on the dummy fill rules tables.

The dummy fill rules may also determine which dummy fill size and patterns are best for a particular object with regard to neighboring structures. FIG. 20 provides two tables with sample dummy fill rules to determine fill size and pattern. The first table, FIG. 20A, provides an example of a dummy rule table used to adjust dummy fill size. LW refers to linewidth, LS refers to linespace, R refers to resistance and C to capacitance. The second table, FIG. 20B, provides an example of a dummy rule table used to adjust dummy fill patterns.

A number of dummy fill object sizes and patterns may be assembled in a dummy fill library, 34-2-7-10, which can be modified as new IC technologies are designed. The user may also choose to override the algorithm selection of size and patterns and include the chosen parameters within the technology design rule submitted at the beginning of the algorithm.

The dummy fill rules check for available area near the selected object, keeping an acceptable distance from the object based on the metal dummy fill rule. The oxide dummy structures are added based on similar electrical rules. If either of these constraints is violated, no fill structures are added for that object, 34-2-7-7. If there are no violations then the dummy fill may be placed hierarchically as a more efficient method to adapt the layout, 34-2-7-8. If layout file size is not a concern, then each dummy fill object can be added directly to the layout, each with it's own coordinates. There is a check, 34-2-7-9, to see if there are any additional objects within the block and if so, this process continues. If there are any additional objects within the block, the next object is selected, 34-2-7-1, and the process continues until all objects within the block are processed.

Figure 21A:
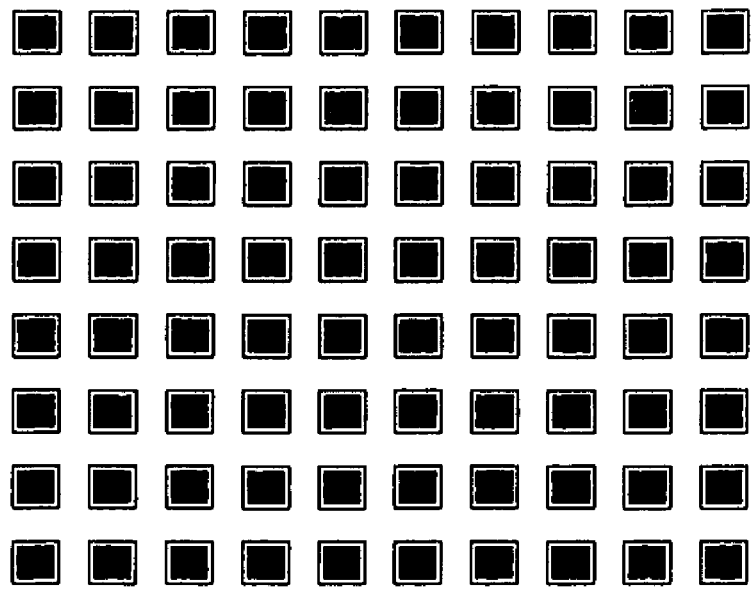
FIG. 21A illustrates a symmetric dummy fill pattern.
Figure 21B:
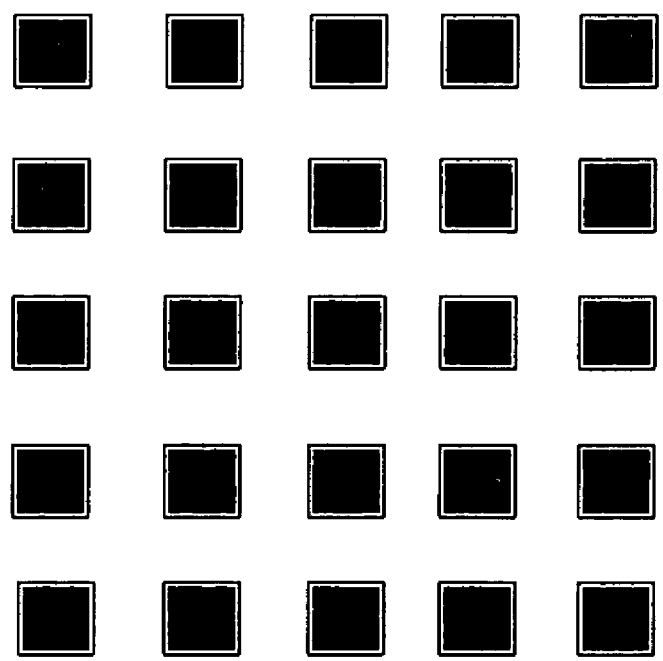
FIG. 21B illustrates how another symmetric dummy fill pattern can have the same effective density but use different fill object sizes.

FIG. 21 illustrates how two different dummy fill patterns, FIG. 21A and FIG. 21B, can have different fill object sizes but have similar density, thus illustrating how size provides another degree of freedom in dummy fill adjustment. As such, the dummy fill system may prompt the user to either select fill type (grounded or floating), size and shape of fill patterns from a library or alternatively, the sizing algorithm, automatically chooses the fill structure based upon dummy fill rules.

f. Hierarchical Dummy Fill Cells and Cell Placement

For process uniformity (e.g. CMP and ECD) as well as electrical effects (e.g. minimizing capacitive coupling across interconnect), dummy fill regions typically contain several small objects. The disadvantage of placing several dummy fill objects on a chip is that the file size can increase significantly. In our approach, instead of placing several small dummy fill objects across the chip, cells are of various sizes are created. This method requires the extra overhead of generating a cell library. However, once a cell library is generated, the only increase in file size resulting from the addition of dummy fill is in cell placement. Additionally, the overhead in generating the cell library can be reduced by creating the cells hierarchically. Although not required, this method is highly preferred for computational and storage efficiency. This method is performed during the placement of cells within the layout, 34-2.

Figure 22A:
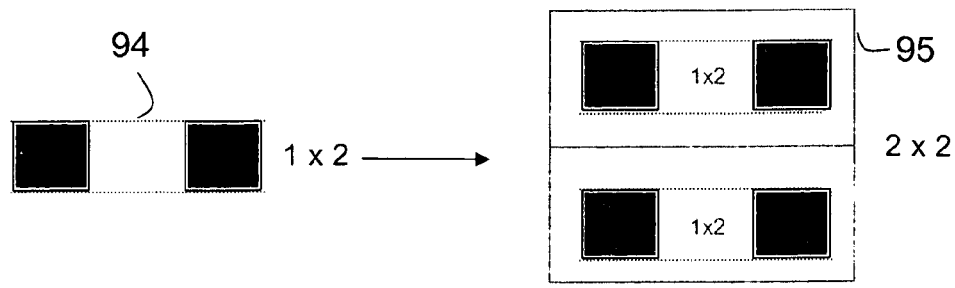
FIG. 22A illustrates how a 1×2 cell can be used to generate a 2×4 cell.
Figure 22B:
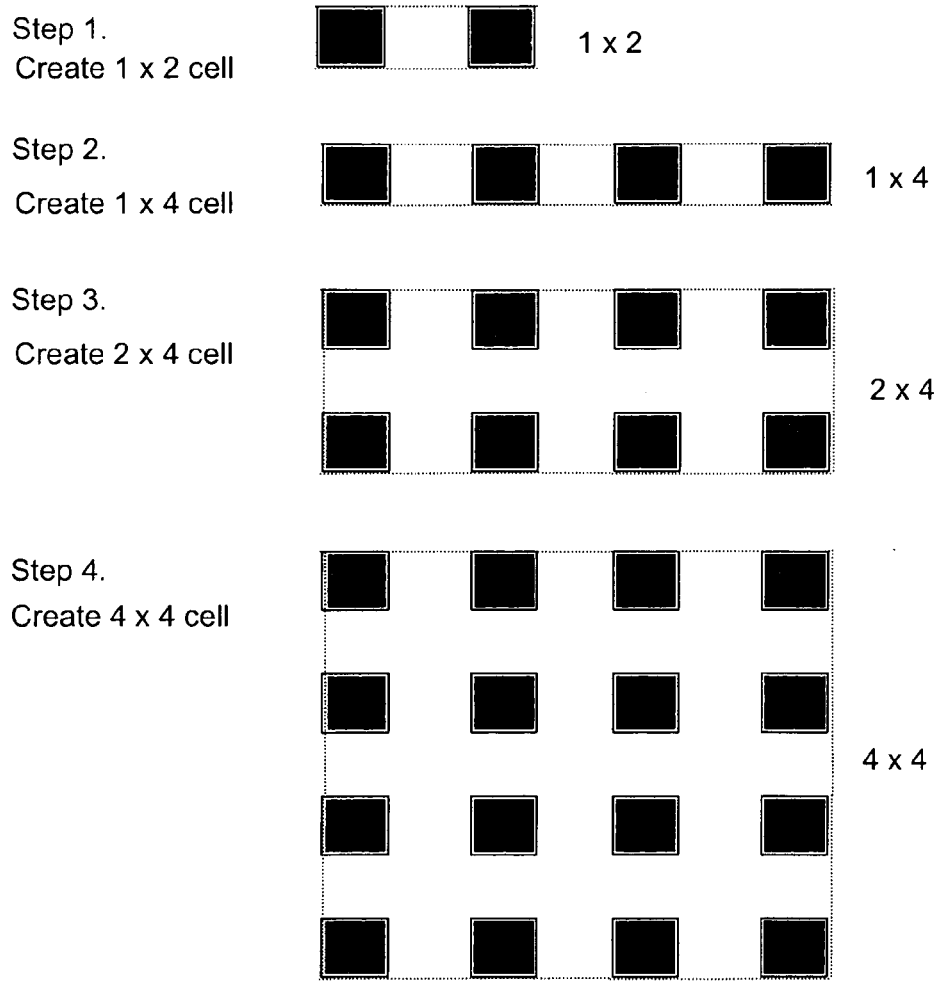
FIG. 22B illustrates how a 1×2 cell can be used to generate a 4×4 cell.

FIG. 22A shows a cell that contains two dummy fill objects of size 1 μm×1 μm separated by a space of 1 μm, 94. Since this cell has one row and two columns, it is referred to as a cell of size 1×2. To create a cell of size 2×2, another 1×2 cell is placed on top of the existing 1×2 cell to create a new cell, 95. Similarly, a cell of size 4×4 can be formed by the following steps (shown in FIG. 22B):

Step 1. Create a cell of size 1×2, 96

Step 2. Place another cell of size 1×2 to the right of the original to create a 1×4 cell Step 3. Place another cell of size 1×4 on top of the existing 1×4 cell (2×4 cell created)

Step 4. Place another cell of size 2×4 on top of existing 2×4 cell (4×4 cell created)

The cells are created hierarchically, so that starting with the top level cell (4×4 cell in this case) and descending though each level of the hierarchy results in smaller cells. This occurs until the final cell is reached, which contains the actual dummy fill structures. The advantage of this approach is that the file size used to store the dummy fill information is significantly reduced, especially in large empty areas where dummy fill is added. Rather than storing the coordinates of each dummy fill structure, only the cell size and cell coordinates need to be stored.

The hierarchical method results in a large reduction in file size, as well as a much faster time to read the file in a layout editor. For comparison, let one unit represent the amount of memory it takes to store the coordinates of a single dummy fill object or cell. The amount of memory required is about the same as for a single object since they both require the same amount of information:

For a single dummy fill object: bounding box coordinates $(x_1, y_1; x_2, y_2)$

For a cell: lower left coordinates $(x_1, y_1;$ cell size m×n)

If the cells are placed hierarchically, a 4×4 cell will require 8 units of information, as illustrated in FIG. 23. In this example, each 4×4 cell consists of two 2×4 cells, 96, each 2×4 cell consists of two 1×4 cells, 97, each 1×4 cell consists of two 1×2 cells, 98 and each 1×2 cell consists of two individual cells, 99. The total cells or objects required for the 4×4 cell is computed to be 8 units of information. For a non-hierarchical approach, the 16 individual cells would require 16 objects to describe the four bounding box coordinates for each individual cell.

In general, the amount of savings by using the hierarchical approach increases as the cell size (i.e. the area available for dummy fill) grows. The amount of storage required for an n×n cell without using the hierarchical approach is $n^2 \cdot 4$, where there are four coordinates used to specify each fill object. With the hierarchical method used in this dummy fill system, the amount of storage required is linear with n. In general, the amount of storage required for an m×n cell is always linear with n (or in), and is equal to 4 (the amount needed to represent a single cell) if m and n are powers of 2.

Figure 24:
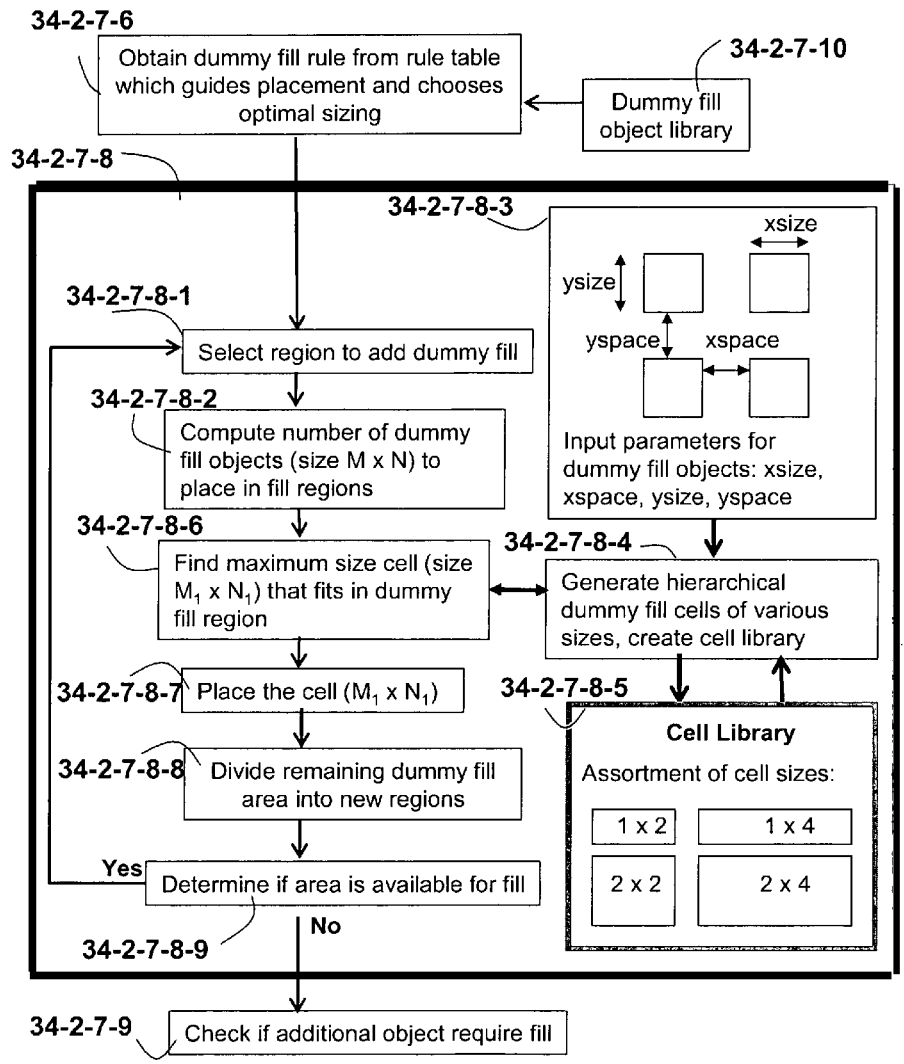
FIG. 24 describes the flow of steps used to create a cell hierarchy.

A flow diagram describing step-by-step details of the aggregation and placement of hierarchical dummy fill cells is provided in FIG. 24. The dummy fill rule table, 44-2-7-6 and fill object library, 34-2-7-10, are input into the placement algorithm. Each dummy fill region is selected, 34-2-7-8-1, and a computation is performed to determine the number of dummy fill objects of a given size that can be placed within the fill region, 34-2-7-8-2. The input parameters, 34-2-7-8-3, that define dummy fill parameters are used to generate, 34-2-7-8-4, a dummy fill cell library, 34-2-7-8-5, of various size cells made available to the cell placement algorithm, 34-2-7-8-6, that selects the largest size cell that fills the selected region and places it, 34-2-7-8-7. The remaining dummy fill area is divided into new regions, 34-2-7-8-8, and the algorithm determines if there is area still available for fill, 34-2-7-8-9. If yes, then a new region is selected, 34-2-7-8-1, and the cell placement process repeated. If no, then dummy fill cell placement is complete and a check is done if additional objects require fill, 34-2-7-9, FIG. 19.

g. Applications

The dummy fill methods described in this process are most applicable to polishing and electrochemical deposition processes where maintaining a certain level of film thickness uniformity is critical.

Dummy fill insertion may be used in conjunction with damascene process flows to improve film thickness uniformity for bulk copper fill using electrochemical deposition (ECD) and chemical mechanical polishing (CMP) where the two processes are used together during the creation of one or more interconnect levels. Pattern dependent models of ECD and CMP may be used to characterize multi-level effects between adjacent interconnect levels. This application to damascene process flows may be used over a network (internet, extranet or intranet) or as a web service to provide any of the following functionality:

layout extraction,
pattern dependent model calibration and prediction,
dummy fill sizing and placement into IC designs,
film thickness uniformity optimization and
electrical impact minimization with the intent to improve film thickness uniformity or electrical performance for either a ECD or CMP process or a process flow that includes both.

In the application to damascene process flows, ECD and CMP process steps are calibrated using the methods illustrated in FIG. 14. A new IC layout is extracted using the steps and flow shown in FIG. 9 and described in section b. Calibration occurs as described in FIG. 14 for each process. The calibrated models are assembled as a process flow and used to predict the step-by-step and final film thickness uniformity using the steps described in FIG. 15 and in section c. The results are examined in comparison with desired film thickness and electrical properties using either a table-lookup and threshold check or using a cost function, as described in section d. The dummy fill algorithm is applied using the steps shown in FIG. 16 through FIG. 24 and described in sections e. and f. This approach could be used to add dummy fill for each level, separately, to minimize film thickness non-uniformity or variation in electrical parameters such as resistance, sheet resistance, voltage drop, drive current loss, dielectric constant or capacitance. This approach could also be used with multi-level models, that include interaction between layers, to generate a single dummy fill strategy for multiple interconnect levels.

For 130 nm, 100 nm and 65 nm technology nodes, dummy fill methods may also be applied to new processes to better enable process integration and improve film thickness uniformity. Most conventional bulk copper fill is done using electrochemical deposition where various chemical schemes that use additives, such as accelerators, leveler or suppressors, are used to improve planarity of metal film. Equipment makers are also looking to mechanical approaches to improve uniformity. NuTool has proposed such an approach that rotates the wafer and uses a pad to introduce the electroplating solution [patents 6,7 & 8]. An advantage of this contact plating technology is that the plated Cu film may be both locally and globally planarized. Another advantage is that this approach results in a thinner overburden of Cu that reduces the amount of CMP required in the next process step.

Dummy fill materials may be used in conjunction with an electrochemical mechanical deposition (ECMD) process to improve film thickness uniformity across the full-chip. Dummy fill methods may be used with ECMD processes, including that described in [patent 6], by calibrating a full-chip ECMD model, using the flow described in FIG. 14, and inserting the model into the process flow, 33-1, to acquire full-chip predictions, FIG. 15. Improvements in film thickness uniformity, dishing and erosion could be achieved using the dummy fill methodology with an ECMD model developed by NuTool [patents 6,7 & 8], internally or by some other third party.

This application may utilize network (internet, extranet or intranet) based applications and web services to provide any of the following functionality:
 layout extraction,
 pattern dependent model calibration and prediction,
 dummy fill sizing and placement into IC designs,
 film thickness uniformity optimization and
 electrical performance optimization with the intent to improve film thickness uniformity for ECMD processes.

There are several challenges for introducing low-k dielectrics into a damascene process flow. It not only difficult to create a quality low-k film but also to maintain the dielectric constant after all the integration steps such as etch stop layers and barrier caps on copper and CMP stop layers. Many low-k yield problems are related to copper CMP where the softness of the low-k films results in CMP damage, dishing and erosion and subsequent electrical defects.

Dummy fill materials may be inserted in low-k films to adapt structural properties of these films with the intent of achieving a desired effective dielectric constant and reducing capacitance spatially across the full-chip when integrated into an interconnect process flow. Pattern dependencies may be characterized relative to changes in the effective dielectric constant (including the use of wafer-state models and electrical parameters). Test wafers may be used to develop full-chip models to predict variation in effective dielectric constant as a function of film thickness uniformity, dishing or erosion. Characterizations of pattern dependencies may be used to automatically add dummy fill directly into low-k films to minimize the variation in effective dielectric constant when low-k materials are used in interconnect levels. This application may utilize network (internet, extranet or intranet) based applications or access and use web services to provide or integrate any of the following functionality:
 layout extraction,
 pattern dependent model calibration and prediction,
 dummy fill sizing and placement into IC designs,
 film thickness uniformity optimization and
 electrical performance optimization with the intent to improve the structural properties of low-k films and the development and integration of process steps using low-k dielectric films.

Figure 25:
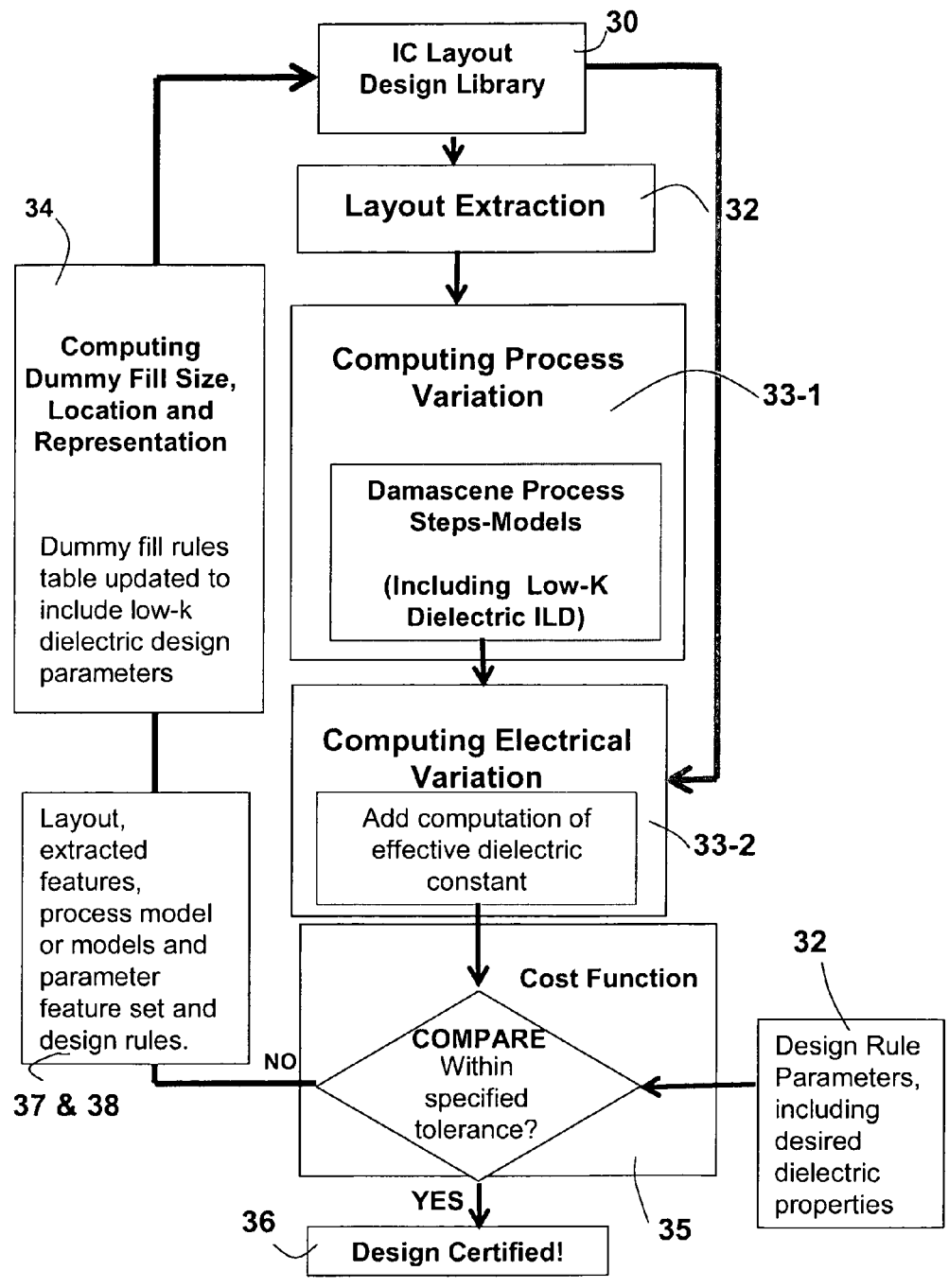
FIG. 25 describes modifications to the dummy fill method described in FIG. 7 to use dummy fill methods with low-k dielectric films.

This application may be used in conjunction with the dummy fill method to alter the physical, structural and electrical properties of low-k dielectric films to facilitate planarization using CMP, as performed in damascene processes and as illustrated in FIG. 25. The steps for introducing low-k films into a process flow are very similar to the general method described in FIG. 7. This application would require the calibration, 34, of models for ECD or ECMD and CMP for use with low-k dielectric films, as outlined in FIG. 14. This application also requires adapting the electrical models, 33-2, to include computation of the variation in the effective dielectric constant across the chip. The desired effective dielectric constant data along with other design rule parameters, 32, could be input into the cost function to direct dummy fill strategies that optimize the electrical properties of the low-k film, while improving film thickness uniformity at the conclusion of the damascene process.

h. Construction and Operation

The components that comprise the method are constructed in software (e.g. Java, Tcl, Basic, SQL) and modularized such that the method may or may not use all the components in the placement of dummy fill. For example, the dummy fill library may consist of only one type of dummy fill object and the automated dummy fill algorithm may not require an electrical model or simulation to optimally place dummy fill with regard to reducing process variation. The following descriptions will attempt to provide the general computational framework for the dummy fill methods.

Figure 26:
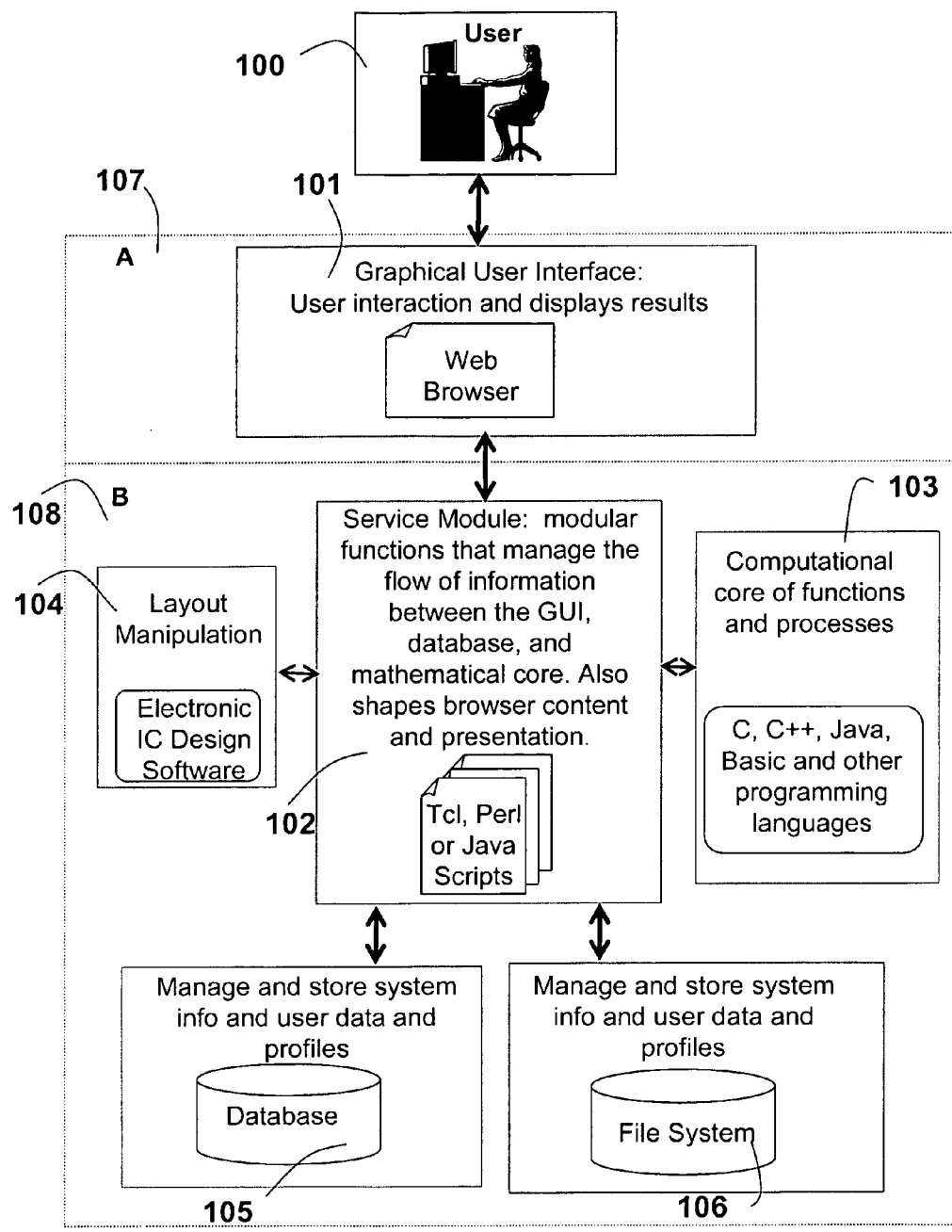
FIG. 26 illustrates the computation architecture used to implement the dummy fill methods, also referred to as the dummy fill system.

FIG. 26 provides the preferred software architecture used to construct the dummy fill method and is described in the following paragraphs. The user, 100, communicates to the system through a graphical user interface (GUI) 101, such as a web browser. The GUI, 101, allows the user to choose and upload electronic layout design files into the dummy fill system.

In general the GUI, as defined and used throughout this section, allows the user to choose, upload or transfer from another form of electronic media, the desired design rules and electrical performance for the particular device described by the design files. The user may also use the interface to select process and electrical models from a server or transfer or load models from another electronic media source or computer. The user may also use the interface to select dummy fill shapes, sizes and patterns from a dummy fill object library residing on the server or transfer or load models from another electronic media source or computer. The user may also use the interface to review the results of dummy fill adjustments to the layout and/or view the resulting full-chip layout spatial densities, predicted process film thickness and/or electrical parameters. These results may be in the form of:
 histograms and other statistical plots,
 full-chip images of wafer-state or electrical parameters at some point in time,
 movies of full-chip film thickness, dishing, erosion progression during a process step or flow,
 movies of full-chip electrical parameter variation such as sheet resistance and capacitance,
 and tables of values.

The GUI 101 communicates with a series of software components, services or functions 102 (referred to here as the service module) that manage the flow of information throughout the system to the database, 105, file system, 105, and computational core processes, 103, as well. The services, 102, are modular in nature and serve to initiate the computational core processes, 103, that execute portions of the algorithm and to assemble and format the content for display in the GUI. Useful embodiments of these components are as Java or Tcl scripts which enable easier interaction with the database using embedded SQL code and with the GUI using HTML, XML or dynamic HTML interpretation. These components also allow the ability to initiate mathematical processes that perform the computation necessary to determine the correct placement of dummy fill within the layout.

The service model, 102, communicates with the computational core of processes and functions, 103, that execute the dummy fill algorithms and heavy computational processes such as the process and electrical models and simulations. This core does also does the effective pattern density computation. This communication may include instructions, data, model parameters, prediction results in tabular, image or movie forms and pointers to files in the file system.

The service module, 102, also communicates with electronic IC design software, 104, to manipulate layout information such as the location and coordinates of design objects and determine where to place the dummy fill cells.

The database, 105, communicates with the service module, 102, via SQL commands to manage system data such as dummy fill library objects, user profiles that specify permissions and preferred content and presentation, user data which may include layout extraction data, prior layout design files, model parameters for particular tools and processes and full-chip prediction results such as surface topology, resistance and capacitance. Examples of databases that may be used include Oracle, Informix, Access, SQL Server and FoxPro.

The file system, 106, communicates with all the components 101, 102, 103, 104 and 105 to retrieve and store information saved as files.

If the functionality shown in boxes A, 107, and B, 108, resides on one computer then the system is configured as stand-alone. If A and B reside on different computers and communicate across a network, the system is normally considered a client-server configuration.

Figure 27A:
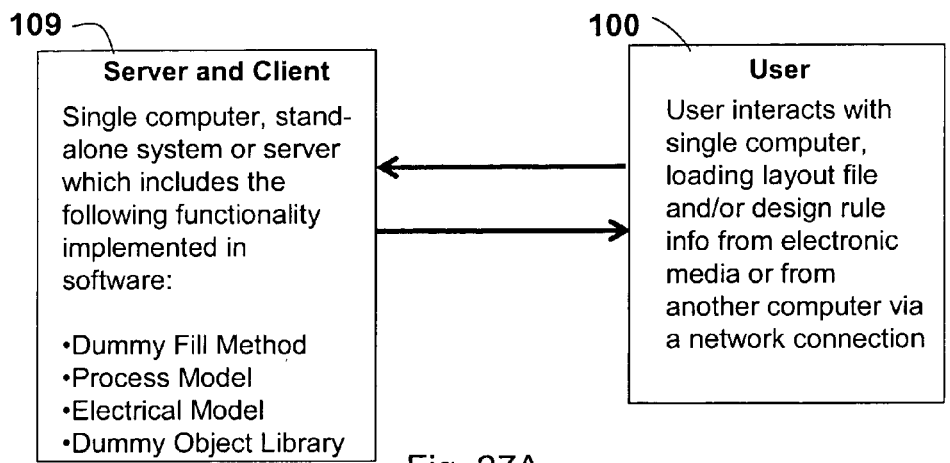
FIG. 27A illustrates a stand-alone implementation where the dummy fill system resides on one computer.

The intent in this section is to not describe all possible instantiations of the dummy fill method but provide a few preferred operational frameworks. There are three basic computational frameworks described in this section that constitute preferred methods of operation and delivery of the functionality based upon a user's needs. The first framework presented is a stand-alone configuration, shown in FIG. 27A, where all the components (101–106 of FIG. 13) reside in 109 and are accessed from a single computer. The second framework is a client-server configuration, shown in FIG. 27B, where the GUI (101 of FIG. 37) resides on a client computer which accesses, via a network, 111, the other components (102–106) residing on a server or multiple servers, a server farm, 110. The communication could be done via internet, intranet or extranet networks, 111, and the server may serve one or more clients or users.

Figure 28:
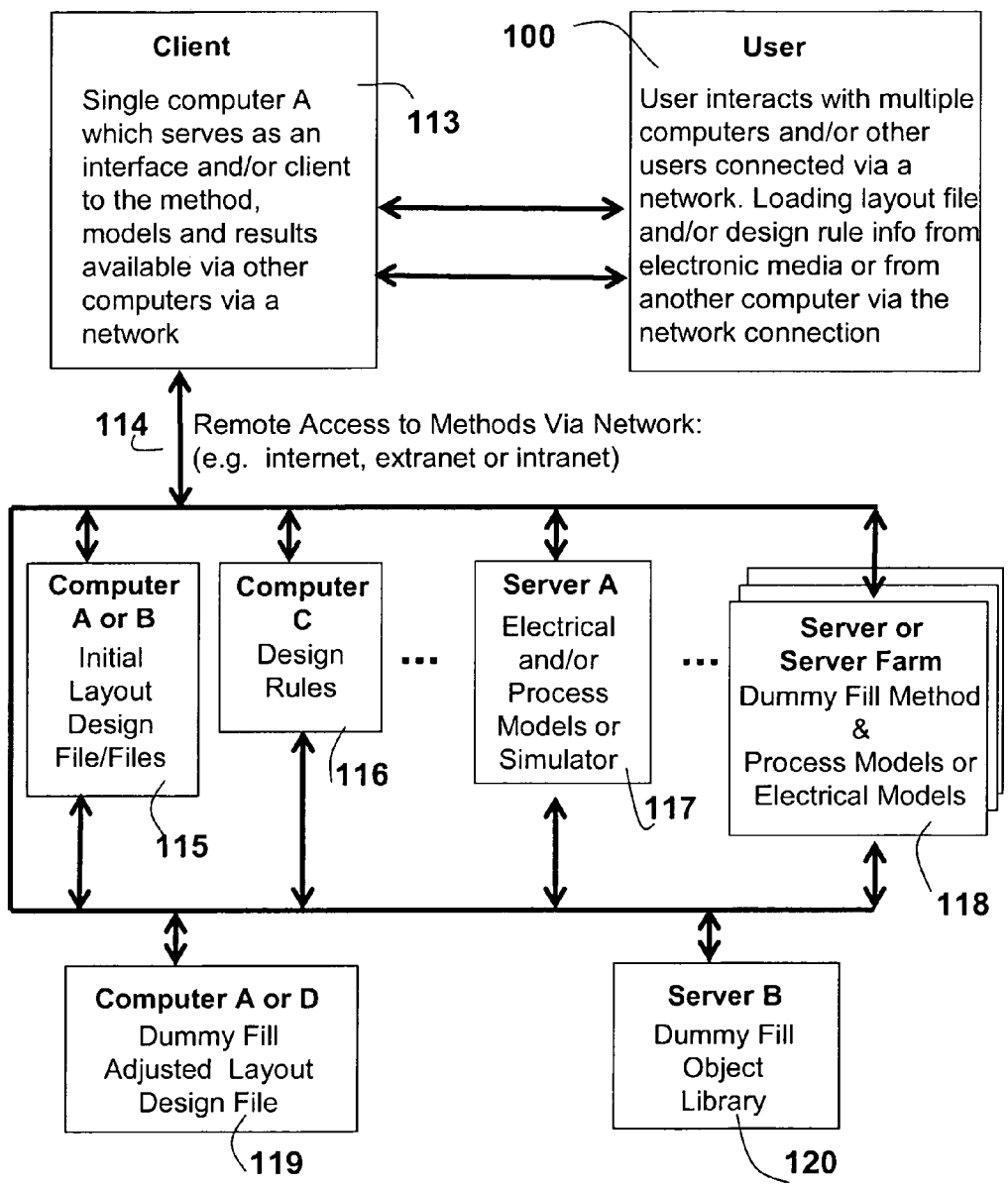
FIG. 28 illustrates the extension of the client-server implementation to include external components across a network.

The third framework, FIG. 28, is an extension of the client-server model that includes communication via a network, 114, with additional computers that may contain one of more components (115–120) of the system. For example, a design house may utilize the dummy fill method via the server, 118, but remotely utilize a separate computer which houses process models or model parameters, 117, that are provided by a foundry where manufacturing may be outsourced. This framework also includes the use of third-party electrical models and simulations, 117, linked to the dummy fill method residing on a server or server farm, ref, 118, via a network connection, 114.

Figure 27B:
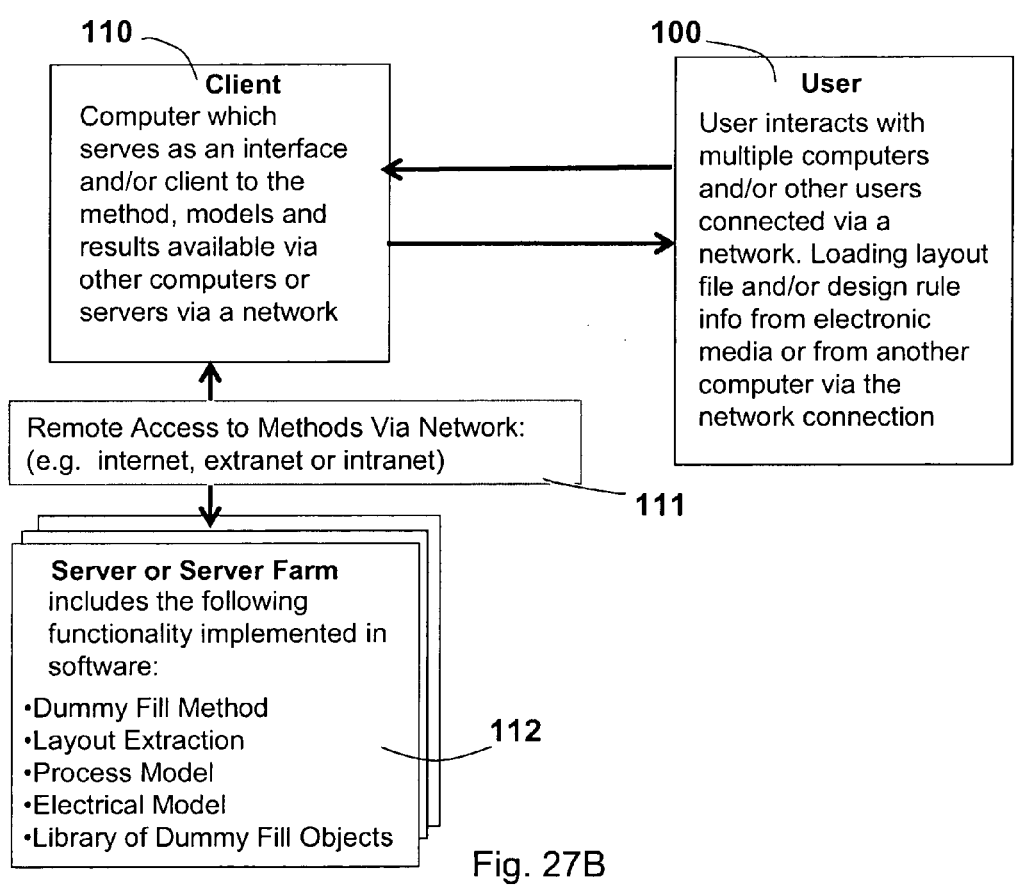
FIG. 27B illustrates a client-server implementation of the dummy fill system.

To scale the dummy fill methods to serve a large client base located throughout the world, dummy fill services may be delivered via the web using the client-server framework described in FIGS. 27B and 28. In this operational framework, the dummy fill methods and functionality are developed as web services that are accessible through any web browser, located anywhere in the world that has internet access.

Figure 29:
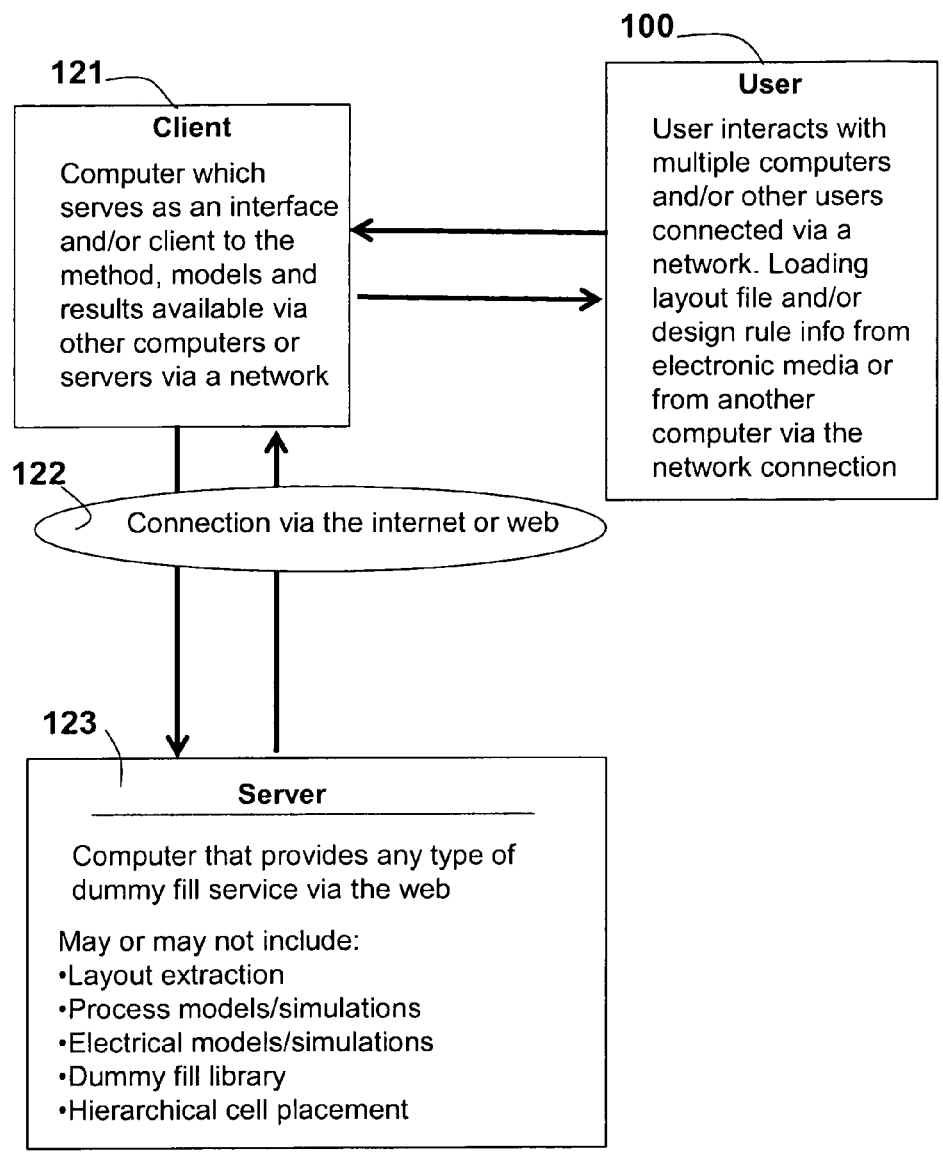
FIG. 29 illustrates a general client-server dummy fill framework that uses the internet, extranet or intranet.

The general architecture, shown in FIG. 29, may be used with any dummy fill approach where dummy fill services are provided via the web. In this framework the user, 100, through a client computer, 121, accesses a server computer or server farm, 123, which performs the dummy fill operation over a network (e.g. intranet, extranet or internet), 122. Using the web or a network connection, 122, the client, 121, uploads or transfers the layout file or files to the server, 123, and may also transfer design rule and other preferences to be used by the dummy fill system on the server. The dummy fill system, 123, processes the layout information, places dummy fill objects and returns the layout file to the user, 100, via the web or network connection, 122.

A useful embodiment of this framework is to provide the dummy fill functionality in the form of web services. A web service is an object that exists as a function, content or a process that may interact with a web-browser, database or other services. The web service architecture is preferred in that it enables each dummy fill function and the content that is returned to the user to be modularly created and assembled and tailored to the user's needs and it allows the method to be more easily scaled to a larger user base. Another benefit is that web services provided by third-parties may be automatically accessed and integrated into the dummy fill web application. Another benefit of this embodiment is that development of software-based services via the web allows the dummy fill algorithms to be scaled and supported efficiently for world wide use.

The preferred form of these web services is as Java, Tcl or SQL based software programs that communicate with a SQL enabled database and a core of mathematical programs to manipulate the layout information and determine the proper dummy fill functions. These services specify or publish what input parameters are required, which are optional and what parameters and data are provided in return. The system integrates these services according to the user's permissions and the functionality required.

Figure 30:
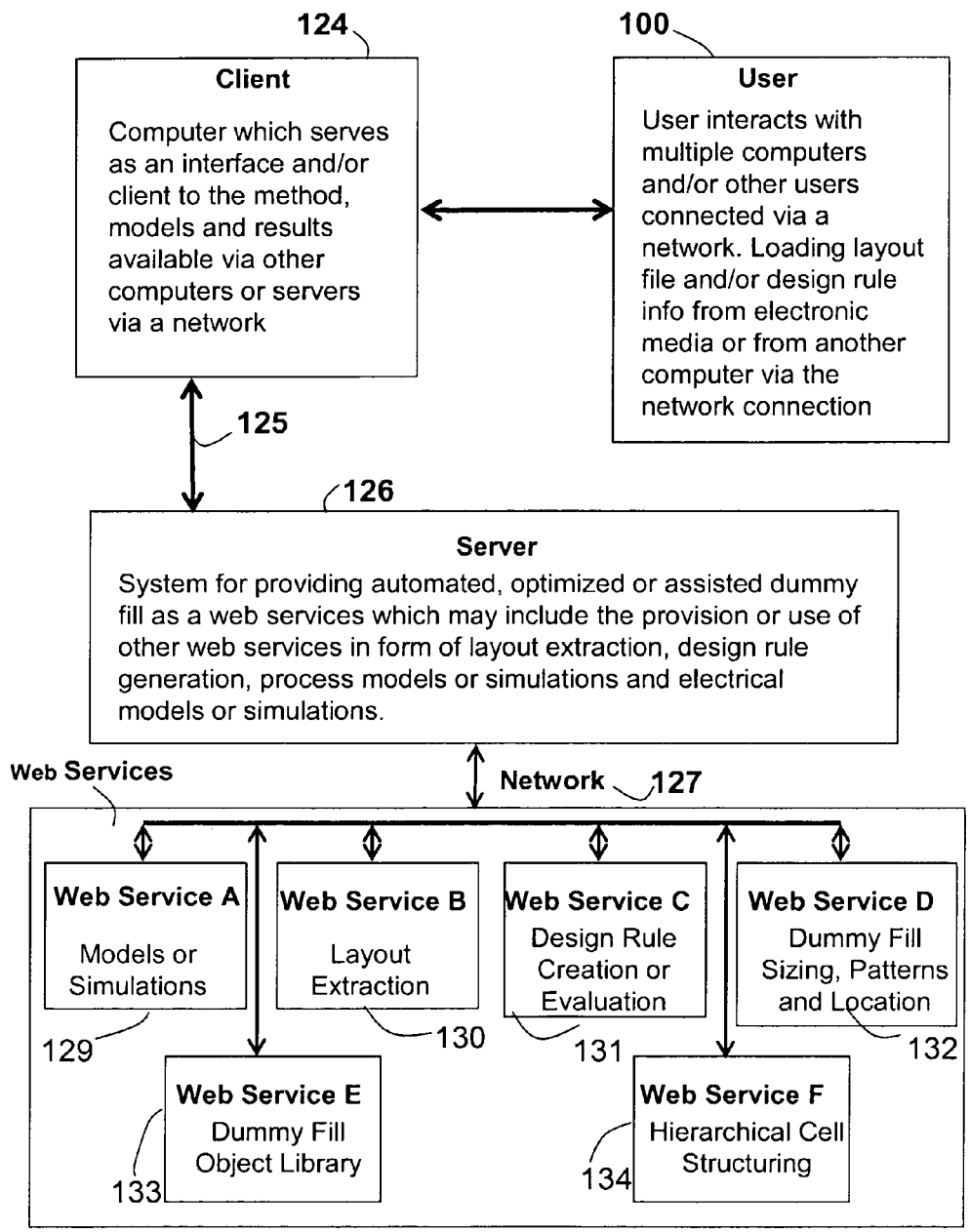
FIG. 30 illustrates the preferred computational framework for the dummy fill system using a client-server framework with web services.

A useful embodiment for dummy fill system is shown in FIG. 30. The user, 100, working through a web browser based GUI on a local client, 124, communicates to the server, 126, via a network (e.g. internet, intranet, extranet), 125. Functionality provided by the dummy fill methods exists as modular and configurable web services, 128. The dummy fill web services, 128, may reside in the service module, shown in 102 of FIG. 26, and may be built on a web application platform provided by a third-party, such as those provided by IBM, Microsoft, ARSDigita or BEA. The server, 127, will likely include web services to manage user, 100, and the user's company profiles and permissions to tailor the content and functionality available to the particular user logged in. Some of the web services may be assembled from elsewhere across a network and may be published services by third-parties, that are assembled by a central web server or server farm, 127. Some of the components that may exist as web services are process models and simulations, electrical models and simulations (129), layout extraction (130), hierarchical cell placement (134), dummy fill sizing and placement (132), dummy fill object libraries (133) and design rule creation, modification or publication (131). The server, 126, allows the user, 100, to build their own web based dummy fill application tailored to a particular problem or use, through the use of a wizard that prompts the user with questions and then assembles the proper services from 128. Such uses of these services, 128, may also be provided over trial-periods at a discount or no-cost fee.

Figure 31:
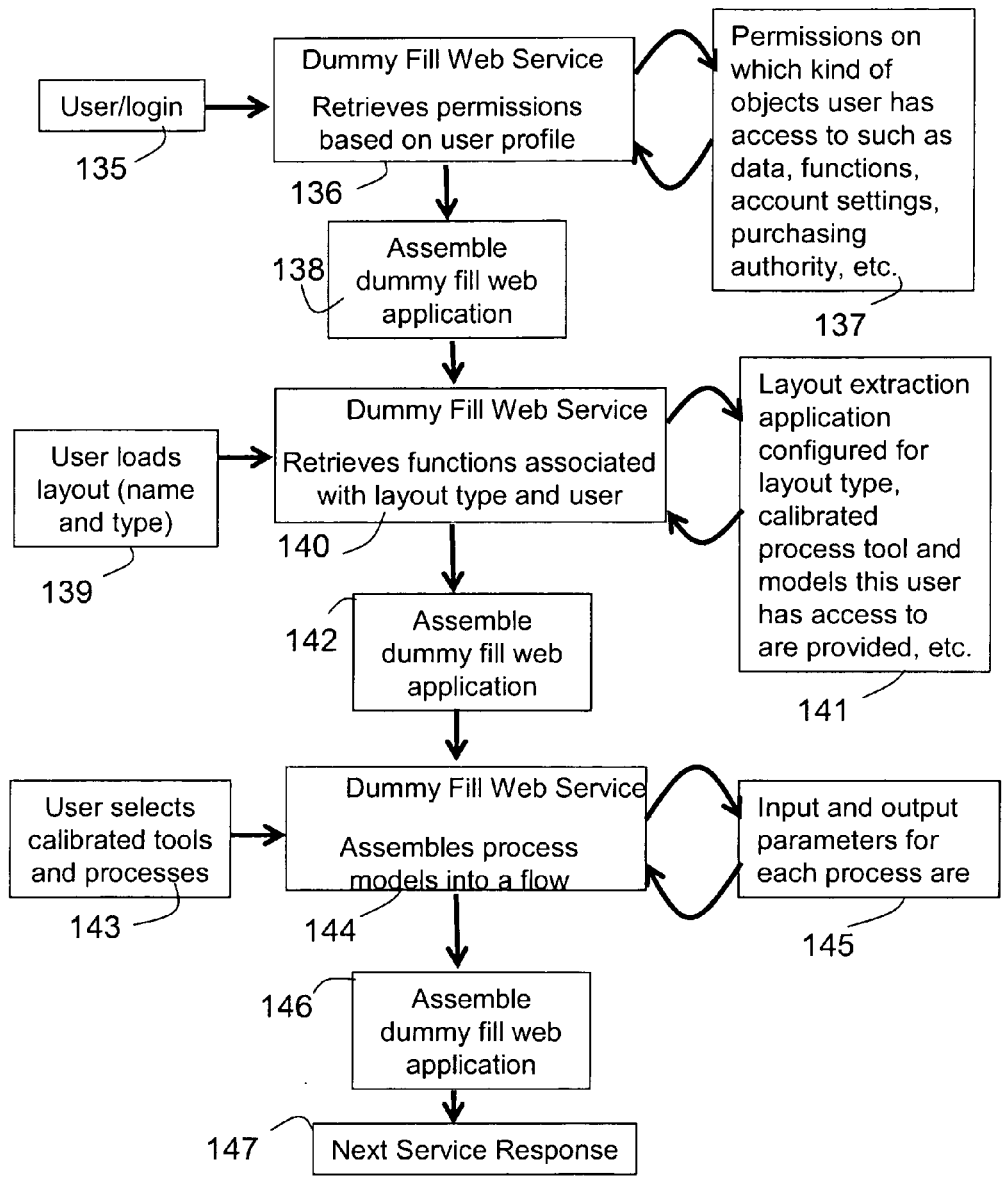
FIG. 31 illustrates how web services may be used to dynamically build a dummy fill web applications tailored to a particular user.

A meta-service or complete web-based application can be assembled from a number of smaller services (or functions) according to the user's needs. This is why it is often beneficial to create very modular web services that promote flexibility in the type of dummy fill application that is assembled. FIG. 31 illustrates how the service module in 102, may be used to tailor, configure and assemble a web-based dummy fill web application. A user from a particular company logs in, 135, and a service script, 136, checks to see what permissions, 137, this user has with regard to objects within the system such as: layout, tool and measurement data, dummy fill functions, purchasing authority. These permissions are used to initiate creation of the dummy fill web application, 138. The service module continually acts on input from the user, as they use the system. If that same user loads a particular layout, 139, the service script, 140, retrieves all the functions and objects associated with that type of layout as well as the calibrated process tool and models and recipes this user may have access to, 141. The service script assembles links to these permitted objects into the dummy fill web application, 142. The same user may select one or more of those process tools and recipes to create a process flow, 143. The service script, 144, then retrieves the correct calibrated models and assembles those models into a process flow, 145. The process flow then becomes part of the dummy fill web application, 146. This interaction continues as the user submits requests to the server and a service responds, 147.

Figure 32:
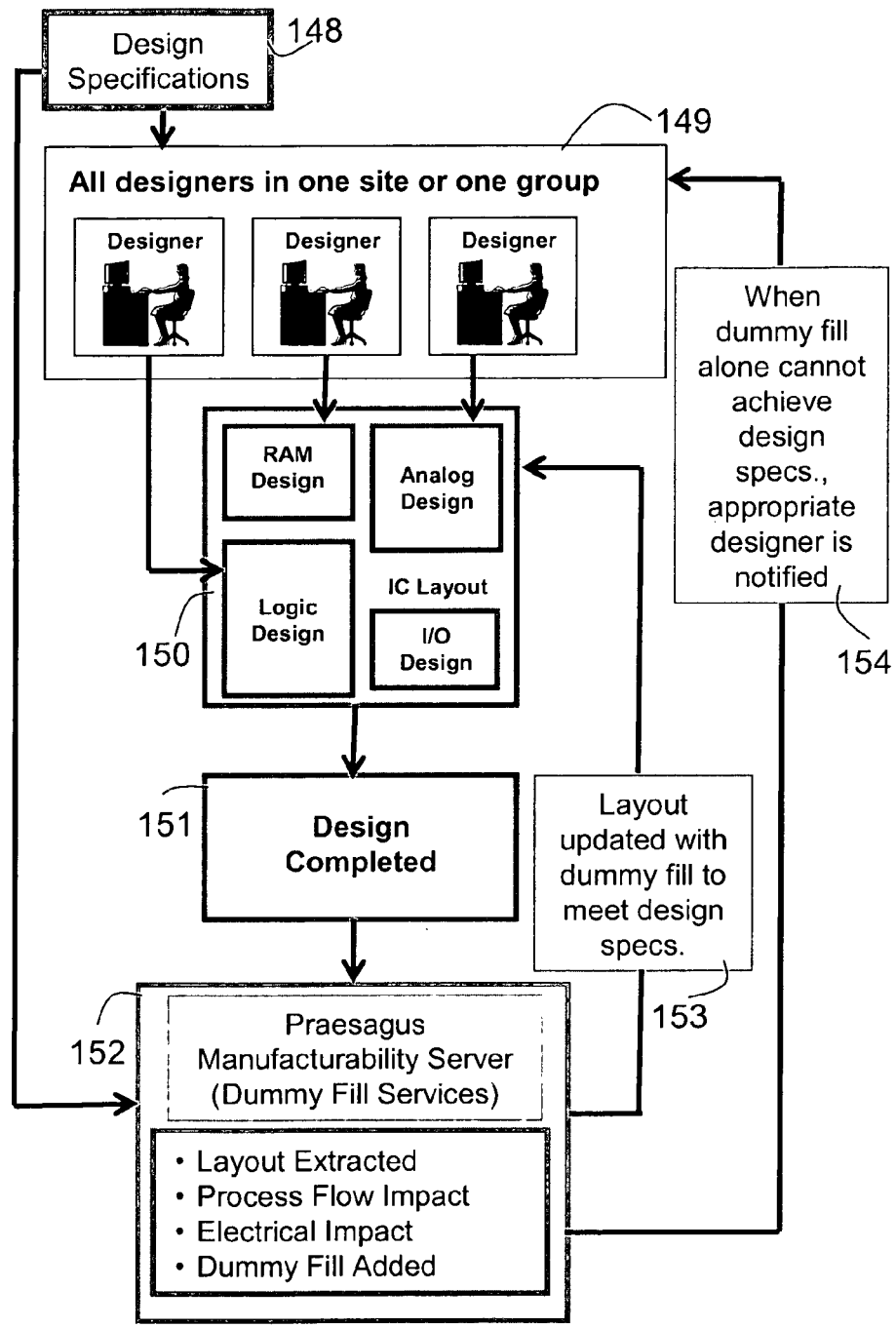
FIG. 32 illustrates series operation of the dummy fill system where all of the IC components are added to a particular layout before it is submitted to the dummy fill system.

The dummy fill methods and system may be used by designers in a series fashion, as after all components are placed in the layout. In this operation or use, shown in FIG. 32, design specifications and rules, 148, are submitted to designers, 149. The designers design and place their components, 150, resulting in a completed layout, 151. The completed IC design, 151, is uploaded to the server, 152, and the dummy fill methods & system modifies the IC layout to the design specifications returning it to the design group, 153. If there are no dummy fill strategies that can meet design specifications, the designers are notified, 154. This configuration could be used by a fab or foundry to provide dummy fill services and/or certify the manufacturability of layouts submitted by design houses.

Figure 33:
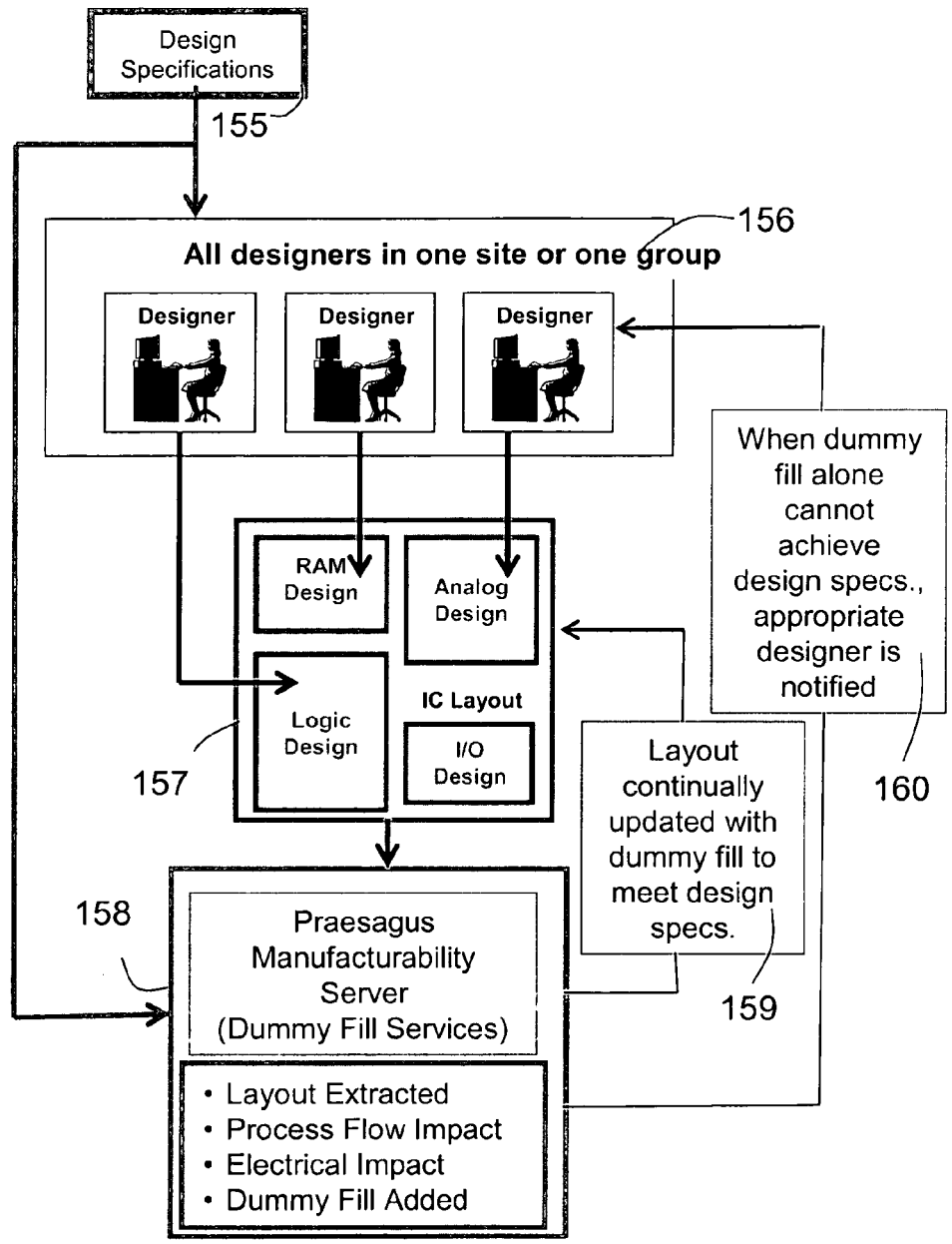
FIG. 33 illustrates real-time use of the dummy fill system to analyze and place dummy fill as components are added to the layout.

The dummy fill methods and system may be used by designers in an iterative fashion, as each component is placed in the layout (this mode is also referred to as real-time). In FIG. 33, the design specifications, 155, are provided to the design group, 156. As the designers design and place each IC component, 157, the layout is uploaded to the server, 158, which operates on the layout as the designers place components, in real-time. To process the complete layout, even when only a few components have been placed, any non-placed component is assumed to meet the design specifications. As the dummy fill method modifies the layout it is certified to the design specifications and returned to the design team or electronically updates a central layout used by all designers in the group, 159. If the dummy fill method cannot determine a dummy fill strategy that meets the design criteria the design group is so noted.

The internet may allow for collaborative design among design groups in different companies, located across the world. The challenge is to ensure that all designers can meet the design specifications. In the case where design specifications are agreed to by all design groups, the system operates similar to FIG. 33—assuming non-placed components meet the design specifications and adding dummy fill appropriately if these components violate specs when placed. In the case where components designed under different design rules (such as licensed IP or designs) may be chosen, the dummy fill system can determine whether a dummy fill scheme exists to allow the pre-designed component to be integrated within a new design specification.

i. Results

Figure 34:
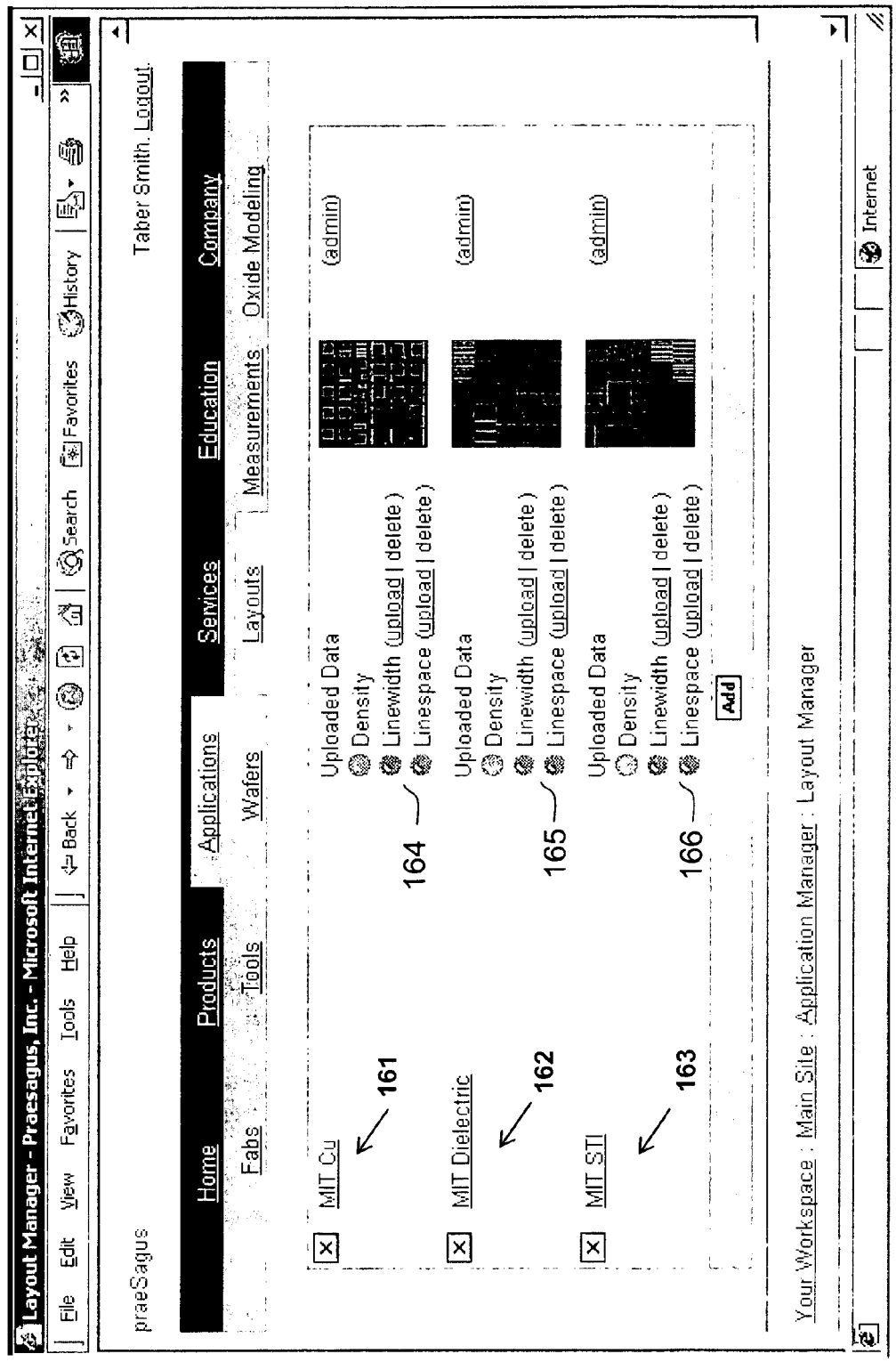
FIG. 34 provides a screenshot of the dummy fill system layout manager GUI, which manages a users layouts and layout extraction.

The dummy fill system described in this application has been implemented and the figures and test in this section describe some of our results. The graphical user interface (GUI) for the Layout Manager component, shown in FIG. 34, allows the user to upload a layout through a web browser and web services are automatically configured to add dummy fill for the appropriate processes and according to user defined design rules (also input through a similar GUI). The three designs, 161, 162 & 163, were processed using the layout extraction algorithm to compute effective density. Options are provided to the use to use our layout extraction methods to compute linewidth and linespace or to upload this information from another source, 164, 165 & 166.

Figure 35A:
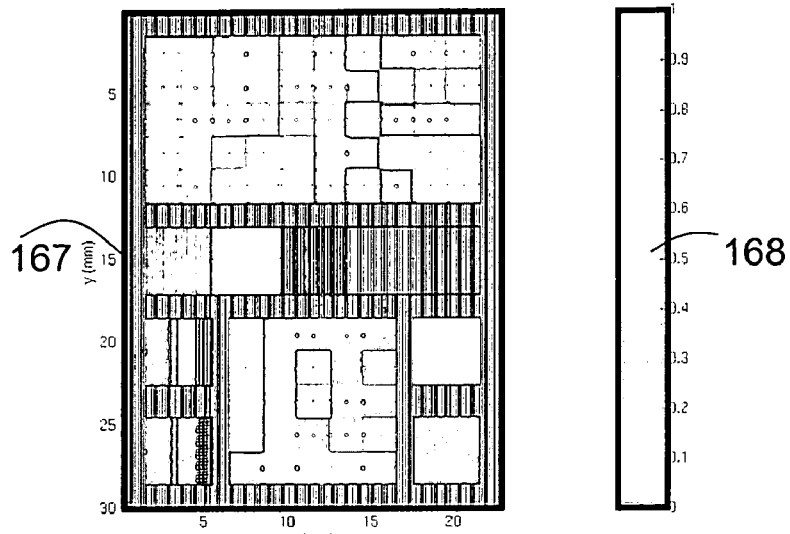
FIG. 35A provides the result of a density extraction using the dummy fill system.
Figure 35B:
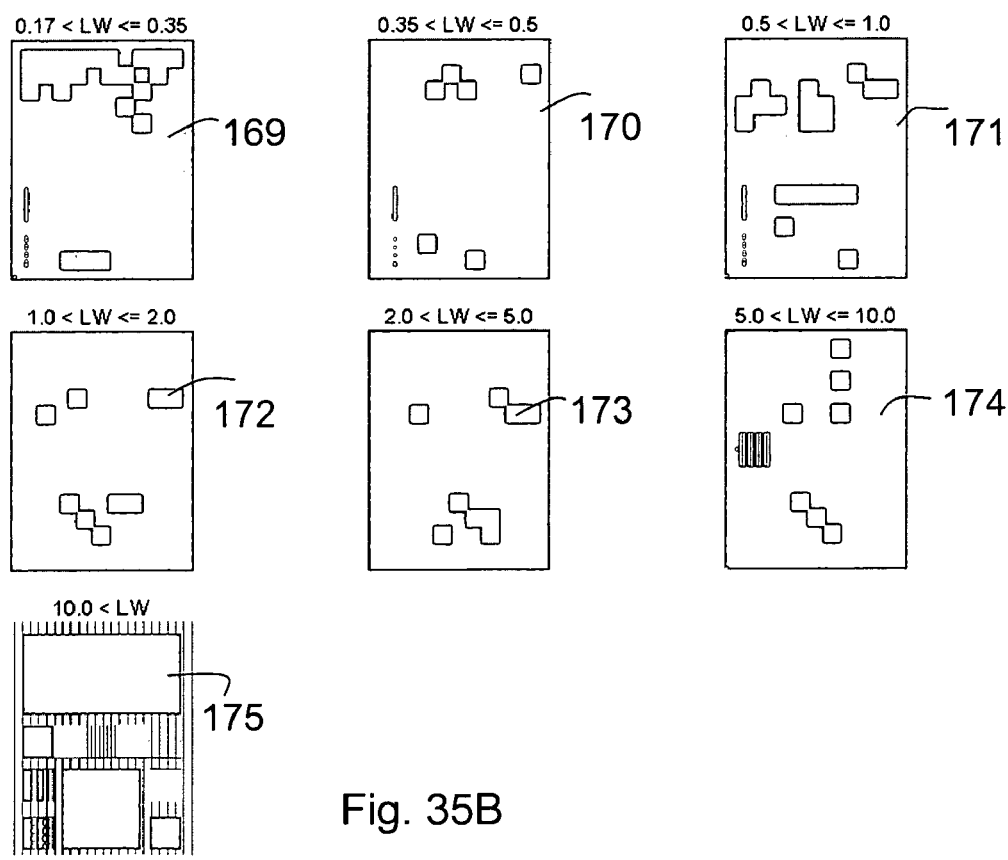
FIG. 35B provides the result of a linewidth extraction using the dummy fill system.

The results of a layout extraction using the system are shown in the images in FIG. 35. The spatial linewidths across the full-chip are shown according to which linewidth bin they fall into. This information is input into the models to predict process and electrical variation.

Figure 36A:
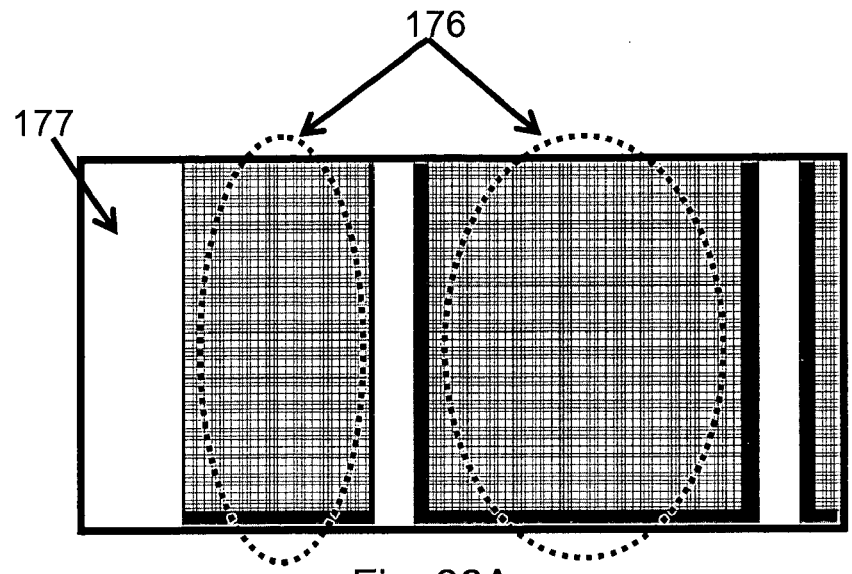
FIG. 36A provides the results of the dummy fill system for metal dummy fill.
Figure 36B:
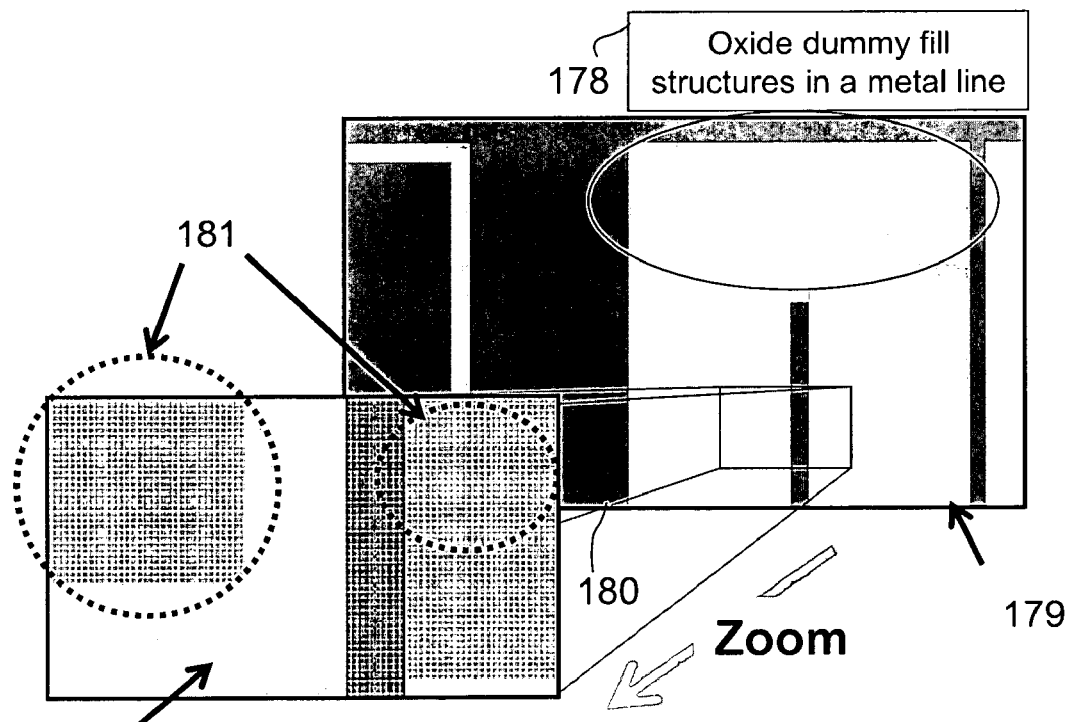
FIG. 36B provides the results of the dummy fill system for oxide dummy fill.
Figure 37:
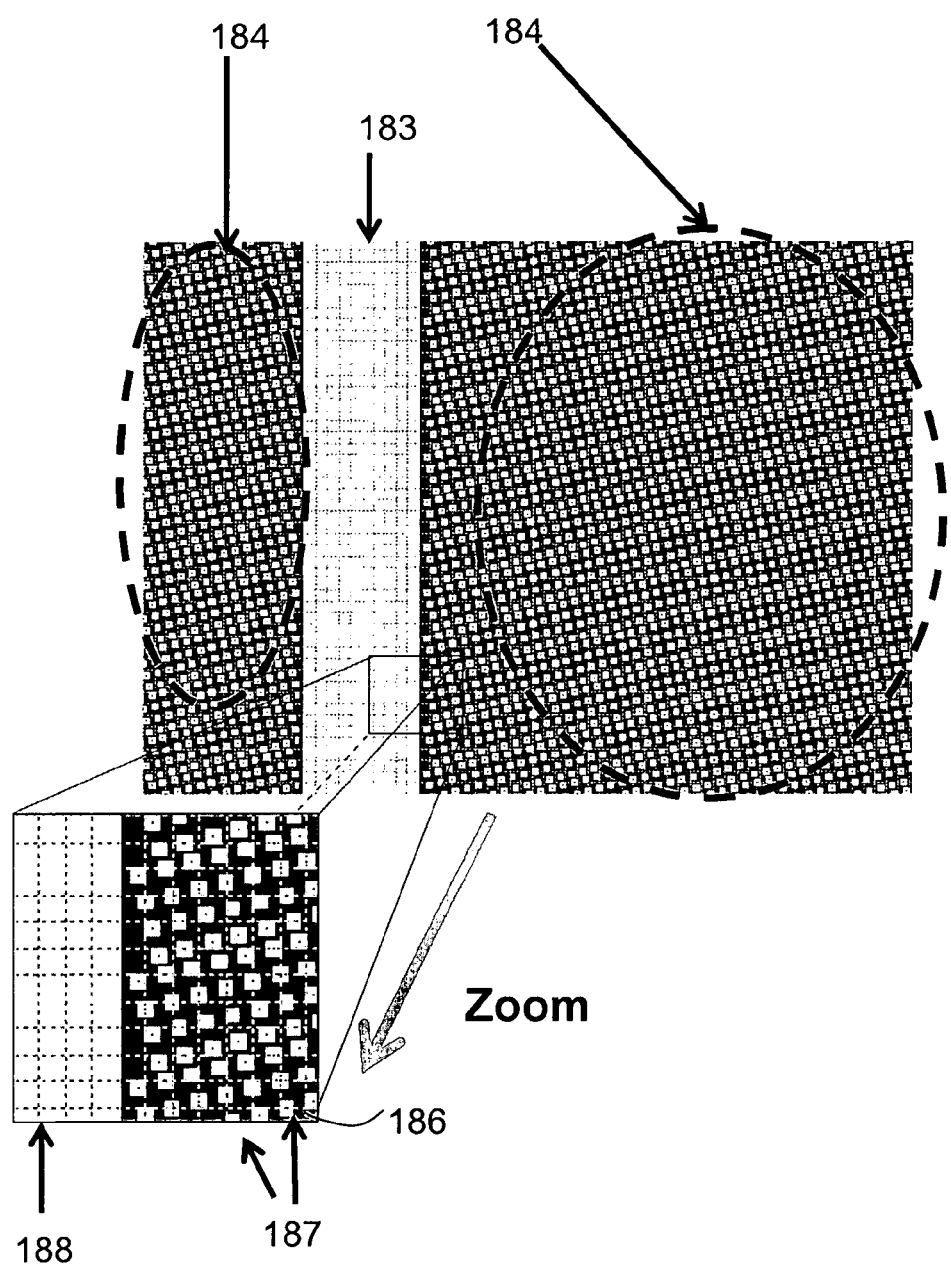
FIG. 37 provides the results of the dummy fill system used to place metal dummy fill with a size and pattern selected by the system to minimize electrical impact.

Results of the dummy fill methods and system are provided in FIGS. 36 and 37. In FIG. 36A, a metal line, 177, is shown adjacent to an oxide field where metal dummy fill has been added, 176, using CMP film thickness, dishing and erosion computation, 31, and resistance and capacitance electrical models, 32, and is within acceptable RC variation tolerances. In FIG. 36B, oxide dummy fill, 178, has been added to a metal line, 179. A zoomed in insert is also shown, 180, where the actual oxide dummy fill structures can be observed, 181. The oxide dummy fill has been added using CMP film thickness, dishing and erosion computation, 31, and resistance and capacitance electrical models, 32, and is within acceptable RC variation tolerances. The dummy fill system also uses dynamic line buffering and dynamic slotting percentages in the placement of dummy fill in these results. FIG. 37 shows how the dummy fill method and system can be used to adjust the dummy fill pattern to minimize electrical impact. In FIG. 37, metal dummy fill, 184, is placed in an oxide field region adjacent to a metal line, 183. To meet the electrical requirements for this design, an asymmetric metal fill pattern is chosen from the fill library and sized and placed to minimize the impact of resistance in the oxide field region where it is added. An insert, 186, is shown where the asymmetric metal dummy fill pattern, 187, can more easily be seen.

Figure 38:
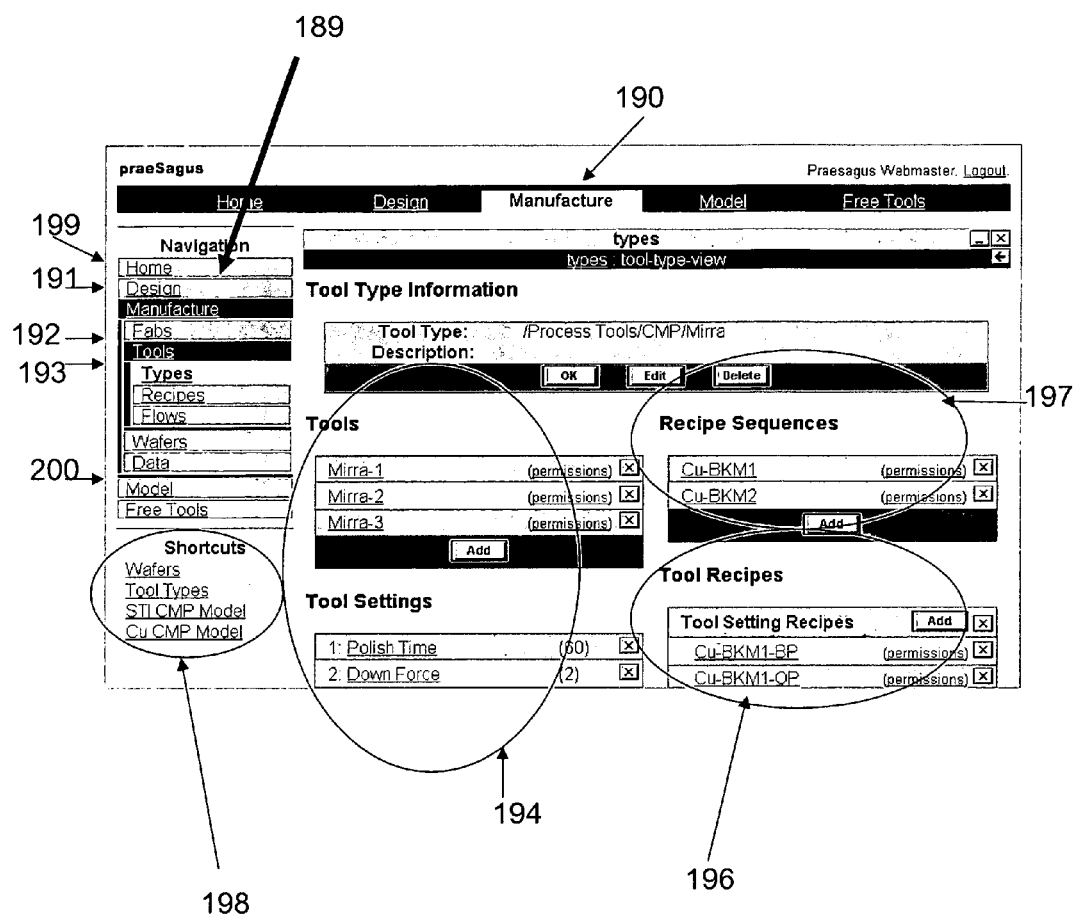
FIG. 38 provides a screenshot of tool type information available under the manufacturing component of the dummy fill system.

The GUI for using dummy fill services is shown in FIG. 38 and a useful embodiment is to use a web browser as the GUI. The benefit being that almost every computer is now equipped with a web browser and there is a great deal of standardization across the two major browsers from Netscape and Microsoft. The dummy fill services and functions are grouped within the GUI into three primary components; design (199), manufacture (191) and model (200). The screenshot in FIG. 38 shows in the header, 190, and in the navigation bar, 191, that the manufacture component has been selected by the user. Within the manufacture component are subcomponents; fabs, tools, wafers and measurement data and in this screenshot, tools, 192, have been selected. There are three subcomponents under tools; types, recipes and flows. In this screenshot the user has selected types, 193. The types of tools and tool settings available to this user are shown, 194. The available recipes for this tool type, 196, and available recipe sequences, 197, for these tool types are shown. The system configured in this screenshot has two process models available to the user, 198, for calibration and prediction of copper and STI CMP. The design component, 199, uses a layouts manager to allow the user to upload and manage layouts and layout extractions. One goal of the dummy fill GUI design is to allow the user to manage all the data and results associated with dummy fill services provided.

Although various implementations have been discussed above, other implementations are also within the scope of the following claims.

The invention claimed is:

1. A method comprising
generating a strategy for placing dummy fill features within a design of an integrated circuit that is to be fabricated using a fabrication process flow that includes an electrochemical deposition or electrochemical mechanical deposition fabrication process,
the generation of a strategy for the placing of dummy fill features being based on
(a) dimensional or geometric characteristics of features or patterns within the integrated circuit design, and
(b) topography or thickness of dummy fill and/or non-dummy fill features determined using a pattern-dependent model that characterizes interactions between (i) the dimensional or geometric characteristics of features or patterns within the integrated circuit design and (ii) dimensional or geometric characteristics of features or patterns within the integrated circuit that would result from the electrochemical deposition or electrochemical mechanical deposition fabrication process.

2. A method comprising
based on an electrical impact analysis and a pattern dependent model of an electrochemical deposition or electrochemical mechanical deposition fabrication process, generating a strategy for placement of dummy fill in a layout for a device to be subjected to the fabrication process, and
using the pattern dependent model of the fabrication process and the electrical impact analysis to evaluate expected results of the dummy fill to be placed,
the use of the pattern dependent model and the electrical impact analysis being embedded as part of the generation of the dummy fill placement strategy, the pattern-dependent model being based on:
(a) dimensional or geometric characteristics of features or patterns within an integrated circuit design, and
(b) topography or thickness of dummy fill and/or non-dummy fill features determined using a pattern-dependent model that characterizes interactions between (i) the dimensional or geometric characteristics of features or patterns within the integrated circuit design and (ii) dimensional or geometric characteristics of features or patterns within the integrated circuit that would result from the electrochemical deposition or electrochemical mechanical deposition fabrication process.

3. A method comprising
based on an electrical impact analysis and a pattern dependent model of an electrochemical deposition or electrochemical mechanical deposition fabrication process, generating a strategy for placement of dummy fill in a layout for a device to be subjected to the fabrication process, and
using the pattern dependent model of the fabrication process and the electrical impact analysis to evaluate expected results of the dummy fill to be placed, the pattern-dependent model based on:
(a) dimensional or geometric characteristics of features or patterns within an integrated circuit design, and
(b) topography or thickness of dummy fill and/or non-dummy fill features computed using a pattern-dependent model that characterizes interactions between (i) the dimensional or geometric characteristics of features or patterns within the integrated circuit design and (ii) dimensional or geometric characteristics of features or patterns within the integrated circuit that would result from the electrochemical deposition or electrochemical mechanical deposition fabrication process.

4. A method comprising
based on a pattern dependent model of an electrochemical deposition or electrochemical mechanical deposition fabrication process, generating a strategy for placement of dummy fill in a layout for a device to be subjected to the fabrication process, and
using the pattern dependent model of the fabrication process to evaluate expected results of the dummy fill to be placed,
wherein the fabrication process for which the strategy is being generated comprises two or more stages of fabrication, the pattern-dependent model being based on (a) dimensional or geometric characteristics of features or patterns within an integrated circuit design, and (b) topography or thickness of dummy fill and/or non-dummy fill features computed using a pattern-dependent model that characterizes interactions between (i) the dimensional or geometric characteristics of features or patterns within the integrated circuit design and (ii) dimensional or geometric characteristics of features or patterns within the integrated circuit that would result from the electrochemical deposition or electrochemical mechanical deposition fabrication process.

5. The method of claim 1, 2, 3, or 4 also including operating a server to provide dummy fill generation functions for a semiconductor design, and
enabling a user at a client to operate through a web browser to develop the dummy fill placement strategy.

6. The method of claim 5 in which the server is local to the user.

7. The method of claim 6 in which the server is remote from the user.

8. The method of claim 1, 2, 3, or 4 also including analyzing a design to which the dummy fill strategy has been applied,
adjusting the design based on the analysis,
iterating the analyzing and adjusting steps, and
certifying that an integrated circuit manufactured according to the adjusted design will be within predefined physical and electrical parameters.

9. The method of claim 4 in which the two stages comprise two or more processes.

10. The method of claim 4 in which the two stages comprise two or more steps of a single process.

11. The method of claim 4 in which the two stages comprise electrochemical deposition or electrochemical mechanical deposition and chemical mechanical polishing.

12. The method of claim 4 in which the generating of a strategy includes generating dummy fill rules.

13. The method of claim 1, 2, 3, or 4 also including
defining a set of hierarchical cell placements for dummy fill, and
reducing a size of an electronic layout file to which dummy fill is added by using the hierarchical cell placements.

14. The method of claim 1, 2, 3, or 4 in which the dummy fill generation is performed by a user through a web browser and a web server.

15. The method of claim 14 in which the web server is local to the user.

16. The method of claim 14 in which the web server is remote from the user.

17. The method of claim 1, 2, 3, or 4 in which the strategy for placement of dummy fill includes determining the size and placement of dummy fill.

18. The method of claim 1, 2, 3, or 4 in which the fabrication process comprises a formation of a low-K interlayer dielectric.

19. The method of claim 4 in which the fabrication process comprises chemical vapor deposition or spin-on of a low-K dielectric.

20. The method of claim 1, 2, 3, or 4 in which generating the dummy fill strategy includes dividing a semiconductor design into grids.

21. The method of claim 20 in which generating the dummy fill strategy also includes extracting local pattern densities for a semiconductor design for each of the grids.

22. The method of claim 20 in which generating the dummy fill strategy also includes extracting local line width for a semiconductor design for each of the grids.

23. The method of claim 20 in which generating the dummy fill strategy also includes extracting local line spacing for a semiconductor design for each of the grids.

24. The method of claim 20 in which generating the dummy fill strategy also includes computing an effective pattern density for each grid.

25. The method of claim 21 also including using models for computing film thickness non-uniformity with respect to a semiconductor design for which the dummy fill strategy is being generated.

26. The method of claim 25 also including computing a variation in film thickness.

27. The method of claim 20 also including deriving coordinates of all objects within each of the grids.

28. The method of claim 27 also including generating at least one of line width, line space, length, and bounding box with respect to each of the objects.

29. The method of claim 20 in which the dummy fill strategy includes adding dummy fill in empty areas of each of the grids.

30. The method of claim 29 in which the dummy fill includes slots in objects.

31. The method of claim 29 comprising re-computing a local density in each of the grids after adding dummy fill.

32. The method of claim 29 also comprising re-computing an effective pattern density for each of the grids after adding dummy fill.

33. The method of claim 1, 2, 3, or 4 in which the dummy fill strategy is based on criteria for electrical parameter variation tolerances for at least one of the following: capacitance and resistance, sheet resistance, outputs delay, skew, voltage drop, drive current loss, dielectric constant or crosstalk noise.

34. The method of claim 32 in which the effective pattern density is computed based on a polishing process planarization length.

35. The method of claim 32 in which the effective pattern density is computed using an elliptically weighted window or other filter.

36. The method of claim 12 in which dummy fill rules based on electrical design guidelines are generated dynamically with a change in technology or design parameters.

37. The method of claim 34 in which an effective pattern density is generated dynamically with a change in a process planarization length.

38. The method of claim 1, 2, 3, or 4 in which the fabrication process comprises lithography.

39. The method of claim 1, 2, 3, or 4 in which the fabrication process comprises electrochemical or electrochemical mechanical deposition.

40. The method of claim 1, 2, 3, or 4 in which the fabrication process comprises copper chemical mechanical polishing.

41. The method of claims 1, 2, 3, or 4 also including
extracting pattern dependencies from a layout of the semiconductor.

42. The method of claim 41 in which the layout dependencies include with respect to line spacing, line width or line density.

43. The method of claim 1, 2, 3, or 4 also including
using patterned test wafers or test semiconductor devices to calibrate a pattern dependent model with respect to a preselected tool or process recipe, and
based on a pattern dependent model of a semiconductor fabrication process, generating the strategy for placement of dummy fill in the process.

44. The method of claim 1, 2, 3, or 4 also comprising
using a calibrated pattern dependent model to map pattern dependent features to wafer-state parameters such as resulting film thickness, film thickness variation, dishing, erosion and electrical parameters comprising at least one of sheet resistance, resistance, capacitance, crosstalk noise, drive current loss, voltage drop, and effective dielectric constant, and
based on the pattern dependent model, generating the strategy for placement of dummy fill in a fabrication process.

45. The method of claim 1, 2, 3, or 4 also comprising
based on a pattern dependent model, generating a strategy for placement of dummy fill in a process, and
using a cost function to measure an impact of dummy fill modification on process induced wafer state and electrical parameter variation.

46. The method of claim 1, 2, 3, or 4 also comprising
based on a combination of more than one pattern dependent model, generating a strategy for placement of dummy fill in a fabrication process, and
predicting an impact of the dummy fill generated by the strategy on process variation.

47. The method of claim 1, 2, 3, or 4 also comprising
based on a combination of more than one pattern dependent model and cost function, generating a strategy for placement of dummy fill in a fabrication process that optimizes full-chip wafer-state and electrical parameters.

48. The method of claim 1, 2, 3, or 4 also comprising
based on predicted or simulated wafer state and electrical parameters, generating dummy fill rules for use in dummy fill placement in a semiconductor fabrication process.

49. The method of claim 48 in which the dummy fill rules include dummy fill sizing.

50. The method of claim 48 in which the dummy fill rules include dummy fill placement.

51. The method of claim 48 in which the dummy fill rules include dummy fill hierarchical cell creation and management.

52. The method of claim 1, 2, 3, or 4 also comprising
providing dummy fill functions to generate the dummy fill strategy, and
using the functions to automatically modify GDS-format electronic layout files for a semiconductor device.

53. The method of claim 1, 2, 3, or 4 also comprising
at an internet server, receiving from a client a layout file for a semiconductor device,
generating dummy fill modifications to the layout file at the server, and
returning the dummy fill modified layout file from the server to the client.

54. The method of claim 1, 2, 3, or 4 also comprising
at a server, providing a service that enables a user to interactively configure a dummy fill application running on the server, and
enabling the user to generate dummy fill information using the dummy fill application.

55. The method of claim 54 in which the server comprises a web server.

56. The method of claim 54 where the user is at a remote location with regard to the web server.

57. The method of claim 1, 2, 3, or 4 also comprising
making available to a user on a network a service that enables the user to verify dummy fill information with respect to a semiconductor design and a fabrication process.

58. The method of claim 57 in which the dummy fill information that is verified includes at least one of a dummy fill pattern, a dummy fill strategy, or a dummy fill representation.

59. The method of claim 57 in which the dummy fill information is verified with respect to a single interconnect level of the semiconductor design.

60. The method of claim 57 in which the dummy fill information is verified with respect to multiple interconnect levels of the semiconductor design.

61. The method of claim 57 also including sizing dummy fill objects and creating a dummy fill pattern of the objects for one or more interconnect levels of the semiconductor design.

62. The method of claim 57 in which the dummy fill information comprises dummy fill rules.

63. The method of claim 62 in which the pattern includes oxide or metal dummy fill objects.

64. The method of claim 62 in which the objects of the dummy fill pattern are placed to minimize full-chip film thickness variation.

65. The method of claim 62 in which the objects of the dummy fill pattern are placed to minimize full-chip variation in electrical parameters.

66. The method of claim 65 in which the electrical parameters comprise at least one of sheet resistance, resistance, capacitance, crosstalk noise, voltage drop, drive current loss, and effective dielectric constant.

67. The method of claim 52 in which the GDS files are modified to improve uniformity and electrical performance of the semiconductor device.

68. The method of claim 67 in which the process comprises a damascene process flow.

69. The method of claim 1, 2, 3, or 4 also comprising
making available to a user on a network a web-based application comprised of web services that enables the user to verify dummy fill information with respect to a semiconductor design and a fabrication process.

70. The method of claim 69 where the network is an intranet, extranet or the internet.

71. The method of claim 1, 2, 3, or 4 in which the dummy fill placement strategy includes using dummy fill objects to improve a structural integrity of low-K dielectric features.

72. The method of claim 1, 2, 3, or 4 in which the dummy fill placement strategy includes using dummy fill objects to maintain or improve an effective dielectric constant of low-K dielectric features.

73. The method of claim 72 in which the effective dielectric constant is maintained through all steps of a damascene process flow.

74. The method of claim 1, 2, 3, or 4 in which the dummy fill placement strategy includes using dummy fill objects to facilitate integration of low-k dielectric materials into a damascene process flow.

75. The method of claim 1, 2, 3, or 4 also comprising
maintaining a library of semiconductor dummy fill information, and
making the library available for use in connection with generating dummy fill placement specifications, and
updating the library with changed dummy fill information.

76. The method of claim 1, 2, 3, or 4 also comprising
storing calibration information with respect to at least one of the following: process tools, recipes, and flows, and
updating the calibration information to reflect changes in the process tools, recipes or flows.

77. The method of claim 76 also including using the calibration information in generating a dummy fill strategy.

78. The method of claim 76 also including selecting among process tools, recipes and flows from calibration database based upon desired dummy fill characteristics.

79. The method of claim 1, 2, 3, or 4 also comprising
enabling a user to obtain a dummy fill strategy for a semiconductor design using a single click of a user interface device through a user interface.

80. The method of claims 1, 2, 3, or 4 in which the process comprises a damascene process.

81. A method comprising generating a strategy for placing dummy fill to compensate for pattern dependencies in an electrochemical mechanical deposition fabrication process.

82. A method comprising
based on electrical impact analysis and a pattern dependent model of an electrochemical mechanical deposition fabrication process, generating a strategy for placement of dummy fill in a layout for a device to be subjected to the fabrication process, and
using the pattern dependent model of the fabrication process and the electrical impact analysis to evaluate the expected results of the dummy fill to be placed,
the use of the pattern dependent model and the electrical impact analysis being embedded as part of the generation of the dummy fill placement strategy.

83. A method comprising
based on an electrical impact analysis and a pattern dependent model of an electrochemical mechanical deposition fabrication process, generating a strategy for placement of dummy fill in a layout for a device to be subjected to the fabrication process, and using the pattern dependent model of the fabrication process and the electrical impact analysis to evaluate expected results of the dummy fill to be placed.

84. A method comprising based on a pattern dependent model of an electrochemical mechanical deposition fabrication process, generating a strategy for placement of dummy fill in a layout for a device to be subjected to the fabrication process, and using pattern dependent model of the fabrication process to evaluate the expected results of the dummy fill to be placed, the fabrication process for which the strategy is being generated comprising two or more stages of fabrication.

* * * * *